US012631491B2

(12) United States Patent
Ocak et al.

(10) Patent No.: US 12,631,491 B2
(45) Date of Patent: May 19, 2026

(54) WAFER LEVEL VACUUM PACKAGING (WLVP) OF THERMAL IMAGING SENSOR

(71) Applicant: Meridian Innovation Pte Ltd, Singapore (SG)

(72) Inventors: Ilker Ender Ocak, Singapore (SG); Piotr Kropelnicki, Singapore (SG)

(73) Assignee: Meridian Innovation Pte Ltd, Singapore (SG)

( * ) Notice: Subject to any disclaimer, the term of this patent is extended or adjusted under 35 U.S.C. 154(b) by 1282 days.

(21) Appl. No.: 17/439,797

(22) PCT Filed: Apr. 1, 2020

(86) PCT No.: PCT/SG2020/050203
§ 371 (c)(1),
(2) Date: Sep. 15, 2021

(87) PCT Pub. No.: WO2020/204835
PCT Pub. Date: Oct. 8, 2020

(65) Prior Publication Data
US 2022/0128411 A1 Apr. 28, 2022

Related U.S. Application Data

(63) Continuation-in-part of application No. 17/156,639, filed on Jan. 25, 2021, now Pat. No. 11,990,498.
(Continued)

(51) Int. Cl.
*G01J 5/12* (2006.01)
*B81B 7/00* (2006.01)
(Continued)

(52) U.S. Cl.
CPC .............. *G01J 5/12* (2013.01); *B81B 7/0006* (2013.01); *B81B 7/0035* (2013.01);
(Continued)

(58) Field of Classification Search
CPC ...... G01J 5/12; G01J 5/04; G01J 5/045; G01J 5/0225; G01J 5/0853; G01J 5/0801;
(Continued)

(56) References Cited

U.S. PATENT DOCUMENTS 6,335,478 B1 1/2002 Chou et al.
6,803,250 B1 10/2004 Yaung et al.
(Continued)

FOREIGN PATENT DOCUMENTS

CN 104501970 A 4/2015
CN 105449008 A 3/2016
(Continued)

OTHER PUBLICATIONS

J. H. Smith et al., Embedded Micromechanical Devices for the Monolithic Integration of MEMS with CMOS, IEEE International Electron Devices Meeting, Dec. 10-13, 1995, pp. 1-5, Sandia National Labs., Albuquerque, New Mexico, U.S.A.
(Continued)

*Primary Examiner* — Younes Boulghassoul
(74) *Attorney, Agent, or Firm* — HORIZON IP PTE. LTD.

(57) ABSTRACT

A complementary metal oxide semiconductor (CMOS) device embedded with microelectromechanical system (MEMS) components in a MEMS region. The MEMS components, for example, are infrared (IR) thermosensors. The device is encapsulated with a CMOS compatible IR transparent cap to hermetically seal the device using wafer-level vacuum packaging techniques.

18 Claims, 35 Drawing Sheets

Related U.S. Application Data

(60) Provisional application No. 62/827,861, filed on Apr. 2, 2019.

(51) Int. Cl.

| | |
|---|---|
| *B81B 7/02* | (2006.01) |
| *B81C 1/00* | (2006.01) |
| *G01J 5/02* | (2022.01) |
| *G01J 5/04* | (2006.01) |
| *G01J 5/0801* | (2022.01) |
| *H10F 39/00* | (2025.01) |
| *H10F 39/18* | (2025.01) |

(52) U.S. Cl.

CPC .............. *B81B 7/0038* (2013.01); *B81B 7/02* (2013.01); *B81C 1/00222* (2013.01); *B81C 1/00246* (2013.01); *B81C 1/00269* (2013.01); *G01J 5/022* (2013.01); *G01J 5/0225* (2013.01); *G01J 5/045* (2013.01); *G01J 5/0801* (2022.01); *H10F 39/026* (2025.01); *H10F 39/184* (2025.01); *B81B 2207/012* (2013.01)

(58) Field of Classification Search

CPC ... G01J 5/022; G01J 2005/123; H10F 39/184; B81B 7/02; B81B 7/0035; B81B 2207/012; B81C 1/00246; B81C 1/00269; B81C 1/00222; B81C 1/00277

See application file for complete search history.

(56) References Cited

U.S. PATENT DOCUMENTS

| | | | |
|---|---|---|---|
| 7,755,048 | B2 | 7/2010 | Hsu |
| 9,324,760 | B2 | 4/2016 | Vasseur et al. |
| 9,505,611 | B1 | 11/2016 | Liu et al. |
| 9,577,001 | B2 | 2/2017 | Enichlmair et al. |
| 2004/0245586 | A1 | 12/2004 | Partridge et al. |
| 2007/0057343 | A1 | 3/2007 | Chinthakindi et al. |
| 2008/0142912 | A1 | 6/2008 | Inaba et al. |
| 2008/0216883 | A1 | 9/2008 | Leneke et al. |
| 2009/0243004 | A1 | 10/2009 | An et al. |
| 2010/0031992 | A1 | 2/2010 | Hsu |
| 2010/0181484 | A1 | 7/2010 | Inada et al. |
| 2010/0243892 | A1 | 9/2010 | Dupont |
| 2011/0147869 | A1 | 6/2011 | Lazarov et al. |
| 2012/0061569 | A1 | 3/2012 | Noguchi |
| 2012/0097415 | A1 | 4/2012 | Reinert et al. |
| 2013/0234270 | A1 | 9/2013 | Yama et al. |
| 2013/0285165 | A1 | 10/2013 | Classen et al. |
| 2015/0076651 | A1 | 3/2015 | Noguchi |
| 2015/0123221 | A1 | 5/2015 | Reinmuth et al. |
| 2015/0168221 | A1 | 6/2015 | Mao et al. |
| 2015/0177069 | A1 | 6/2015 | Maes et al. |
| 2015/0210540 | A1 | 7/2015 | Sadaka et al. |
| 2015/0243823 | A1* | 8/2015 | Herrmann .......... B81C 1/00238 |
| | | | 438/57 |
| 2015/0321905 | A1 | 11/2015 | Gooch et al. |
| 2016/0079306 | A1 | 3/2016 | Kropelnicki et al. |
| 2016/0214855 | A1 | 7/2016 | Yeh et al. |
| 2016/0264402 | A1 | 9/2016 | Yu et al. |
| 2016/0289063 | A1 | 10/2016 | Ocak et al. |
| 2016/0318758 | A1 | 11/2016 | Chou et al. |
| 2016/0332867 | A1 | 11/2016 | Tseng et al. |
| 2016/0379961 | A1 | 12/2016 | Lee et al. |
| 2017/0107097 | A1 | 4/2017 | Cheng et al. |
| 2017/0179119 | A1 | 6/2017 | Chang et al. |
| 2017/0203956 | A1 | 7/2017 | Breitling et al. |
| 2018/0257927 | A1 | 9/2018 | Rothberg et al. |
| 2019/0019838 | A1* | 1/2019 | Kropelnicki .......... G01J 5/0853 |
| 2019/0027522 | A1* | 1/2019 | Kropelnicki ........ B81C 1/00317 |
| 2020/0203417 | A1* | 6/2020 | Ang ....................... H10F 30/10 |

FOREIGN PATENT DOCUMENTS

| | | |
|---|---|---|
| CN | 106744656 A | 5/2017 |
| CN | 106938837 A | 7/2017 |
| CN | 108975263 A | 12/2018 |
| EP | 2105963 A2 | 9/2009 |
| EP | 2264765 A1 | 12/2010 |
| TW | 201339544 A | 10/2013 |
| WO | 2014100706 A1 | 6/2014 |

OTHER PUBLICATIONS

A Graf et al., Review of micromachined thermopiles for infrared detection, Measurement Science and Technology, Jul. 1, 2007, pp. R59-R75, vol. 18, No. 7, IOP Publishing, Bristol, GB.

\* cited by examiner

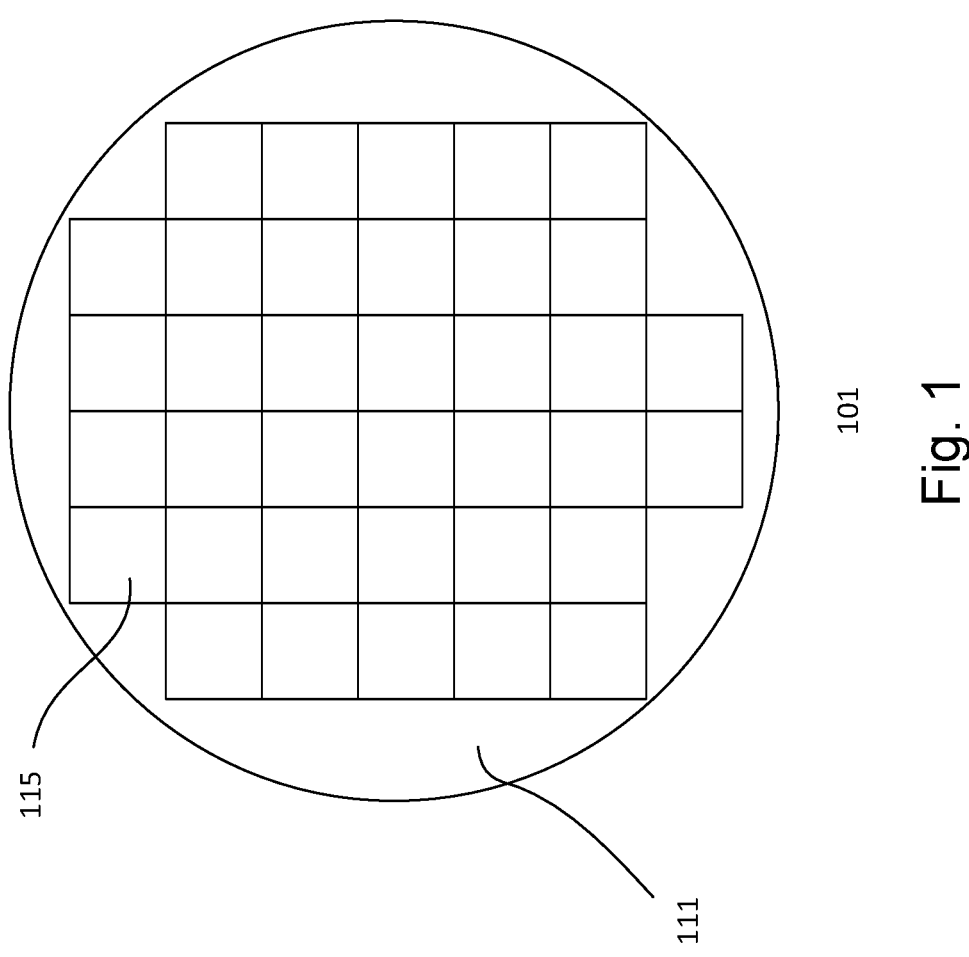
101
Fig. 1
115
111
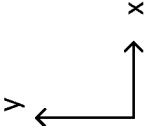

404

WAFER LEVEL VACUUM PACKAGING (WLVP) OF THERMAL IMAGING SENSOR

CROSS-REFERENCE TO RELATED APPLICATIONS

This application claims the benefit of U.S. Provisional Application No. 62,827,861, filed on Apr. 2, 2019. This application cross-references to U.S. patent application Ser. No. 16/809,561, filed on Mar. 5, 2020, which is a continuation-in-part application of co-pending U.S. patent application Ser. No. 16/517,653, filed on Jul. 21, 2019, which is a continuation application of U.S. patent application Ser. No. 15/647,284, titled Scalable Thermoelectric-based Infrared Detector, now U.S. Pat. No. 10,403,674, filed on Jul. 12, 2017. This application also cross-references to U.S. patent application Ser. No. 16/224,782, filed on Dec. 18, 2018, which is a divisional application of U.S. patent application Ser. No. 15/653,558, titled Thermoelectric-based Infrared Detector with high CMOS Integration, now U.S. Pat. No. 10,199,424, filed on Jul. 19, 2017. This application further cross-references to same day filed PCT International Application titled Monolithic Post Complementary Metal-oxide Semiconductor Integration of Thermoelectric-based Infrared detector, filed on Apr. 1, 2020, which claims the benefit of U.S. Provisional Application No. 62,827,205 filed on Apr. 1, 2019. This application further cross-references to same day filed PCT International Application titled Heterogenous Integration of Complementary Metal-oxide Semiconductor and MEMS sensors, filed on Apr. 1, 2020, which claims the benefit of U.S. Provisional Application No. 62,827,207 filed on Apr. 1, 2019. The disclosure of all of which are herein incorporated by reference in their entireties for all purposes.

BACKGROUND

The demand for uncooled infrared (IR) detectors is continually growing due to the increased demand from numerous applications. These applications, just to name a few, include air conditioning systems, handphones, autonomous driving cars, internet of things (IoT), fire-fighting and traffic safety. Furthermore, it is expected that there will be numerous more applications in the near future for uncooled IR detectors.

Conventional uncooled IR detectors have been implemented using microbolometers. However, microbolometers require mechanical components for calibration purposes. As an example, microbolometers require mechanical shutters for offset correction. The required mechanical components for microbolometers increases manufacturing complexity. Such complexity increases costs. The need for mechanical components for microbolometer also makes it difficult to produce small or compact devices. In addition, conventional IR detectors employs a bulky optical module assembly for focusing to increase image sharpness or resolution. Such bulky optical module assembly makes IR detectors impractical for compact or mobile applications.

Moreover, fabrication of conventional IR detectors are limited to chip scale packaging which is inefficient and costly, as well as labor intensive. For example, the IR devices on the wafer have to be singulated before sealing of the devices are performed at the chip level.

The present disclosure is directed to cost-effective and compact IR detectors that allow for wafer level vacuum packaging.

SUMMARY

Embodiments of the present disclosure generally relate to devices and methods of forming such devices. In particular, embodiments relate for CMOS devices embedded with MEMS components or sensors. The MEMS components, for example, may be IR sensors.

In one embodiment, a device includes a substrate, wherein the substrate is configured with a CMOS region with CMOS components and a MEMS region with a MEMS component, wherein a BE dielectric with interconnects for interconnecting the CMOS components is disposed on the substrate over the CMOS and MEMS regions. The device further includes a substrate sealing ring on a substrate bonding region on the BE dielectric, the cap bonding region surrounds the MEMS region and the CMOS region. The device further includes a cap, wherein the cap comprises a cap bonding region surrounding at a periphery of the cap, the cap bonding region includes a cap sealing ring; and wherein the cap sealing ring and the substrate sealing ring form a cap bond to bond the cap onto the substrate, the cap encapsulates the MEMS region and the CMOS region, wherein the cap creates a cap cavity over the MEMS region, the cap cavity is a vacuum cavity.

In one embodiment, a method for forming a device includes providing a substrate, wherein the substrate is configured with a CMOS region with CMOS components and a MEMS region with a MEMS component, wherein a BE dielectric with interconnects for interconnecting the CMOS components is disposed on the substrate over the CMOS and MEMS regions. The method further includes forming a substrate sealing ring on a substrate bonding region on the BE dielectric, the cap bonding region surrounds the MEMS region and the CMOS region. The method includes providing a cap, wherein the cap comprises a cap bonding region surrounding at a periphery of the cap, the cap bonding region includes a cap sealing ring; and bonding the cap sealing ring and substrate sealing ring to encapsulate the MEMS region and CMOS region, wherein the cap forms a cap cavity over the MEMS region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 1 shows a top view of a semiconductor wafer;

DETAILED DESCRIPTION

Figure 2A:
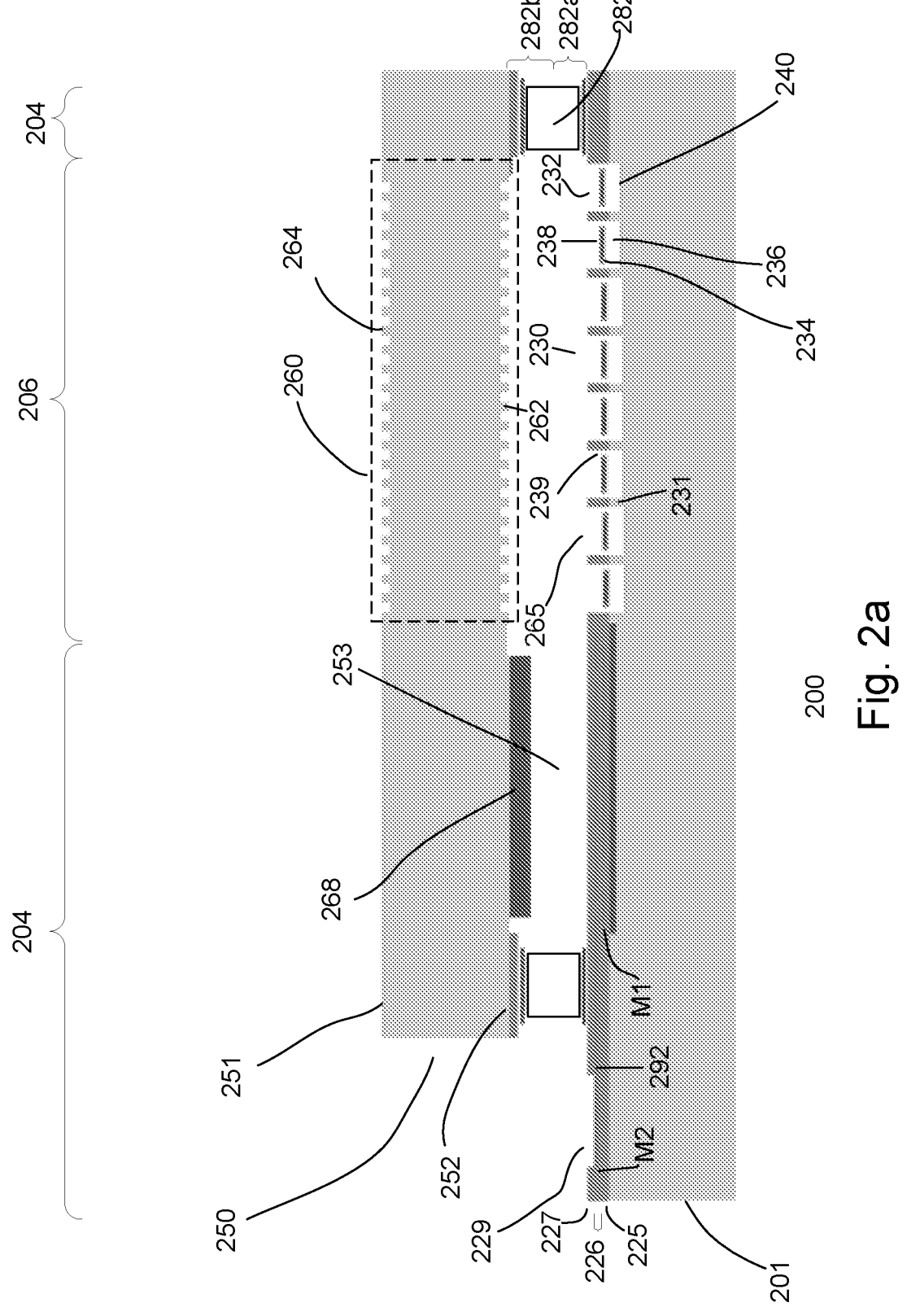
FIGS. 2a-f show simplified cross-sectional view of an embodiment of an encapsulated device.

Embodiments generally relate to devices, for example, semiconductor devices or integrated circuits (ICs) with embedded a microelectromechanical system (MEMS) module. The IC, for example, is a complementary metal oxide semiconductor (CMOS) device. As for the MEMS module, it may include one or more thermoelectric-based infrared (IR) detectors. The MEMS detector is compatible with CMOS processing. The devices can be incorporated into products, such as thermal imagers. For example, a device may include a plurality of MEMS sensors which can be configured to form a sensor array for a thermal imager. The sensors may be used for other types of applications, such as single pixel or line array temperature or motion sensors.

The fabrication of the devices may involve the formation of features on a substrate that makes up circuit components, such as transistors, resistors, capacitors and MEMS sensors, as part of a front-end-of-line (FEOL) processing. As part of back-end-of-line (BEOL) processing, interconnections are formed to interconnect the components, enabling the device to perform the desired functions. Furthermore, the process further includes providing an infrared transparent cap for hermetically sealing the device using wafer-level packing techniques.

To form the features, such as CMOS circuit components, sensors, interconnections and caps, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes. Furthermore, a plurality of devices may be formed on the wafer in parallel. The devices are hermetically sealed with caps. The devices are sealed at the wafer level. For example, the devices of the wafer are sealed with a cap wafer, sealing the devices in parallel, forming a wafer stack with the device wafer and cap wafer. The wafer stack is processed to singulate the encapsulated devices.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer, as well as wafers doped with other types of dopants or dopant concentrations, may also be useful.

The wafer includes an active surface 111 on which a device 115 is formed. A plurality of devices may be formed on the wafer in parallel. The devices, for example, are arranged in rows along a first (x) direction and columns along a second (y) direction. A cap wafer with processed caps is bonded to the wafer with the devices, encapsulating the devices at the wafer level in parallel. The cap wafer and the wafer with devices are separately processed before bonding is performed to form a wafer stack. The wafer stack with the device wafer and cap wafer is then processed to singulate the devices into individual encapsulated chips. For example, the wafer stack is partially diced to expose bonding pads. A full dicing is subsequently performed to singulate the devices into individual encapsulated chips.

FIGS. 2a-f show simplified cross-sectional views of an embodiment of a device 200 after encapsulation with various embodiments of a cap wafer 250. The device, for example, is a CMOS device with an embedded MEMS module. In one embodiment, the device is a CMOS device embedded with at least one thermoelectric-based IR sensor or detector. In some embodiments, the MEMS module of the device includes a plurality of thermoelectric-based IR sensors. The plurality of sensors may be configured to form a sensor or detector array. For example, the device may be an IR imager in which each sensor may be a pixel of an infrared image. Other types of MEMS structures or applications may also be useful. The device, for example, may be formed in parallel with other devices on a wafer and subsequently singulated.

The device includes a substrate 201. The substrate, for example, may be a part of the wafer on which devices are formed and singulated into individual dies, as described in FIG. 1. Common elements may not be described or described in detail. The substrate may be a semiconductor substrate, such as a silicon substrate, which is part of a wafer. The substrate may be a lightly doped p-type silicon substrate. Other types of substrates or wafers may also be useful.

In one embodiment, the substrate includes first and second device regions 204 and 206. The first region is a CMOS region while the second region is a MEMS region. In one embodiment, the CMOS region surrounds the MEMS region. A bond region of the CMOS region on which a cap 250 is bonded surrounds one or more sides of the MEMS region. As shown, the MEMS region is disposed towards one side of the device. For example, the bond region surrounds three sides of the MEMS region. Other configurations of the CMOS and MEMS regions may also be useful.

The CMOS region includes CMOS components, such as first and second polarity type transistors. Other types of CMOS components, such as transistors, resistors, and diodes, may also be included in the CMOS region. A transistor is formed in a device well. The transistor includes a gate on a surface of the well between source/drain (S/D) regions. For a first polarity type transistor, the device well is a second polarity type well while the S/D regions are first polarity type S/D regions. As for the second polarity type transistor, the device well is a first polarity type well while the S/D regions are second polarity type S/D regions. The CMOS region may include various types of transistors, such as high voltage, medium voltage, and low voltage transistors.

As for the MEMS region 206, it includes a MEMS component. In one embodiment, the MEMS component may be a sensor array 230 with a plurality of sensors 232. A sensor may be disposed within a MEMS device region of the MEMS region. For example, each sensor may be located in its respective MEMS device region. The sensors may be arranged in a matrix. For example, the sensor array includes M rows and N columns of MEMS sensors, forming a M×N array. Typical array size may be, for example, a 32×32 array or a 80×64 array. Other array sizes may also be useful. The size of the array may depend on, for example, the desired image resolution. In some cases, the array may be a line of sensors, such as a M×1 or 1×N array. Providing the MEMS region with a single MEMS sensor may also be useful. A sensor may correspond to a pixel of an array of pixels of an image. In addition, the sensor array may also include one or more blind sensors corresponding to one or more blind pixels. Blind pixels, for example, are used for calibration purposes.

The CMOS components may be configured into an analog or digital circuitry, such as select switches, row and column decoders and readout circuits. Other CMOS components may also be included. The CMOS components are config- ured for sensing and generating electrical signals on the sensors and converting them to a meaningful output for users. For example, the CMOS components are configured to read out each pixel of the array. Once the full array of sensors is read out, an image may be reconstructed. The image, for example, is a one frame corresponding to the sensors of the array.

Isolation regions may be provided to isolate the CMOS components. For example, isolation regions are provided to isolate transistors as well as the CMOS and MEMS regions. In addition, isolation regions may be provided to serve other purposes. The isolation regions may be field oxide (FOX) isolation regions. Other types of isolation regions, such as shallow trench isolation (STI) regions may also be useful.

In one embodiment, the MEMS sensors are thermoelec- tric-based IR sensors. A MEMS sensor includes a lower sensor cavity 236. In one embodiment, the lower sensor cavity is disposed in the substrate, creating a substrate cavity. For example, the lower sensor cavity may be a trench formed from etching the substrate. As shown, each sensor includes its respective lower sensor cavity. For example, the MEMS region includes a plurality of lower sensor cavities, separated by cavity walls 231 formed by the substrate, for the plurality of sensors of the sensor array. Other configu- rations of sensors and lower sensor cavities may also be useful.

The substrate cavity includes cavity sidewalls and bottom which are defined by the substrate. Providing a lower sensor cavity above the substrate surface may also be useful. The sensor cavity may have a square or rectangular footprint or shape. Other shapes for the lower sensor cavity may also be useful. As for the top of the lower sensor cavity, it is defined by a dielectric layer 234. The dielectric layer covers the lower sensor cavity. In one embodiment, the dielectric layer covers the lower sensor cavities of the sensors of the sensor or detector array. For example, the dielectric layer covers all the sensor cavities of the sensors in the sensor array. The dielectric layer may be a silicon oxide layer. Other types of dielectric layers, such as silicon nitride may also be useful. For example, the dielectric layer may be a dielectric stack having multiple dielectric layers. The dielectric layer serves as a membrane for a MEMS structure.

A reflector 240 is disposed at the bottom of the lower device cavity. The reflector is configured to reflect infrared (IR) radiation. The reflector may be formed from a conduc- tive material. In one embodiment, the reflector is a conduc- tive metal silicide reflector. The metal silicide reflector may be a titanium silicide ($TiSi_x$), a tungsten silicide ($WSi_x$) or an aluminum silicide ($AlSi_x$) reflector. Other types of metal silicide reflectors which reflect IR radiation may also be useful. For example, the reflector may be a conductive doped reflector layer. The doped reflector layer may be a doped silicon layer, such as a doped polysilicon layer. The doped reflector layer may be heavily doped with p-type or n-type dopants. For example, the dopant concentration of the doped reflector layer may be about $10^{21}$ dopants/cm$^3$. The conductive properties of the surface of the doped region are attributed to the high concentration of dopants being applied, thereby enabling the reflection of the incoming IR radiation. In other embodiments, the reflector may be a non-conductive reflector, such as a photonic crystal reflector. For example, a photonic crystal layer is formed by etching the surface of the lower device cavity. The photonic crystal layer may include a grating pattern configured to reflect incident IR radiation. For example, different grating patterns of varying depths may be etched from the surface of the photonic crystal layer to adjust the wavelengths and prop- erties of the reflected IR radiation. Other types of reflectors may also be useful.

A protective liner (not shown) may be provided. The protective liner, in one embodiment, lines the sidewalls and bottom of a lower sensor cavity, covering the reflector. The protective liner serves to protect the reflector and sidewalls of the lower device cavity from subsequent processes. For example, the protective liner serves to protect the reflector from etchants, such as $XeF_2$ or $SF_6$ gas, used in a release process to form the lower device cavity. The protective liner may be a dielectric protection liner. In one embodiment, the protective liner is a silicon oxide liner. Other types of liners, including non-dielectric liners, which are CMOS compatible and are selective to the etchant used in the release process may also be employed. The liner should also be a non-IR absorbing liner. Preferably, the liner is IR transparent and non-IR absorbing. The protective liner, for example, may be less than 200 nm thick. Other thicknesses for the protective liner which adequately protects the cavity sidewall and reflector during the release process may also be useful.

A MEMS structure 238 is disposed on the dielectric layer 234 which defines the top of the lower sensor cavity. A dielectric liner may line the dielectric layer. In such cases, the MEMS structure is disposed on the dielectric liner. The MEMS structure may be an IR sensor. In one embodiment, the MEMS structure is a thermopile line structure which serves as a thermoelectric IR sensor or detector. The ther- mopile line structure may be similar to those described in, for example, U.S. Ser. No. 16/517,653, U.S. Pat. No. 10,403, 674, U.S. Ser. No. 16/224,782, and U.S. Pat. No. 10,199, 424, which are all already herein incorporated by reference for all purposes. Other types of MEMS structures or sensors, including non-IR sensors such as resonators or pressure sensors, may also be disposed in the sensor region.

A thermopile line structure, in one embodiment, includes doped thermoelectric material. In one embodiment, the thermoelectric line structure includes doped polysilicon. Other types of thermoelectric materials which are stable at high temperatures may also be used as the thermoelectric line structure. For example, other thermoelectric materials may include silicon germanium (SiGe), gallium nitride (GaN) or a 2D material, such as graphene, black phosphorus or molysulfide. The thermoelectric material may be a doped thermoelectric material. The pattern of the line structure may be a serpentine or meandering line pattern.

In one embodiment, the thermopile line structure includes N line units, where N≥1. For example, a thermopile line structure may include 1 (N=1) or more (N>1) line units. A line unit includes first and second line segments doped with first and second thermopile dopants. The first thermoelectric dopants are first polarity type dopants and the second thermopile dopants are second polarity type dopants. The first and second polarity type dopants are opposite polarity type dopants. For example, the first polarity type is p-type and the second polarity type is n-type. The first and second segments, preferably, have about symmetrical lengths. For example, the lengths of the first and second segments are about the same length. This produces about symmetrical heat dissipation between the segments. In some cases, the lengths of the segments may be ±20% of each other. This produces an acceptable difference in heat dissipation between the segments. The doping of the line segments may, for example, be integrated into the S/D doping processes of the p-type and n-type transistors. Alternatively, separate doping processes may be employed to form the doped line segments.

In the case where the line structure includes a single line unit, the segments of the line units are disposed on a single line level. For example, the first and second line segments of the line unit are disposed on the same line level over the dielectric layer. Providing first and second line segments in different line levels may also be useful to form a stacked line unit.

In one embodiment, a metal contact couples the first and second line segments. The metal contact may be disposed at the interface of the first and second line segments. In one embodiment, the metal contact should be a high-temperature contact. For example, the contact can sustain subsequent processing temperatures. The high-temperature metal contact, for example, may be a titanium (Ti) or an aluminum (Al) alloy contact. Other types of high-temperature metals may also be used to form the contact. To form the metal contact, a contact dielectric layer may be disposed over the substrate. The contact dielectric layer, for example, covers the CMOS and MEMS regions, covering the CMOS and MEMS components. A contact opening is formed at the interface of the line segments. The contact dielectric layer is lined with a metal contact layer, which is patterned to form the metal contact. A first thermoelectric terminal is disposed at a first end of the line structure and a second thermoelectric terminal is disposed at a second end of the line structure. The terminals may be part of the line structure.

In the case where the line structure includes a multi-line unit line structure (N>1), a line unit of the multi-line unit structure may be a stacked line unit. Providing a line unit of a multi-line unit structure which is a non-stacked line unit may also be useful. The line units of the multi-line unit line structure are coupled in series. Providing multiple line units to form a sensor improves sensor performance without increasing surface area. In one embodiment, the multi-line structure includes first and second stacked line units (N=2). Providing other numbers of line units for a line structure may also be useful. For example, a line structure may have 1-4 (N=1-4) line units. Preferably, a line structure has 2N line units, where N=1-2. Other configurations of a multi-line unit line structure, including the number of line units, may also be useful.

In one embodiment, the first and second stacked line units are disposed adjacent to each other on the dielectric layer within the sensor region. A stacked line unit includes a first segment disposed in a first line level and a second line segment disposed in a second line level. The first and second line levels may be separated by a dielectric layer. For example, the second line segment of a line unit is overlaid over the first line segment of the line unit and separated by an interline level dielectric layer. A contact connects the first line segment in the first line level to the second line segment in the second line level.

The first and second line units, as discussed, are coupled in series. For example, a second terminal of the first line unit may be coupled to a first terminal of the second line unit while a first terminal of the first line unit serves as a first terminal of the multi-line unit line structure and a second terminal of the second line unit serves as a second terminal of the multi-line unit line structure. As an example, a line structure with 2 line units may be connected in series to form an n-p-n-p line structure.

The line units of the multi-line unit line structure preferably have similar designs. For example, the line structures have similar patterns with similar line segment lengths which allow for the same cuts through the dielectric layers to the sacrificial layer for an easier release process. Other configurations of line units may also be useful.

In the case of a polysilicon line structure, it may be formed with one of the polysilicon layers used to form the gate electrodes. For example, the CMOS process may include a gate electrode layer for gate electrodes and may also be employed to also serve as the polysilicon line structure. In the case where the CMOS process includes more than one polysilicon gate electrode layer, the thinner polysilicon gate electrode layer may be preferably selected to serve as the polysilicon line structure. In another embodiment, a separate layer may be employed to serve as the line structure. When multiple line structures are stacked, the different stacked structures preferably have the same material and thickness. Providing line structures with different thicknesses may also be useful. For example, the resistance can be adjusted with varying thicknesses and thermal isolation can be improved with thinner polysilicon line structure due to improved sensitivity. Additional line structure layers may be included in the process to serve as line structures of the stack.

An absorber layer (not shown) may be provided over the line structure. The absorber layer, for example, is configured to absorb incident IR radiation. In one embodiment, the absorber layer is disposed on a central portion of the line structure. The absorber layer is thermally coupled to a center of the line structure. The absorber layer may be a titanium nitride (TiN) layer. Other types of absorber layers may also be useful. For example, the absorber layer may be a nickel-chromium (NiCr) layer or a doped silicon layer. In one embodiment, the absorber is configured to absorb most of the incident IR radiation. For example, the absorber may be configured to absorb greater than 85% of incident IR radiation having a wavelength of 8-14 μm. Providing any other configurations may also be useful. In other embodiments, the absorber is configured to absorb incident radiation having a wavelength of 2-5 μm. For example, another harmonic of the interferometric absorber is used. In one embodiment, the absorber is configured to absorb >50% of incident radiation having a wavelength of 2-5 μm.

A sensor protection layer (not shown), in one embodiment, is disposed over the absorber layer. The sensor protection layer serves to protect the sensor from subsequent etch processes. For example, the protection layer serves to protect the line structure and absorber layer from etchants, such as XeF$_2$ or SF$_6$ gas, used to form the lower device cavity. In one embodiment, the protection layer is a silicon oxide layer. Other types of layers which are transparent to IR radiation and are selective to the etchant used to form the lower device cavity may also be useful.

Release openings 239 are provided in the dielectric layer 234 and other layers above, such as the dielectric layer between the sensor, the absorber layer, and the protective layer, to enable removal of lower sensor cavity sacrificial material in the substrate cavity during a release process. In one embodiment, the lower sensor cavity has a depth which is selected for optimal reflection of the desired wavelengths of IR radiation by the reflector. In one embodiment, the depth of the cavity is sufficient to ensure a ¼ wavelength optical distance between the absorber and reflector. For example, the optical distance may be about 2-3 μm for detecting IR radiation having a wavelength of 8-12 μm. Other distances may also be useful, depending on the wavelength to be detected. For example, by decreasing or increasing the optical distance, IR radiation with smaller or larger wavelengths can be detected respectively. The optical distance is defined as the distance where the IR radiation wave possesses an optical path going through several layers.

An interlayer dielectric (ILD) layer 225 may be disposed on the substrate over the CMOS and MEMS regions, covering the CMOS and MEMS components. The contact dielectric layer, for example, is a silicon oxide layer. Other types of dielectric layers or a combination of dielectric layers may also be useful.

Metal contacts are disposed in the ILD layer for connecting the line segments of the MEMS sensors. The contacts may be formed by etching trench openings in the ILD layer and lining them with a metal layer. The metal layer is patterned to form the contacts. A dielectric liner, such as silicon oxide, may be disposed over the metal contact. The dielectric liner fills the trench opening over the contact and lines the ILD layer over the CMOS and MEMS regions. The surface of the liner layer may be planar. For example, the liner layer may be a self-planarizing dielectric layer. Alternatively, a planarization process may be performed to form a planar liner surface with the contacts.

Conductive contact plugs, such as tungsten plugs are provided in the ILD layers and are coupled to contact regions on the substrate and MOS components. For example, contact plugs are coupled to S/D regions and gates of the CMOS components as well as to well taps for biasing the wells and substrate. The contact plugs are coupled to contact regions of MEMS components in the MEMS region, such as through first and second thermopile terminals of a line structure. Providing contact plugs for other types of contact regions may also be useful. The contact plugs, for example, are formed by a damascene process. The dielectric liner serves to protect the metal contacts while forming the contact plugs in the CMOS region. The dielectric liner, for example, may be considered part of the ILD layer. For example, the ILD layer may be a lower portion of the ILD layer while the liner may be an upper portion of the ILD layer.

A back-end-of-line (BEOL) dielectric 226 is provided on the substrate over the ILD layer. For example, the BEOL dielectric covers the CMOS and MEMS regions. The BEOL dielectric may include multiple intermetal dielectric (IMD) levels formed by BEOL dielectric layers. For example, the BEOL dielectric may include y IMD levels, where y is from 2-8. Other numbers of IMD levels, including 1, may also be useful, depending on the design and CMOS process.

An IMD level may include a via dielectric level and a metal dielectric level. A via dielectric level and a metal dielectric level of an IMD level may be formed from one or more dielectric layers, depending on the design and process approach. The via dielectric level may be disposed above a metal dielectric level. Providing a metal dielectric level above a via dielectric level may also be useful. For example, a first via level is disposed over a first metal level M1. Another metal level (Mx) may be disposed over the first via level (Vx). For example, in the case of 3 IMD levels, x may be from 1 to 3. The metal dielectric level includes metal lines and the via dielectric level includes via contacts. The first metal level M1 is disposed over the ILD layer. Other configurations of BEOL dielectric layers may also be useful.

The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process. In some embodiments, an IMD level may be formed by a combination of damascene and a reactive-ion etching (RIE) process. For example, metal lines may be formed by an RIE process while the contacts are formed by a single damascene process. In the case of an RIE process, a metal layer is formed and patterned by RIE using an etch mask to form the metal lines. It is understood that the different IMD levels of the BEOL dielectric may be formed using different techniques or combinations of techniques or processes. For example, the first IMD level may form contacts using a damascene process and metal lines using an RIE process, intermediate IMD levels may be formed using a dual damascene process. Alternatively, the IMD levels may be formed by a combination of damascene and RIE processes. Other configurations of forming the IMD levels may also be useful.

As for the top metal level of the BEOL dielectric, it may serve as a pad level with pad metal lines. The pad lines may be formed by a damascene or an RIE process. A passivation layer 227 is formed over the pad lines or feedthrough lines 292. Pad openings are formed in the passivation layer to expose the pad lines. Other approaches for forming the pad level may also be useful.

The ILD and IMD levels may be planarized to form a planar top surface over the CMOS region and the MEMS region. For example, CMP is performed on the substrate. Other planarization techniques, such as spin-on-glass (SOG) to fill the gaps or planarize the surface of the substrate, may also be useful. The overall thickness of the ILD and IMD levels over the structure may be from 100-400 nm. Providing any other thicknesses for the IMD levels over the structure to define the depth of the vias for subsequent standard CMOS process may also be useful.

As discussed, the passivation layer 227 is disposed above the top metal level. The passivation layer may be a single layer or a passivation stack having multiple passivation layers, such as a combination of silicon oxide and silicon nitride layers. The top metal level of the top IMD level, as discussed, may serve as a pad level. Bond openings 229 are provided in the periphery of a cap to expose the bond pads below. The bond pads, for example, are part of the pad lines. The bond pads provide external access to the internal components of the device. For example, input, output and power signals may be provided via the bond pads. Bond pads are provided in the periphery of the device, for example outside of the periphery of the cap. As shown, bond pads are provided on one side of the device which is the opposite side of the sensor region. Bond pads may also be provided on one or more of the other sides of the device.

As shown, the BEOL dielectric layers include metal layers M1 and M2. The metal layer M1 is the bottom metal layer and the metal layer M2 is the top metal layer. Providing other numbers of metal layers may also be useful. The number of metal layers may depend on the CMOS process employed. Typically, the contacts of the ILD level are formed using a single damascene process. For example, contacts are formed to couple to various terminals of the components. The contacts may contact S/D regions, gates of the transistors, well contacts and terminals of the sensor. The first metal level of the first IMD level may be formed using a single damascene or an RIE process. As for the contacts of the next via level and metal lines of the next metal level, they may be formed by a dual damascene process. The top contact level may be formed by a single damascene process and the top metal level may be formed by an RIE process. In some cases, the top metal may be formed by overfilling the via openings and patterning the excess metal to form the top metal line and bond pads. Other configurations of processes for forming the various contacts and metal lines of the IMD levels may also be useful.

In one embodiment, the dielectric material on the substrate over the MEMS region is removed, creating an opening 265 to expose the sensor array. For example, the ILD, BEOL dielectric and passivation layer (collectively may be referred to as BE dielectric or BE dielectric layers) over the MEMS region are removed. The opening in the BE dielectric, for example, forms a BE cavity. In one embodiment, the BE dielectric over the MEMS region is patterned to be disposed over the cavity walls, forming individual BE cavities over the substrate cavities. A BE cavity may be a rectangular-shaped cavity. As shown, a BE cavity includes a vertical sidewall. Providing a BE cavity with non-vertical sidewalls may also be useful. The BE cavities form lower portions of an upper sensor cavity. Other configurations of BE cavities may also be useful.

A cap 250 is bonded on the substrate, encapsulating the MEMS region. The cap, for example, is bonded to the substrate to form a vacuum over the MEMS region. In one embodiment, the cap is a cap wafer which is bonded to the substrate using wafer-level vacuum packaging (WVLP) techniques. The cap, in one embodiment, is transparent to infrared radiation. For example, the cap is capable of transmitting infrared radiation to the sensor. The cap may be a lightly doped substrate with high resistance. Such substrates may include float zone (FZ), magnetic czochralski (M-Cz) or advanced magnetic czochralski (AM-Cz) substrates or wafers. Other types of wafers with low impurity concentration and high resistance may also be used to form the cap. In one embodiment, the cap is a double-sided polished wafer. For example, the cap is polished on both front and back sides of the wafer. This provides a thinner wafer with a more planar surface for better infrared radiation transmission.

The cap, in one embodiment, completely covers the MEMS region 206. As shown, the cap also covers the CMOS region 204. For example, the cap covers the CMOS region within the bond region. In one embodiment, the cap leaves a peripheral portion of the CMOS region uncovered for bond openings 229. The bond openings expose bond pads for providing external connections to the device. The cap, for example, leaves a peripheral portion of one side of the device exposed. Leaving peripheral portions of more than one side of the device exposed may also be useful.

In one embodiment, the cap includes an anti-reflective region 260. The anti-reflective region facilitates transmission of infrared radiation through the cap. In one embodiment, the anti-reflective region is disposed over the MEMS region. For example, the anti-reflective region is disposed on the cap over the sensor array. In one embodiment, the anti-reflective region includes a bottom surface pattern 262 on the inner (bottom) surface 252 of the cap and a top surface pattern 264 on the outer (top) surface 251 of the cap. Alternatively, the surface pattern may be provided on only either the bottom or top surface of the cap. The shape, dimension and depth of the top surface pattern can be tailored based on a target IR wavelength and purpose. For example, by changing the design of the surface pattern, transmission of light having the target IR wavelength can be increased. Alternatively, IR light can be focused onto a target position or positions like a lens, or light having specific wavelengths can be filtered out. As for the bottom surface pattern, it may be similar to the top surface pattern. For example, the bottom surface pattern can be designed to reduce reflectance, focusing light, or filtering out light having specific wavelengths. For example, a moth-eye grating pattern or structure may be employed to facilitate transmission of infrared radiation. A pattern with photonic crystals or using metamaterial filter may be employed for light filtering purposes.

The surface patterns on the top and bottom surfaces may serve the same purpose. In other cases, the patterns on the top and bottom surfaces may serve different purposes. For example, the top surface pattern can be tailored for focusing light while the bottom surface pattern can be tailored for filtering out light having specific or desired wavelengths. For example, in the case of IR sensors, light having wavelengths other than 4.62 um may be filtered out. The surface pattern can be fabricated by, for example, reactive ion etching on the cap surface using a resist or hard mask. Other techniques for forming the surface patterns may also be useful.

In another embodiment, the anti-reflective region includes an anti-reflection coating disposed on the top and bottom surfaces of the cap. For example, the anti-reflective region may include anti-reflection coating instead of surface patterns. Providing the coating on either the top or bottom surface of the cap may also be useful. The anti-reflection coatings on the different surfaces of the anti-reflective region may be configured with different reflective indexes. Materials for the anti-reflection coating may be zinc sulfide (ZnS) or germanium (Ge). Providing any other materials for the anti-reflective coating may also be useful. The anti-reflection coating may be deposited on the surface or surfaces of the cap and patterned to remain in the anti-reflective region.

In one embodiment, a getter 268 is disposed on the inner surface of the cap. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth elements including cerium (Ce) or lanthanum (La) may also be useful. The getter facilitates the maintenance of the vacuum, improving reliability. In one embodiment, the getter is disposed outside of the MEMS region 206 and the anti-reflective region 260 of the cap.

In one embodiment, a sealing ring 282 is employed to facilitate bonding the cap to the substrate. For example, a sealing ring facilitates bonding of the cap to the BE dielectric. The sealing ring, for example, includes a cap sealing ring 282b and a device sealing ring 282a. The cap sealing ring is formed on the cap bond region while the device sealing ring is formed on the BE bond region 204 on the BE dielectric. The cap and device sealing rings are mated, bonding the cap to the device. In one embodiment, a sealing ring (cap sealing ring or device sealing ring) includes a sealing stack with multiple layers. The sealing stack may include a metal stack, a dielectric stack, or a combination of metal/dielectric stack. For example, the sealing stack may include gold-based metal, such as gold (Au) or gold-tin (AuSn), aluminum (Al), copper (Cu), silver (Ag), titanium (Ti), germanium (Ge), tin (Sn), titanium nitride (TiN), silicon dioxide, silicon nitride or a combination thereof. Providing other materials and structures for the sealing stacks may also be useful.

The cap and substrate may be bonded using thermal compression bonds. Other bonding techniques, such as eutectic bonding, may also be useful. In one embodiment, high-temperature bonding may be utilized. For example, bonding process can be carried out at a temperature as high as 450° C. This creates a stronger and more reliable bonding interface between the cap and the device.

The cap, when bonded to the substrate, forms a cap cavity 253, encapsulating the MEMS region 206 inside the cap bonding region. In one embodiment, the cap hermetically seals the MEMS region. The volume of the cavity, for example, may be defined by the height of the sealing ring. Furthermore, the desired distance between the anti-reflective region and the sensors can be determined by the height of the sealing rings.

Referring to FIG. 2a, the cap includes planar or substantially planar inner and outer surfaces. It is understood that the anti-reflective regions may include gratings or moth-eye patterns, making it substantially planar. However, planar includes planar and substantially planar. As such, the volume and distance between the anti-reflective region are determined by the height of the sealing ring.

Figure 2B:
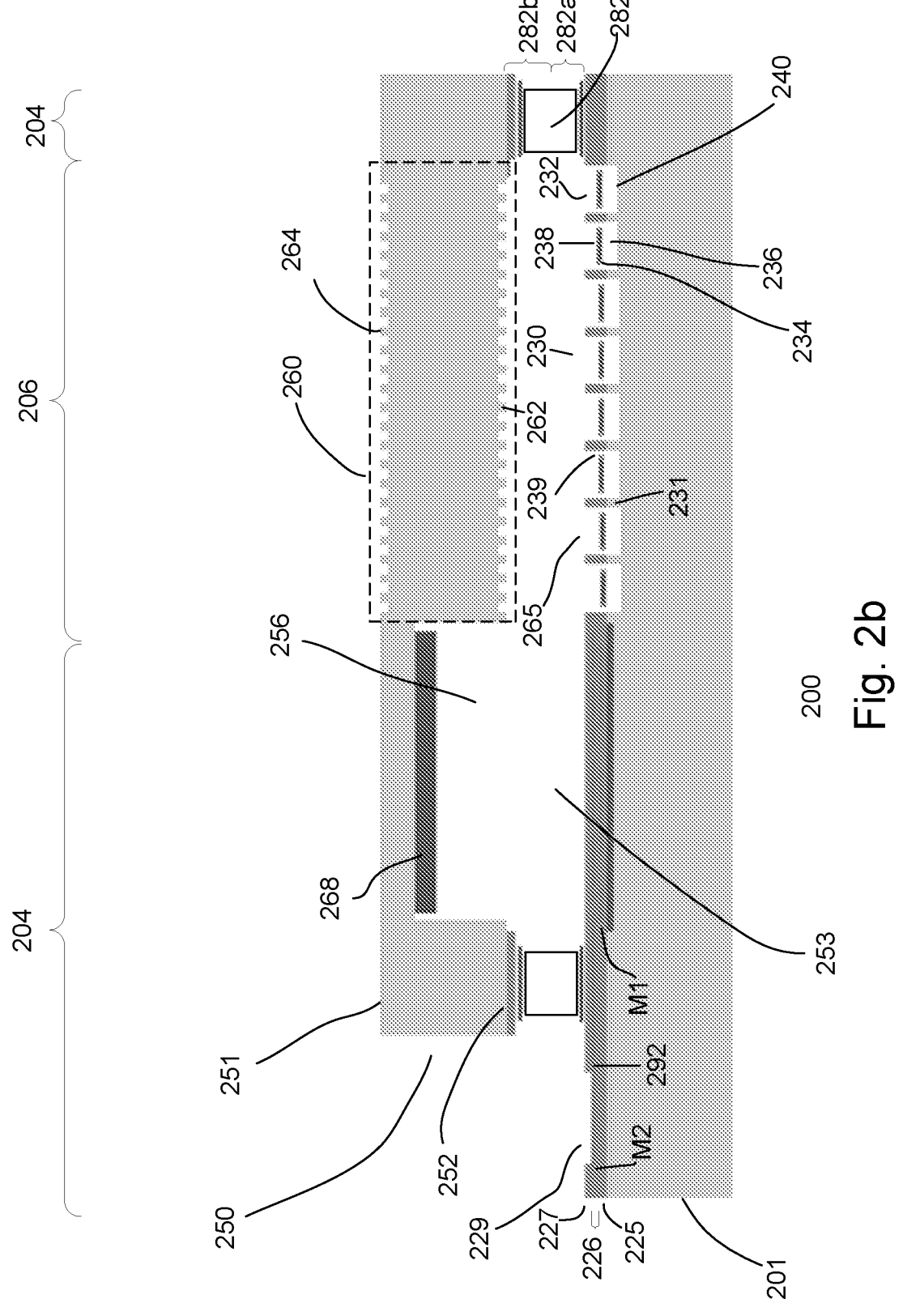

In another embodiment, as shown in FIG. 2b, the cap includes a cap recess 256 on the inner surface thereof. The cap recess, for example, is disposed on a bottom surface of the cap outside of the anti-reflective region 260. The cap recess may have a square or rectangular footprint or shape. Other shapes for the cap recess may also be useful. Depending on the thickness of the cap wafer, the cap recess may have a depth ranging from 10, 20, 30, 100 to 500 um. Having a cap recess which is deeper than 500 um may also be useful. In one embodiment, the cap recess improves an overall vacuum level within the cap cavity. For example, the cap recess increases the overall volume of the cap cavity between the cap and the sensors in the MEMS region. The larger volume improves the overall vacuum level after bonding of the cap wafer to the device substrate. As such, better imaging qualities can be captured from the device.

In one embodiment, a getter 268 is disposed on an inner surface of the cap recess. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth elements including cerium (Ce) or lanthanum (La) may also be useful. The getter facilitates the maintenance of the vacuum, improving reliability.

Figure 2C:
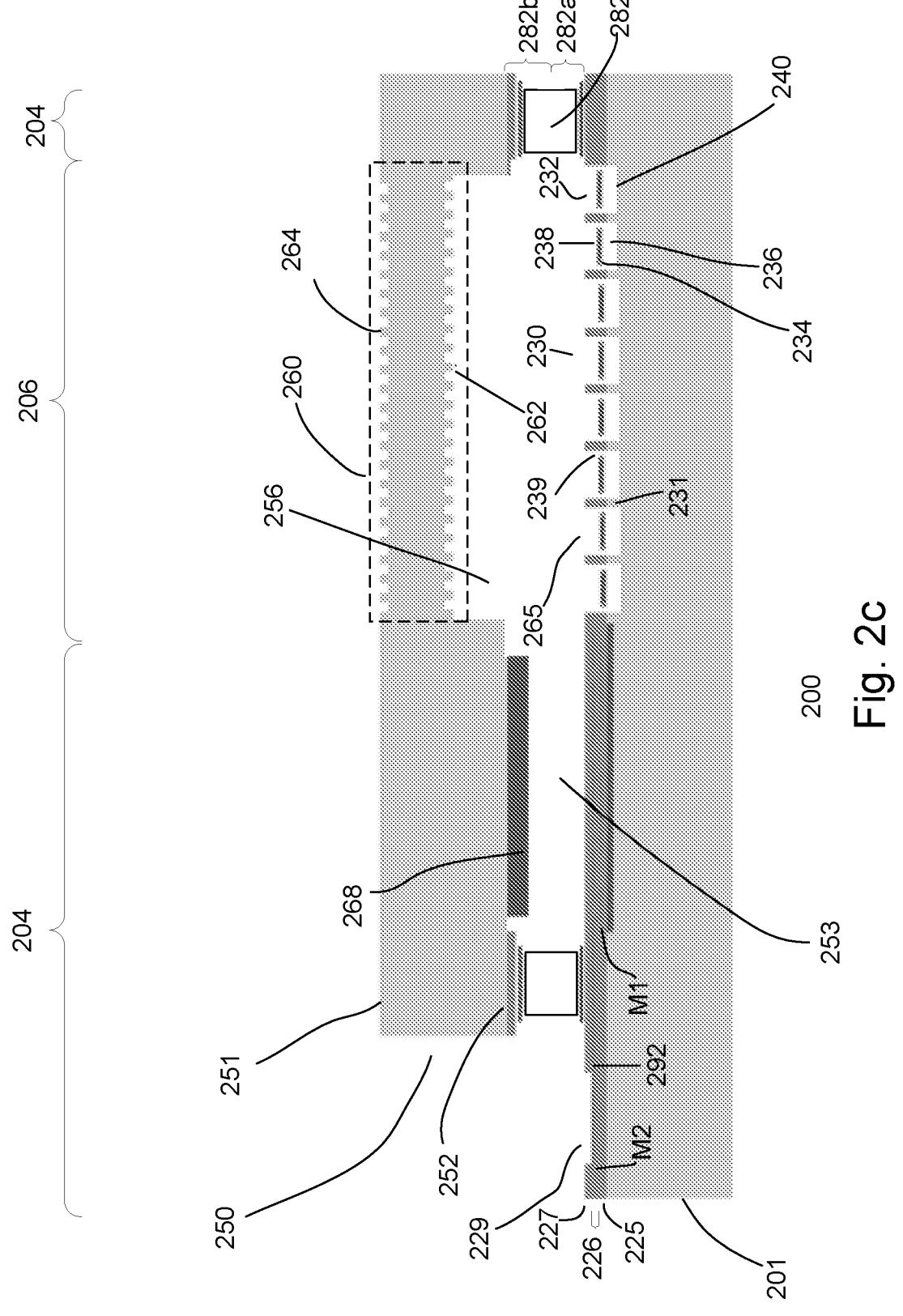

In yet another embodiment, as shown in FIG. 2c, a cap is provided. The cap is similar to that shown in FIG. 2b, except that the cap recess 256 is disposed over the MEMS region 206. For example, the anti-reflective region 260 is disposed in the cap which encompasses the cap recess over the MEMS region. Providing the anti-reflective region 260 in the cap recess enables the distance between the anti-reflective region and the sensors to be additionally controlled by the depth of the cap recess which is independent of the height of the sealing ring. A getter 268 may be disposed on an inner surface of the cap outside of the cap recess. The getter absorbs moisture and outgassing within the encapsulated device. The getter facilitates the maintenance of the vacuum, improving reliability.

Figure 2D:
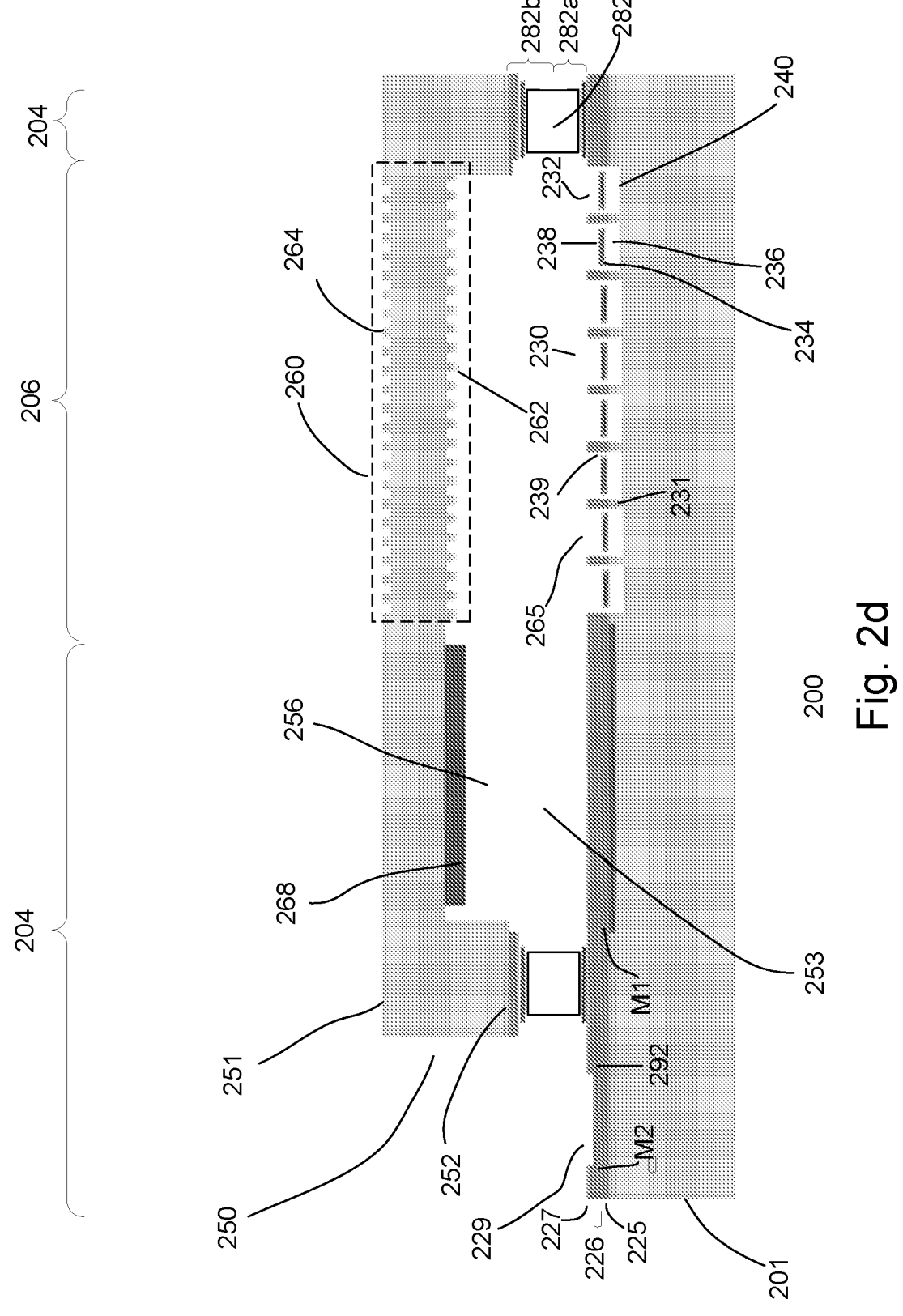

In another embodiment, as shown in FIG. 2d, a cap 250 is provided. The cap is processed to include a cap recess 256. The cap recess, for example, is disposed inside of the cap bonding region of the cap with the cap sealing ring 282b. For example, the cap bonding region forms a periphery of the inner surface of the cap surrounding the cap recess. The cap recess increases the volume of the overall cap cavity for a given sealing ring height. Furthermore, the depth of the overall cap cavity can be increased by increasing the depth of the cap recess without increasing the sealing ring height.

A getter 268 may be disposed on an inner surface of the cap recess outside of the anti-reflective region 260 over the MEMS region 206. The getter absorbs moisture and outgassing within the encapsulated device. The getter facilitates the maintenance of the vacuum, improving reliability.

Figure 2E:
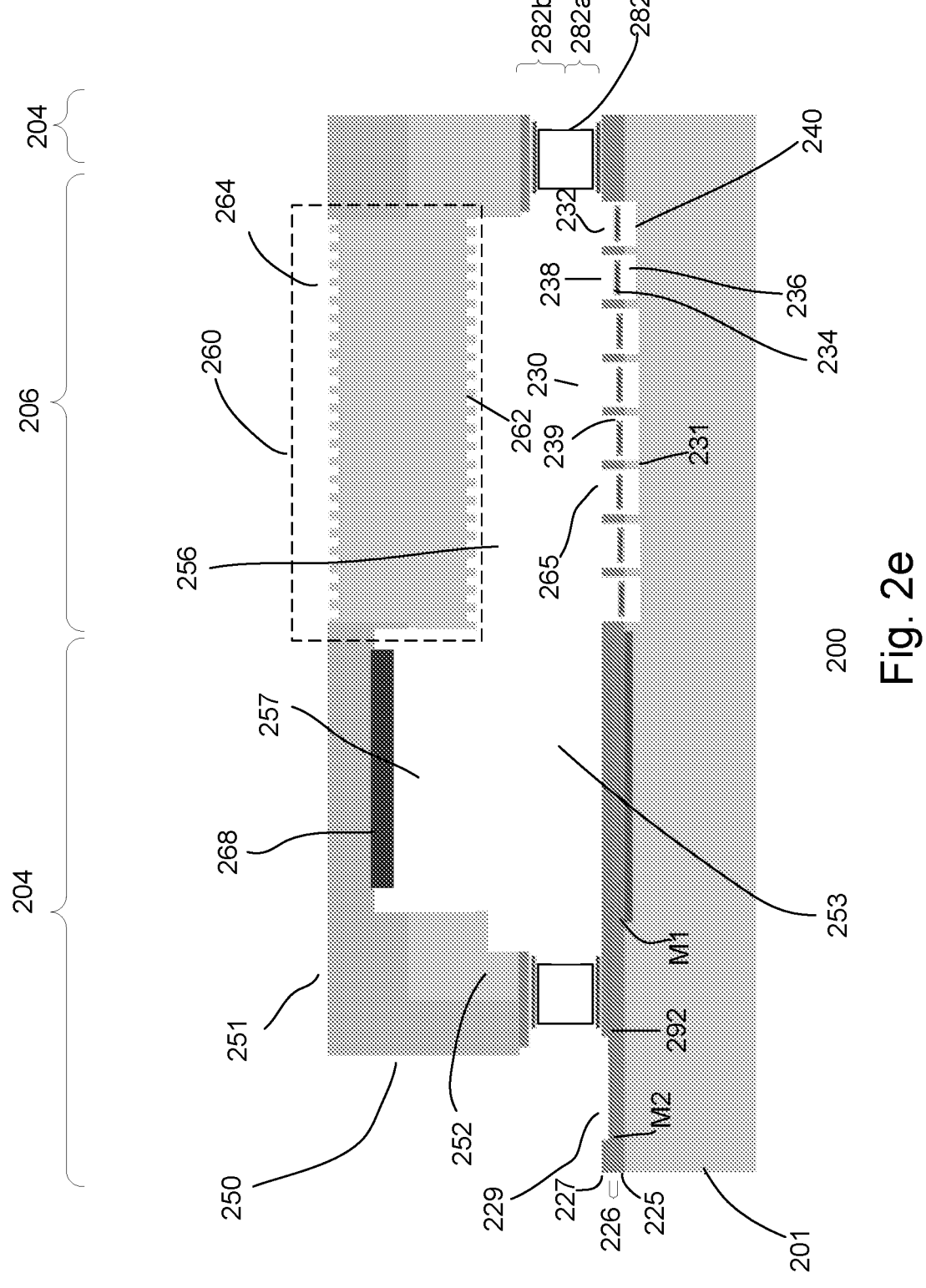

As shown in FIG. 2e, a cap 250 with shallow and deep cap recesses 256 and 257 are provided. The shallow cap recess, similar to the cap recess of FIG. 2d, is surrounded by a cap bonding region of the cap with the cap sealing ring 282b. In addition, the deep cap recess is disposed outside of the anti-reflective region 260 of the cap. The deep recess increases the volume of the cap cavity 253. A getter 268 may be disposed on an inner surface of the deep recess outside of the anti-reflective region 260. The getter absorbs moisture and outgassing within the encapsulated device. The getter facilitates the maintenance of the vacuum, improving reliability.

Figure 2F:
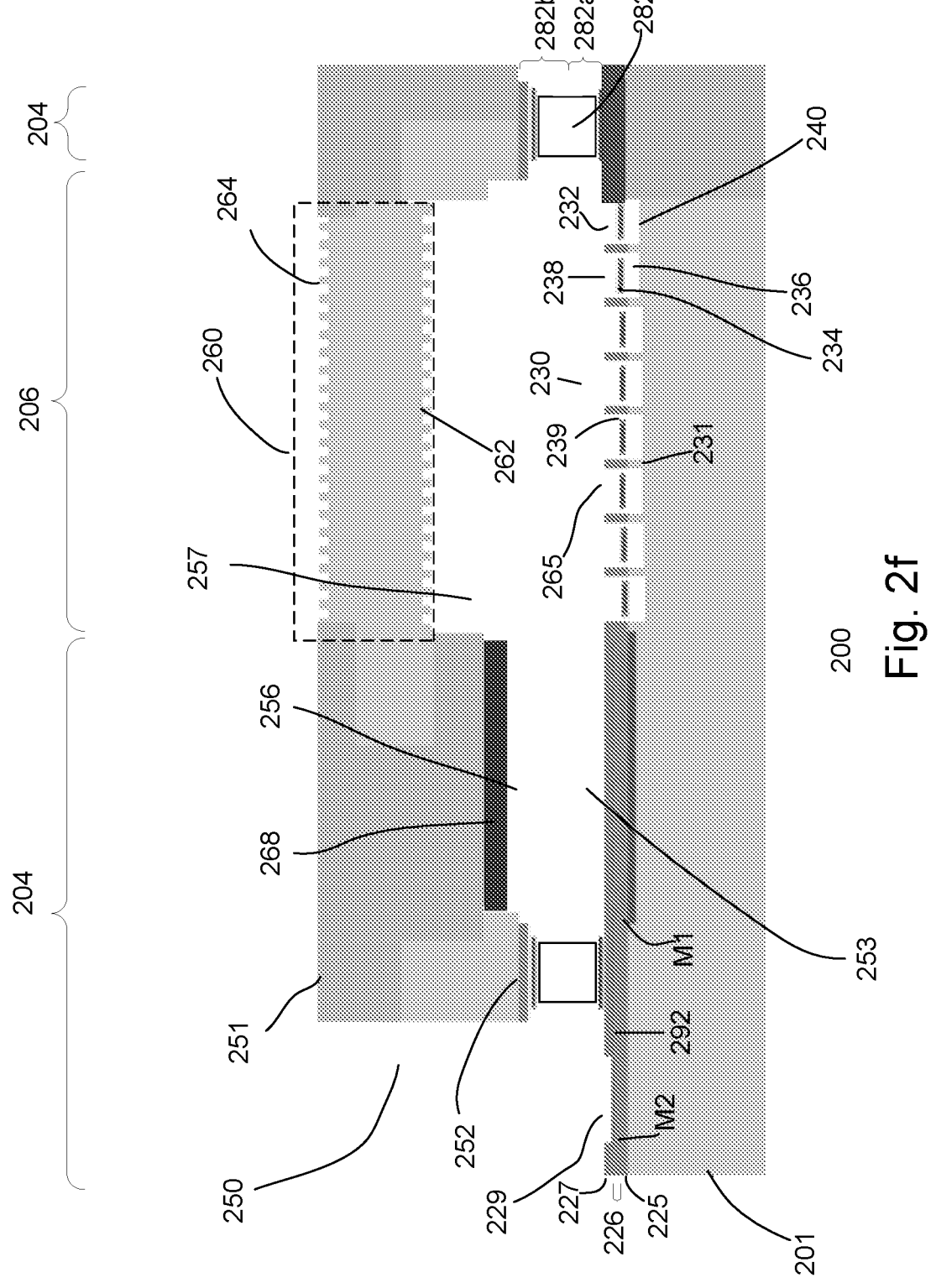

In another embodiment, as shown in FIG. 2f, a cap 250 is provided. The cap is similar to the cap of FIG. 2e, except that the deep cap recess 257 is disposed over the MEMS region 206 A getter 268 may be disposed on an inner surface of the shallow cap recess 256 outside of the anti-reflective region 260. The getter absorbs moisture and outgassing within the encapsulated device. The getter facilitates the maintenance of the vacuum, improving reliability.

Figure 3A:
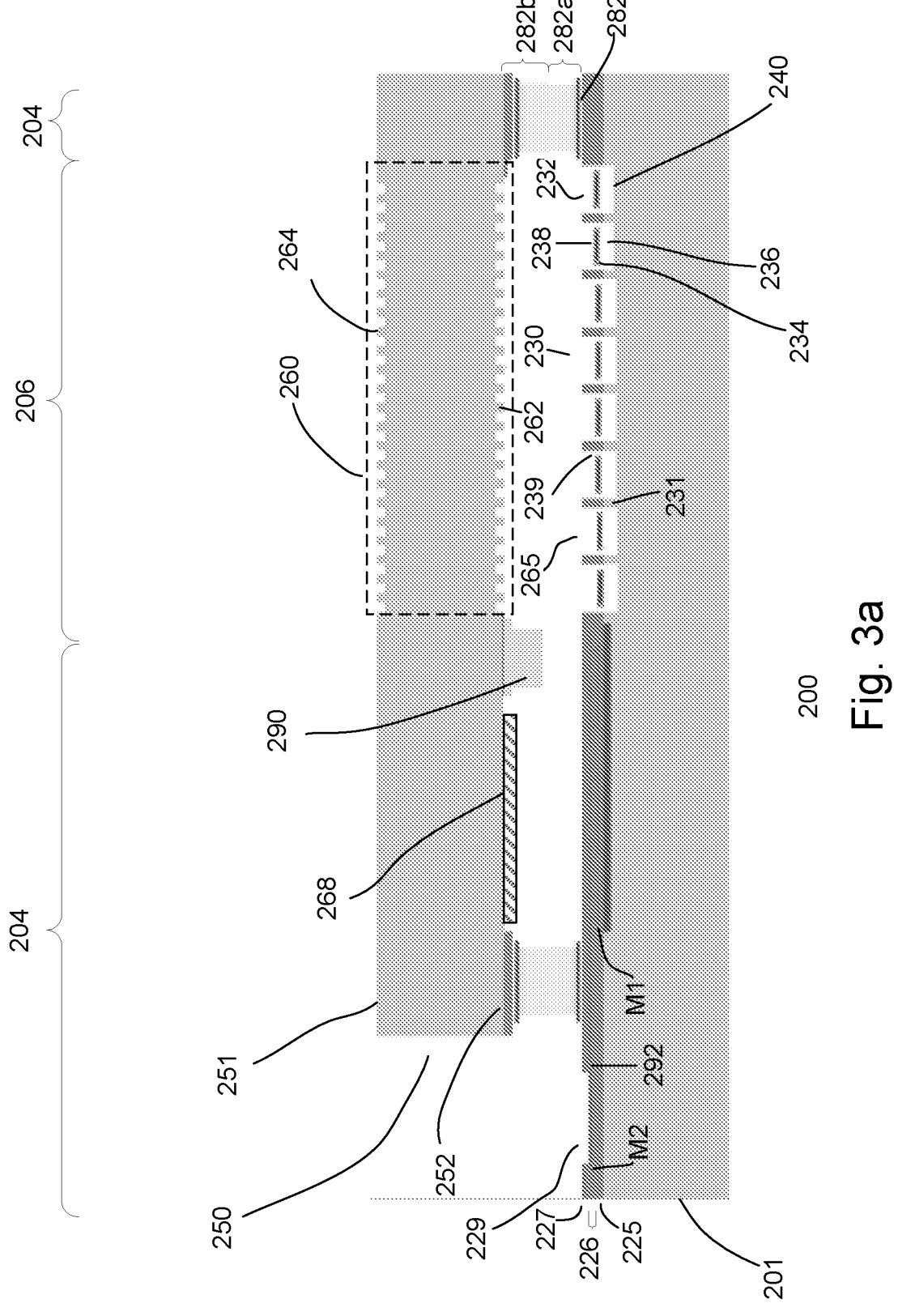
FIGS. 3a-d show simplified cross-sectional and top view of other embodiments of the device.
Figure 3B:
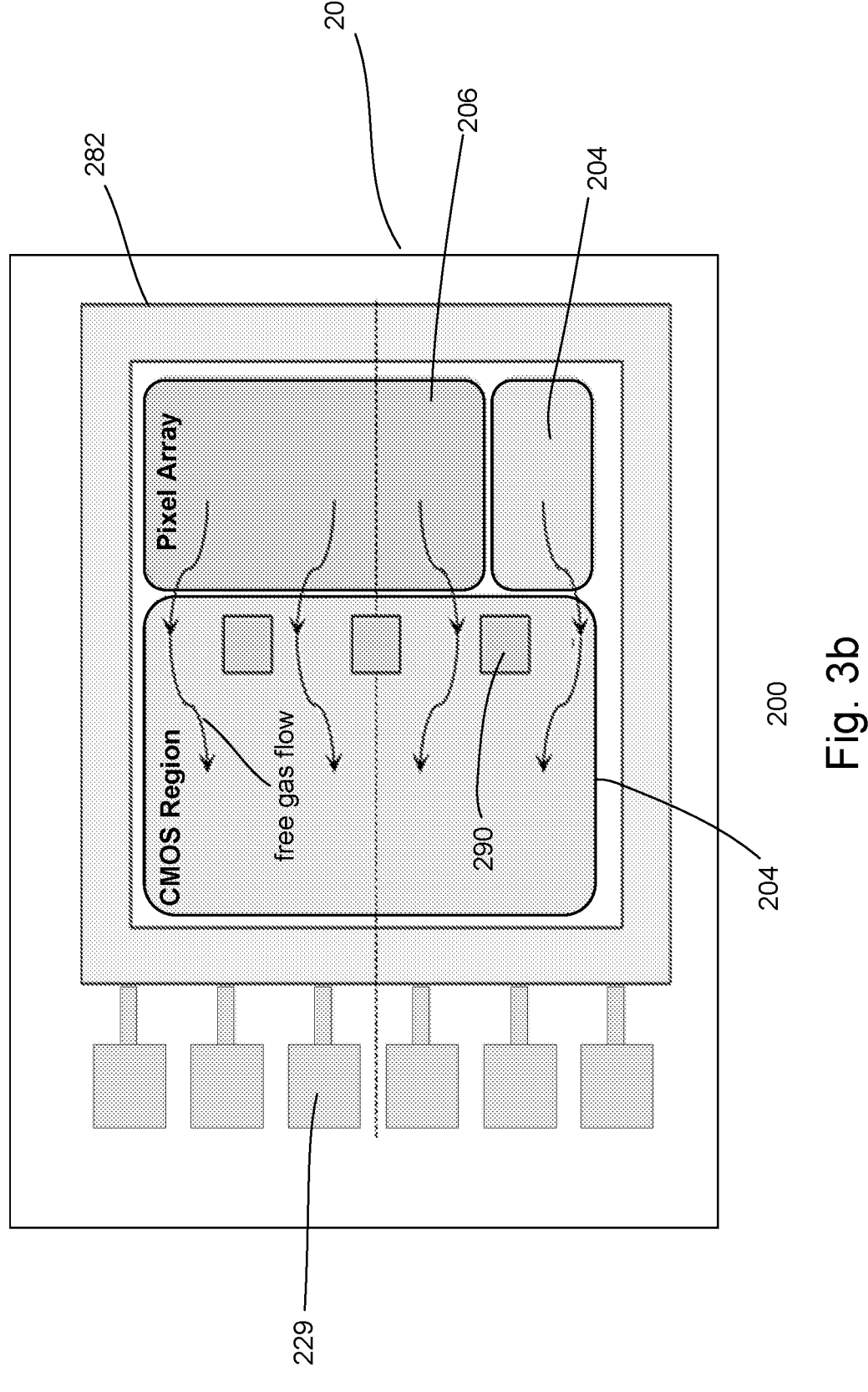
Figure 3C:
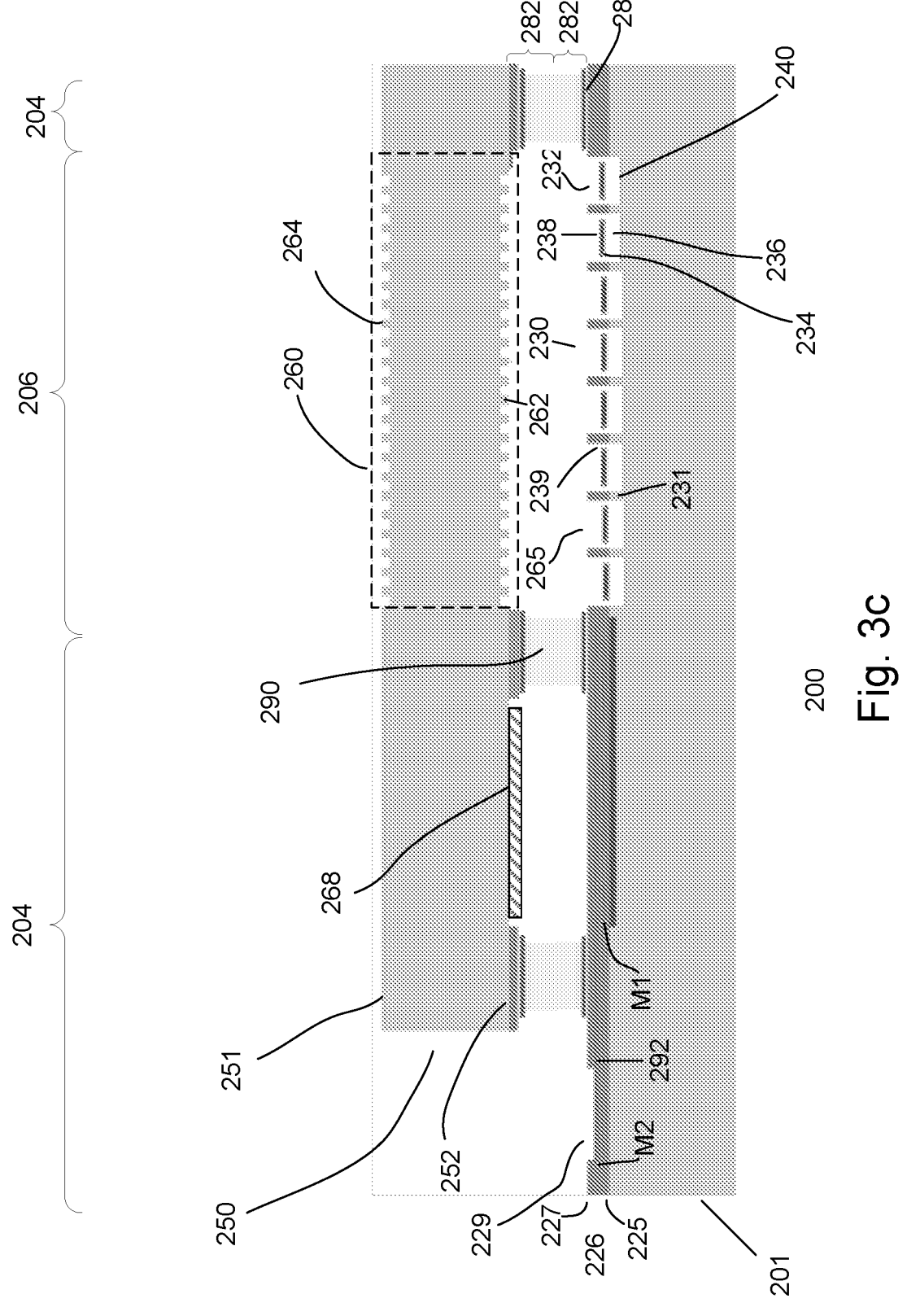
Figure 3D:
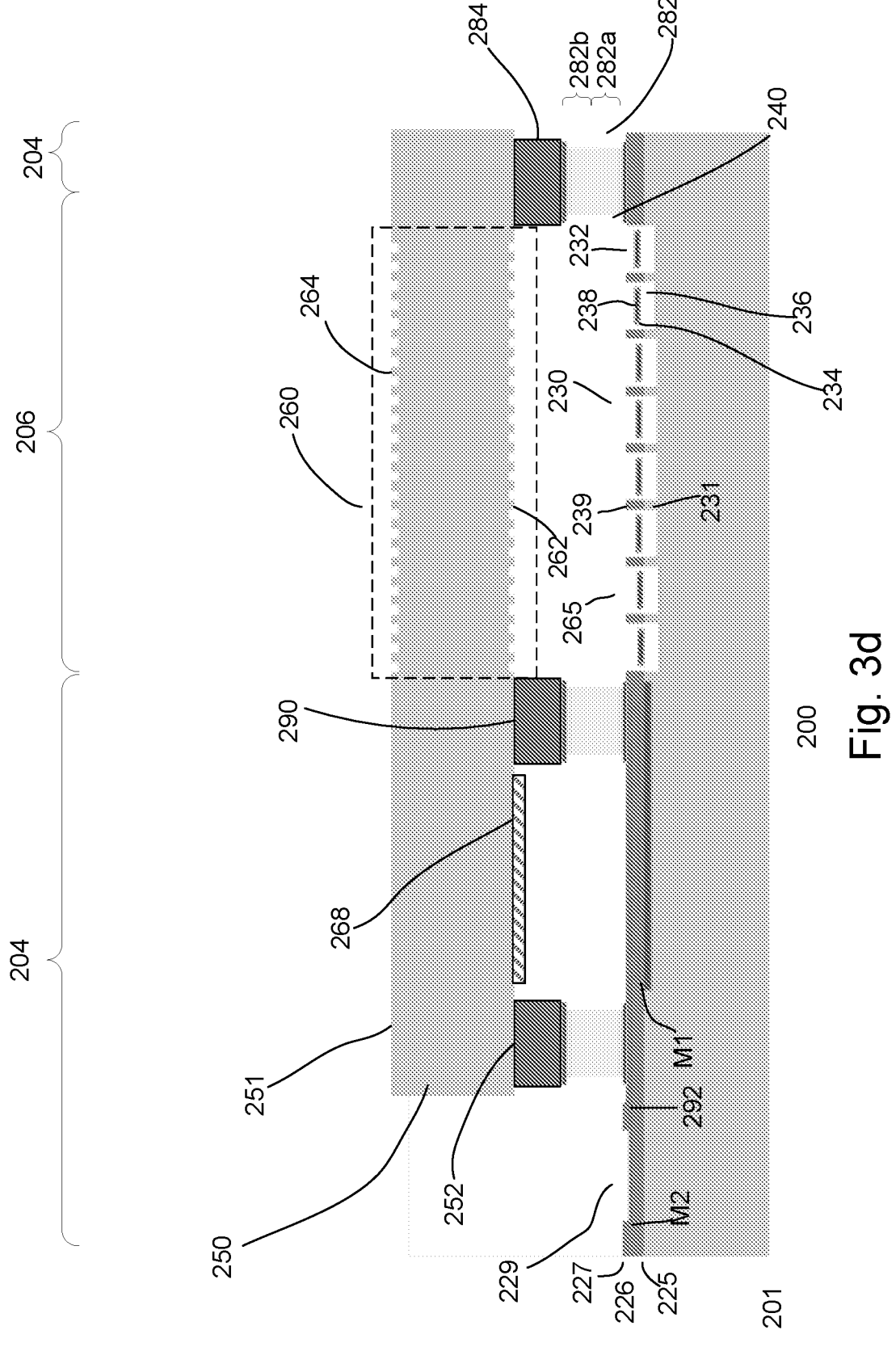

FIGS. 3a-b show simplified cross-sectional and top views, respectively, of another embodiment of a device. FIGS. 3c-d show simplified cross-sectional views of other embodiments of the device. The devices are similar to those described in FIGS. 2a-f. Common elements may not be described or described in detail.

Referring to FIG. 3a, a cap 250 is bonded to a device having a CMOS region 204 and a MEMS region 206. The MEMS region may be a rectangular-shaped region that is surrounded by the CMOS region on two adjacent sides thereof. A bonding region with a sealing ring 282 surrounds the CMOS and MEMS region. As shown, the bonding region is a rectangular shaped region which surrounds the CMOS and MEMS regions. The sealing ring facilitates bonding a cap 250 to, for example, the BEOL dielectric of the device, encapsulating the MEMS region. The cap also encapsulates the CMOS region. In one embodiment, the cap leaves a peripheral portion of the CMOS region uncovered for bond openings 229. The bond openings expose bond pads for providing external connections to the device. The cap, for example, leaves a peripheral portion of one side of the device exposed. Leaving peripheral portions of more than one side of the device exposed may also be useful.

In one embodiment, the cap is similar to that described in FIG. 2a. For example, the cap includes planar or substantially planar top (outer) and bottom (inner) cap surfaces. In one embodiment, the cap includes support columns or posts 290 disposed outside of the MEMS region. For example, the support columns are located in the CMOS region. The support columns serve to prevent or reduce the cap from bending during the bonding process, which may lead to the cap contacting the BEOL dielectric, causing damage to the interconnects therein. Support columns are particularly useful applications with large sensor dies since they are more susceptible to this problem.

In one embodiment, the support columns are configured to act as spacers to provide mechanical support during wafer-level vacuum packaging (WLVP). For example, the support columns or posts should maintain the constant space between the device wafer and cap wafer during the bonding process. In addition, the support columns should be configured to allow gas molecules to flow freely between the MEMS and CMOS region for absorption by the getter layer 268 disposed on the inner surface of the cap in the non-MEMS region. As shown in FIG. 3b (top view), the support columns are disposed in the CMOS region at about an interface of the MEMS region, separating the cap cavity into two regions. Spaces separating adjacent support columns enable gas-flow between the two regions of the cap cavity.

As shown, the support columns are rectangular-shaped columns. Providing columns having other shapes may also be useful. The dimensions of the support columns can be about 10 um×10 um, 20 um×20 um, 50 um×50 um or 100 um×100 um. Support columns having other dimensions may also be provided. Although the illustration in FIG. 3b exemplarily shows 3 support columns disposed in a line at the CMOS region near the interface of the MEMS region, other numbers of support columns or arrangement of support columns may also be useful. The number of support columns may depend on, for example, the size of the cap cavity and dimensions of the support columns. The support columns should be disposed outside the MEMS region to avoid interfering with the operation of the sensors or breaking the sensors during the bonding process.

The support columns may include various types of materials. For example, the support columns may include dielectrics, metals, ceramics or a combination thereof. Other materials may also be employed to form the support columns. Preferably, the materials used should be post CMOS compatible if they are formed on the device wafer. However, post CMOS compatibility is not a concern if the support columns are formed on the cap wafer. It is further understood that cap portions of the support columns may be formed on the cap wafer and device portions of the support columns may be on the BEOL dielectric on the device wafer. Unlike the sealing rings, the cap portions and the device portions of the support columns need not form bonds. As such, they can be formed of different types of materials which do not form a bond during WLVP.

In some embodiment, support columns may be formed on either the device wafer or on the cap wafer. Although this may result in a gap, it may still be sufficient to prevent the cap wafer from contacting the device wafer during WLVP. For example, the cap portions of the support column should have sufficient height to prevent the cap wafer from contacting the device wafer during WLVP.

In other embodiments, the cap and device portions of the support columns are formed during the same process as forming the sealing rings on the cap and device wafers. In such cases, the cap and device portions of the support columns are identical to the cap and device sealing rings on the cap and device wafers. For example, the portions of the support columns form bonds, similar to the sealing rings during WLVP. In some embodiments, support column portions may be formed on either the cap wafer or the device wafer using the same process which forms sealing rings.

In one embodiment, as shown in FIG. 3a, cap portions of the support column 290 are formed on the cap. No device column portions are formed on the device wafer, leaving a gap between the cap column portions and the device wafer. The cap column portions may be dielectric column portions formed using a separate process from forming the sealing rings. Other types of cap column portions may also be useful. In other embodiments, the cap column portions may be formed in the same process as the cap sealing ring.

In other embodiments, as shown in FIGS. 3c-d, the support column includes cap column portions and the device column portions. The column portions are formed in the same process as the sealing rings. For example, the cap column portions are formed in the same process as the cap sealing ring; the device column portions are formed in the same process as the device sealing ring. For example, the various layers of the cap sealing ring are formed on the cap wafer and patterned to form the cap sealing ring and the cap column portions. Likewise, the various layers of the device sealing ring are formed on the device wafer and patterned to form the device sealing ring and device column portions.

As shown in FIG. 3d, the cap sealing ring and cap column portions include a base 284. The base, for example, is a dielectric base, such as silicon oxide. Other types of bases may also be provided on which the cap sealing ring and cap column portions are formed. It is understood that column portions of FIGS. 3a-d may be provided in one of the wafers, such as the cap wafer or the device wafer.

The various configurations of the support columns may be applied with other types of caps. For example, the various configurations of the support columns may be applied to caps described in FIGS. 2b-f. For example, the cap may have planar inner and outer surfaces, include a cap recess in either the anti-reflective region or non anti-reflective region, shallow and deep cap recesses in which the deep cap recess may be located in the anti-reflective region or the non anti-reflective region, surface patterns on one or both cap surfaces in the anti-reflective region, anti-reflection coating on one or both surfaces of the cap surfaces in the anti-reflective region or a combination of an anti-reflection coating on one of the cap surfaces in the anti-reflective region and a surface pattern on the other cap surface of the anti-reflective region.

Figure 3E:
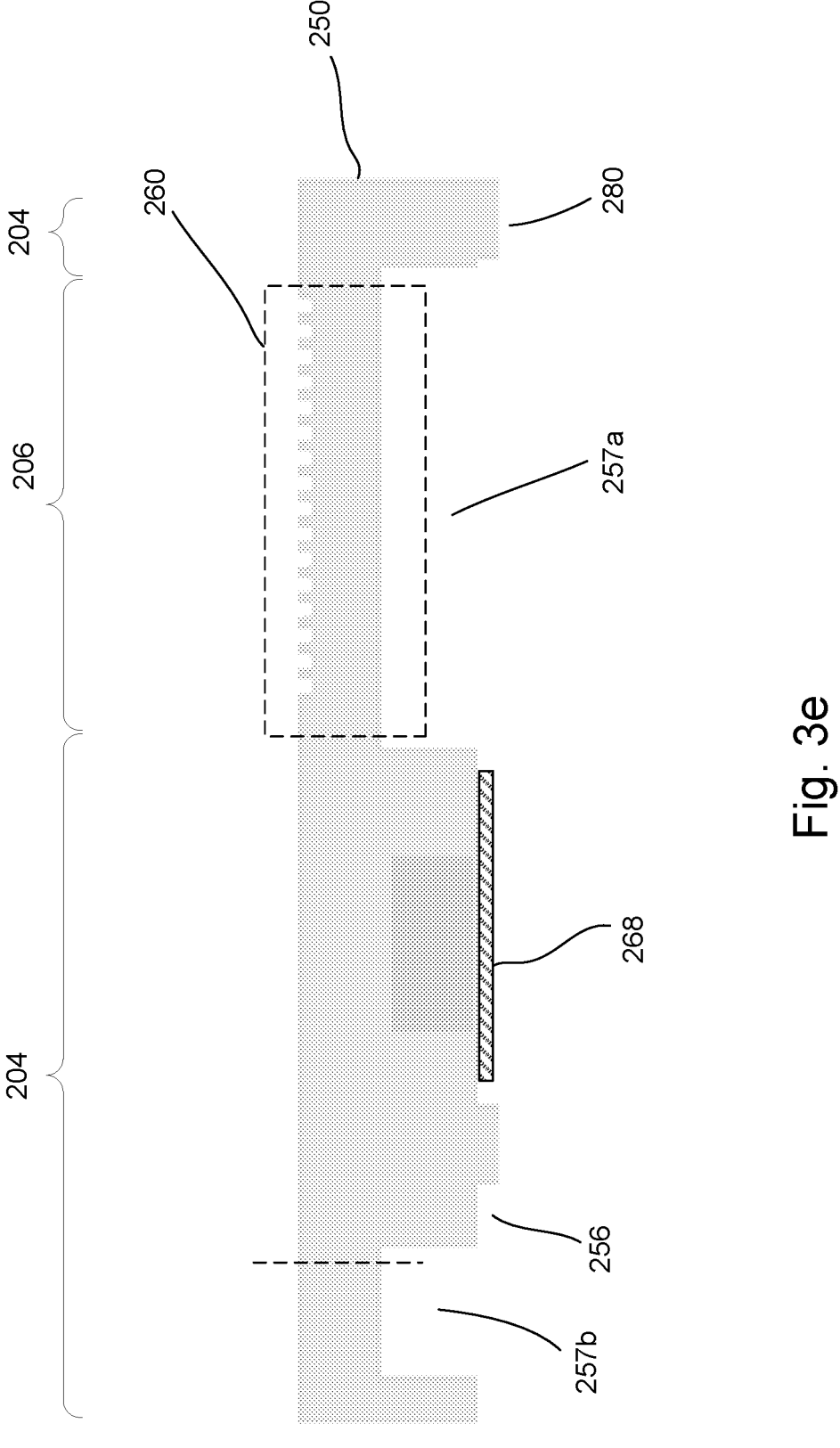
FIGS. 3e-g show alternative embodiments of caps used to encapsulate the device.
Figure 3F:
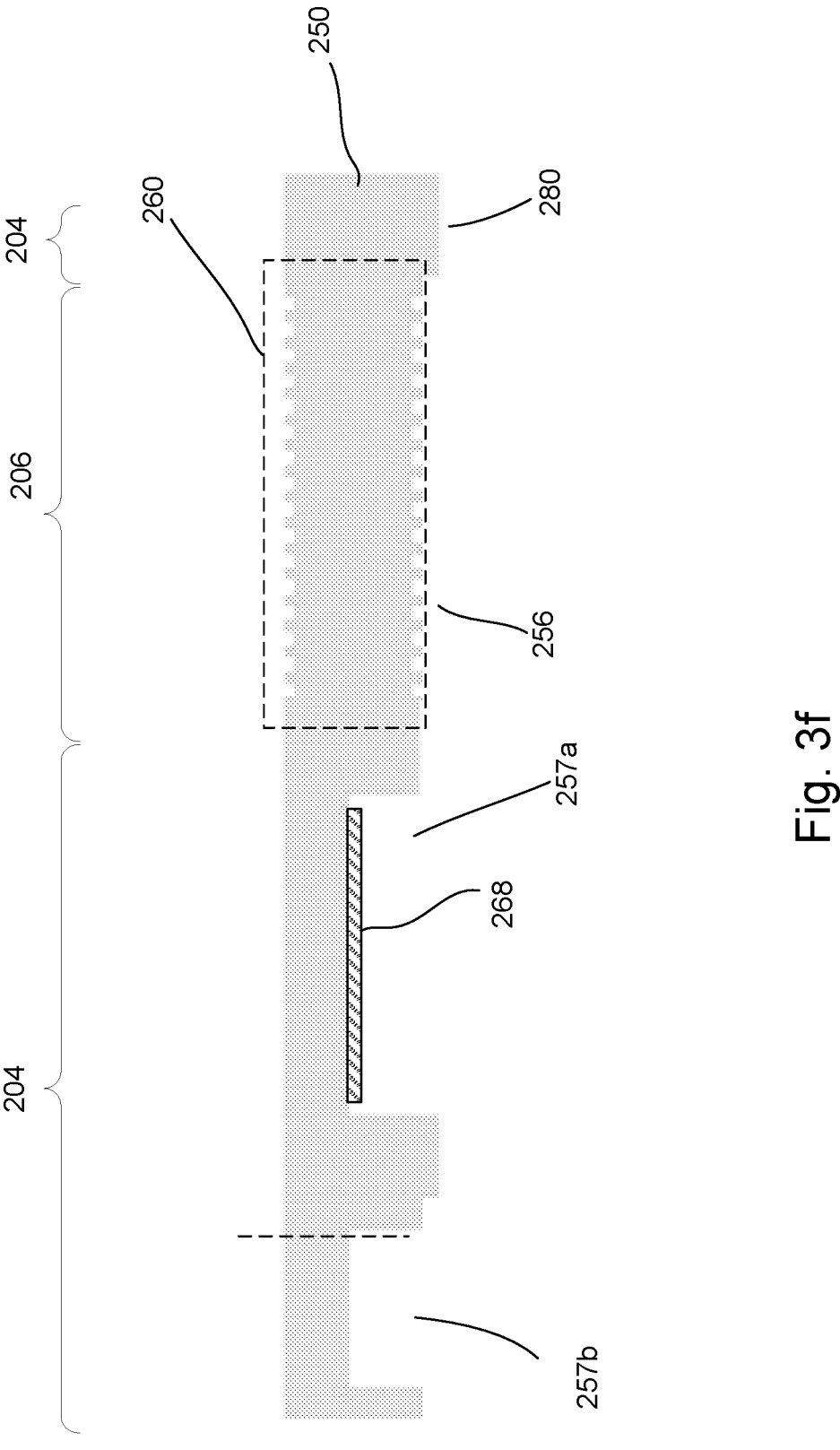
Figure 3G:
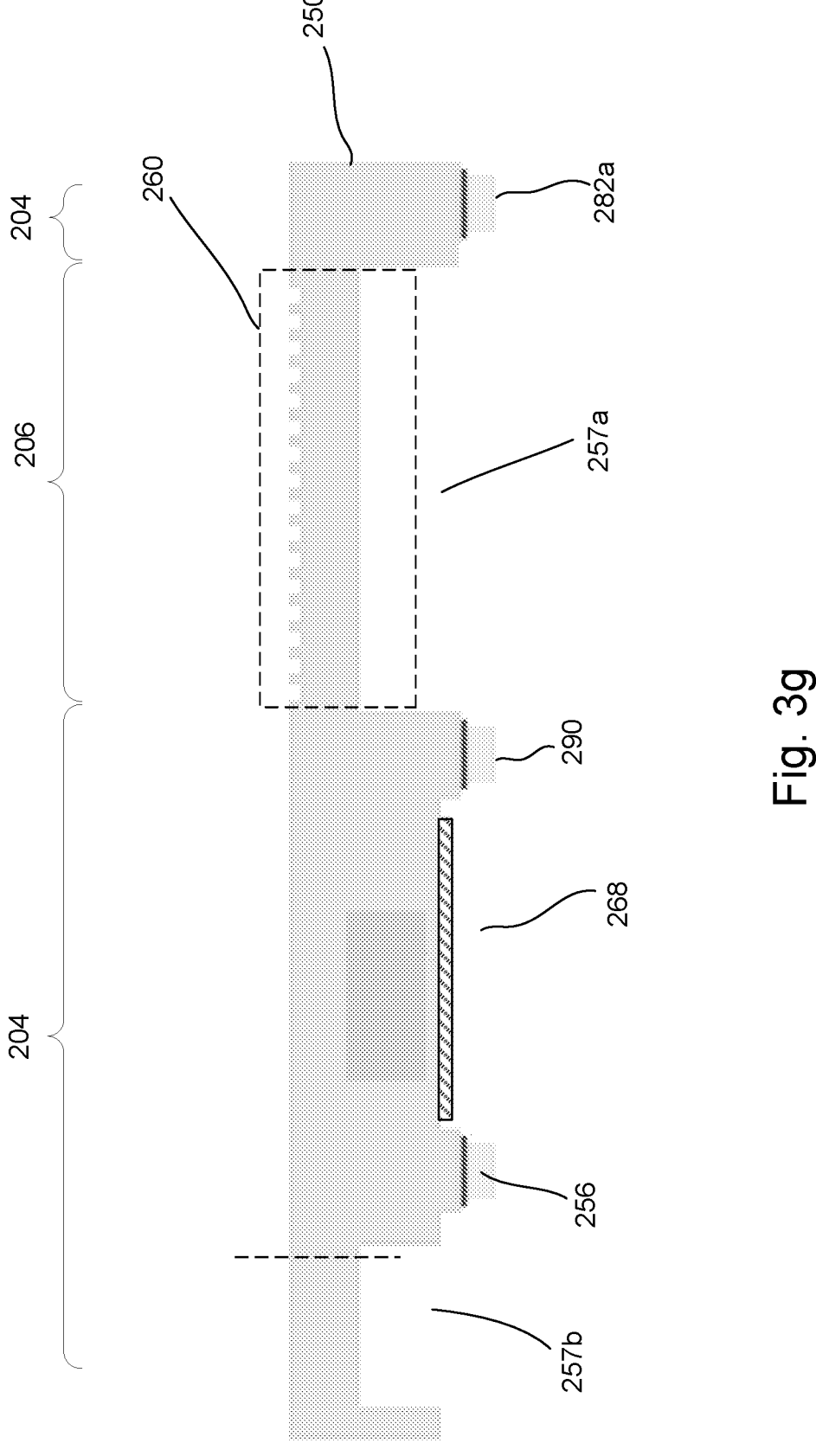

FIGS. 3e-g show alternative embodiments of caps used to encapsulate the device. Referring to FIGS. 3e-f, a cap 250 includes a shallow cap recess 256, a primary deep cap recess 257a and a secondary deep cap recess 257b. The secondary deep cap recess, for example, has a depth which is the same or about the same as the primary cap recess. As for the shallow cap recess, it has a depth which is shallower than the deep cap recesses. The secondary deep recess is disposed outside of the cap bonding region 280 which surrounds the MEMS region 206 and the CMOS region 204. As shown, the bonding region separates the shallow recess into primary and secondary shallow cap recesses. The secondary cap recess is disposed outside of the bonding region and the primary shallow cap recess is located within the bonding region. In some embodiments, the cap includes only the primary and secondary deep cap recesses. For example, no shallow cap recesses are provided.

In FIG. 3e, the primary deep cap recess 257a is disposed over the MEMS region and includes the anti-reflective region 260. The anti-reflective region is shown to include a surface pattern on the top cap surface. For example, the anti-reflective region includes one surface pattern. Providing the surface pattern on the bottom surface instead of the top surface may also be useful. The surface without the surface pattern may be provided with an anti-reflection coating. In other embodiments, both the top and bottom surfaces include surface patterns. In yet another alternative embodiment, an anti-reflection coating may be provided on one or both cap surfaces in the anti-reflective region. A getter layer 268 is provided on the inner surface of the cap outside of the deep cap recess. For example, the getter layer is disposed on the primary shallow cap cavity within the bonding region. After WLVP, the portion of the cap outside of the bonding region, as indicated by the dotted line, is removed by dicing to expose the bond pads on the device wafer below.

As shown in FIG. 3f, the shallow cap recess within the bonding region 280 is disposed over the MEMS region 206 and includes the anti-reflective region 260 while the primary deep cap recess 257*a* is disposed over the non-MEMS region (e.g., CMOS region). The anti-reflective region includes, for example, surface patterns on the top and bottom cap surfaces. Other configurations of the anti-reflective region may also be useful. For example, the anti-reflective region may include a surface pattern on one of the cap surfaces (e.g., top) with or without an anti-reflection coating on the other (e.g., bottom) of the cap surfaces or an anti-reflective coating on one or both cap surfaces. A getter layer 268 is disposed on the inner cap surface of the primary deep cap recess. After WLVP, the portion of the cap outside of the bonding region, as indicated by the dotted line, is removed by dicing to expose the bond pads on the device wafer below.

Figure 3H:
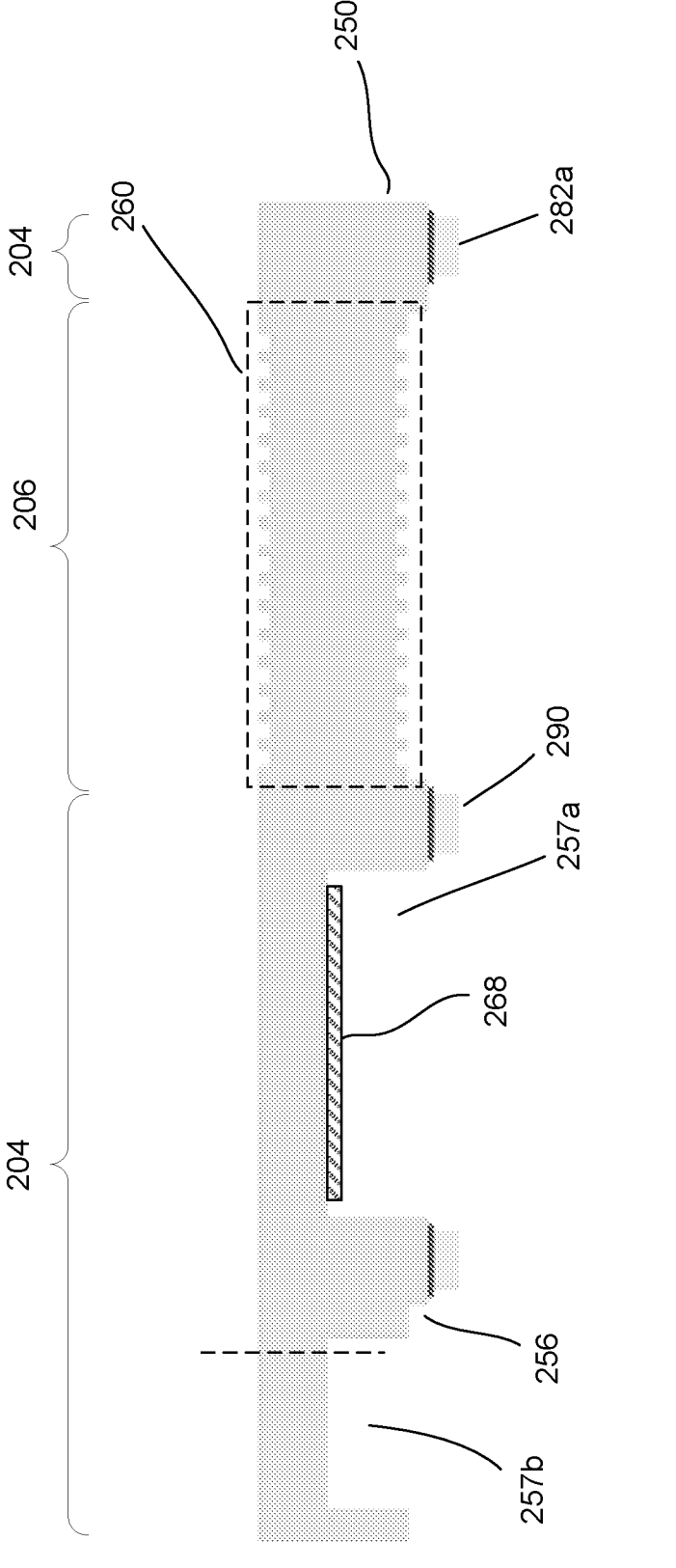

FIGS. 3*g-h* show a cap 250 which includes a shallow cap recess 256, a primary deep cap recess 257*a* and a secondary deep cap recess 257*b*, similar to FIGS. 3*e-f*. The cap is configured with support columns 290, as described in FIGS. 3*a-d*. Common elements may not be described or described in detail. The secondary deep cap recess is disposed outside of the cap bonding region 280 which surrounds MEMS region 206 and the CMOS region 204. As shown, the bonding region separates the shallow recess into primary and secondary shallow cap recesses. The secondary cap recess is disposed outside of the bonding region and the primary shallow cap recess is located within the bonding region. In some embodiments, the cap includes only the primary and secondary deep cap recesses. For example, no shallow cap recesses are provided.

In FIG. 3*g*, the deep cap recess 257*a* is disposed over the MEMS region 206 and includes the anti-reflective region 260. A getter layer 268 is provided on the inner surface of the cap outside of the deep cap recess. For example, the getter layer is disposed on the shallow cap cavity within the bonding region. The cap column portions are disposed outside the MEMS region. As shown, the cap pillar portions 290 are identical to the cap sealing ring 282*b*. For example, the cap column portions and cap sealing ring are formed in the same process. Forming the cap column portions and cap sealing ring in different processes using different materials may also be useful, as described in FIGS. 3*a-d*. After WLVP, the portion of the cap outside of the bonding region, as indicated by the dotted line, is removed by dicing to expose the bond pads on the device wafer below.

As shown in FIG. 3*h*, the shallow cap recess within the bonding region is disposed over the MEMS region 206 and includes the anti-reflective region 260 while the primary deep cap recess is disposed over the non-MEMS region (e.g., CMOS region). The cap column portions are disposed outside the MEMS region. As shown, the cap column portions 290 are identical to the cap sealing ring 282*b*. For example, the cap column portions and cap sealing ring are formed in the same process. Forming the cap column portions and cap sealing ring in different processes using different materials may also be useful, as described in FIGS. 3*a-d*. After WLVP, the portion of the cap outside of the bonding region, as indicated by the dotted line, is removed by dicing to expose the bond pads on the device wafer below.

Figure 4A:
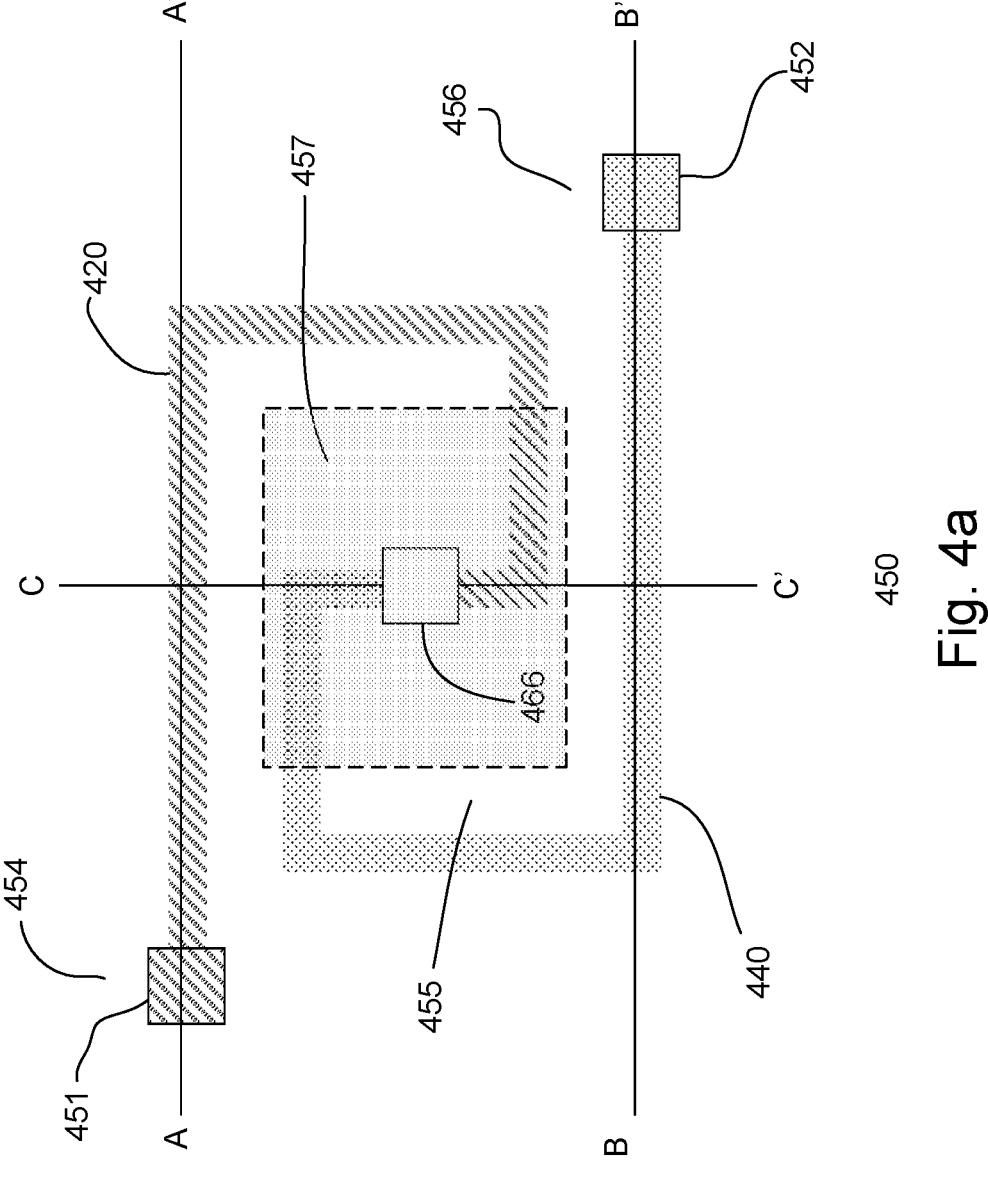
FIGS. 4a-d show top and cross-sectional views of various exemplary embodiments of thermopile structures for IR sensors.
Figure 4B:
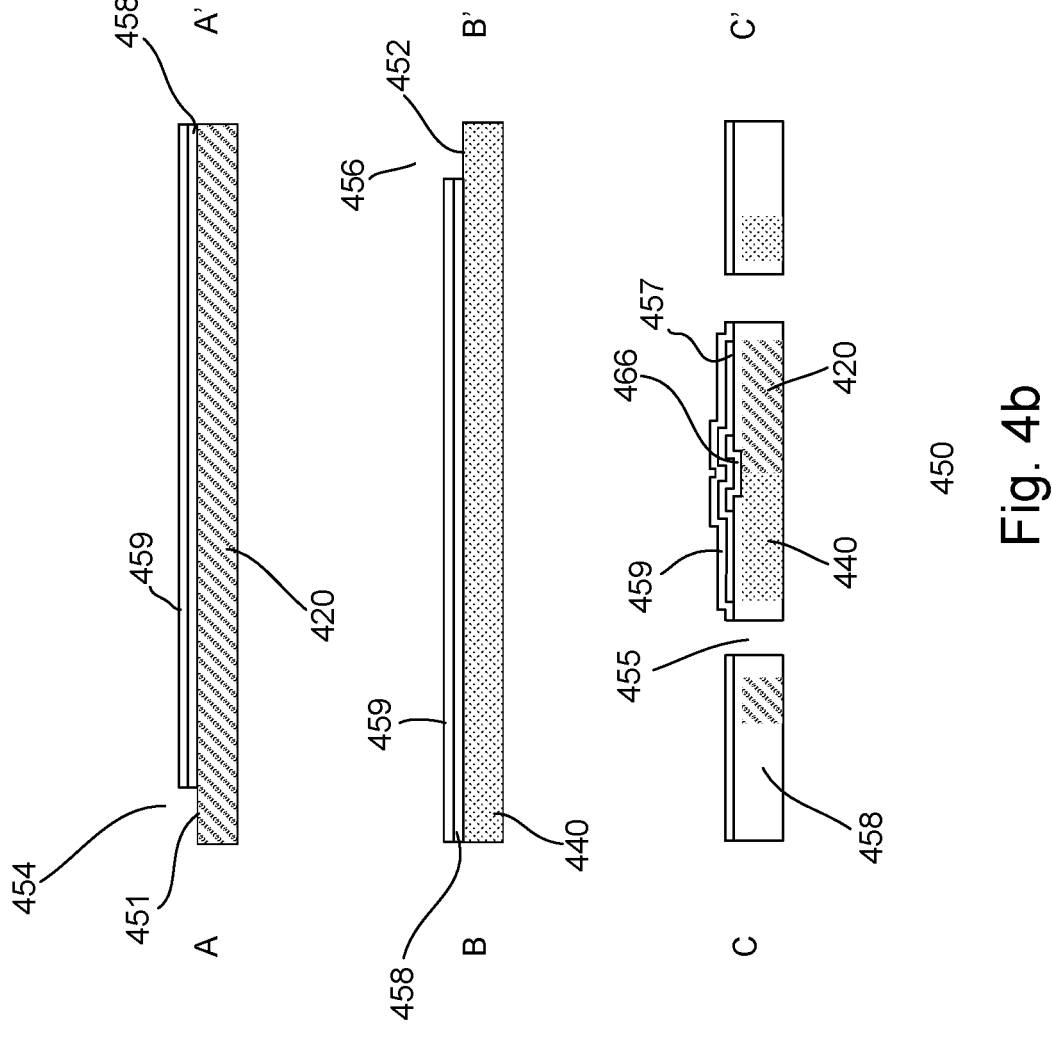

FIG. 4*a* shows a simplified top view of an embodiment of a MEMS sensor or structure 450 and FIG. 4*b* shows various cross-sectional views of the MEMS structure along A-A', B-B' and C-C'. The top view excludes the protective layer. The MEMS structure is a line structure. The line structure is a thermopile which serves as a thermoelectric IR sensor or detector. The line structure is disposed on the membrane or dielectric layer which defines the top of the lower device cavity. The line structure, in one embodiment, includes a single line unit (N=1) which has a meandering shape and occupies the surface of the membrane.

In one embodiment, the line unit includes polysilicon. Other types of line units may also be useful. For example, thermoelectric materials which are stable at high temperatures may be employed to form the line structure. Such materials may, for example, include SiGe, GaN and 2D materials, such as graphene, black phosphorus or molysulfide.

The line unit includes first and second line segments 420 and 440. A first end 451 is part of the first line segment and a second end 452 is part of the second line segment. In one embodiment, the first and second ends may serve as cold junctions of a thermopile. A first line structure terminal 454 is disposed at the first end and a second line structure terminal 456 is disposed at the second end. The terminals, for example, are part of the line unit of the line structure. The terminals serve as terminals of the MEMS structure or sensor.

In one embodiment, the first line segment is doped with first polarity type dopants and the second line segment is doped with second polarity type dopants. For example, the first line segment is heavily doped with first polarity type dopants and the second line segment is heavily doped with second polarity type dopants. The first polarity type may be p-type and the second polarity type may be n-type. Providing first polarity type which is n-type and second polarity type which is p-type may also be useful. The doping may be integrated into the implants which form the S/D regions and well contacts. Doping the line segments separately from the implants that form the S/D regions and well contacts may also be useful.

The line structure may be patterned using mask and etch techniques. For example, a photoresist is disposed on a line structure layer. The photoresist may be exposed by an exposure source through a reticle containing the desired pattern of the line structure. After development, the pattern of the reticle is transferred to the photoresist to form an etch mask. An etch is employed to pattern the line structure layer using the etch mask to form the line structure. The etch mask, for example, may be a photoresist mask. The etch, for example, is an anisotropic etch, such as a reactive ion etch (RIE). Other etch processes may also be useful. In one embodiment, the etch forms the line structure with the first and second line segments. Alternatively, the line structure may be a non-continuous line structure having, for example, first and second segments. The first and second segments may be electrically connected by a metal contact. If the line structure is integrated into the gate electrode layer, the mask used to pattern the gates may be used to pattern the line structure. Alternatively, separate mask and etch processes may be used to pattern the gates and the line structure.

As shown, the line segments are mirror images of each other. This produces line segments which are about the same length. By providing a meandering design for the line segments, efficient use of the sensor region can be achieved while producing a line structure having the desired resistance. For example, the line structure has a resistance of about 5-50 kΩ. Other resistances may also be useful.

To dope the first and second line segments, separate implants may be used. For example, a first implant using a first implant mask is used to dope the first line segment and a second implant using a second implant mask is used to dope the second line segment. In the case where doping of the line segments is integrated into the S/D implants, the implant masks may be those used for p-type and n-type S/D implants.

A line dielectric layer 458 covers the line structure, filling the gaps. The line dielectric layer provides mechanical support for the thermopile membrane. The line dielectric layer may be a self-planarizing dielectric layer, such as spin-on-glass (SOG). Other types of self-planarizing dielectric materials may also be useful. The dielectric layer may have a top surface which is about 100-400 nm above the top of the line structure. Providing a dielectric layer having other thicknesses over the top of the line structure may also be useful.

A contact 466 is provided to electrically couple the first and second segments. The contact, for example, is a metal contact, such as titanium (Ti) or aluminum (Al). Other types of contacts may also be useful. To form the contact, a contact opening is formed in the dielectric layer to expose the line structure at about the junction of the first and second segments. A metal layer is formed on the substrate and patterned, leaving the contact coupling the first and second segments. The metal layer, for example, may be titanium (Ti) or aluminum (Al) formed by sputtering, plating or evaporation. Other types of metal layers or forming techniques may also be useful. In other embodiments, the contact may be formed by a damascene technique. For example, a via opening is formed in the dielectric layer. A conductive layer is formed, filling the via opening and covering the dielectric layer. A planarizing process, such as CMP, is performed to form the metal contact in the via opening, connecting the first and second segments of the line structure.

An absorber layer 453 is formed on the substrate, covering the dielectric layer. The absorber layer may be patterned using etch and mask processes. The patterned absorber layer serves as an absorber above the line structure. In one embodiment, the absorber layer is patterned, covering a central portion of the line structure and contact, leaving the leg portions outside the central portion exposed. The absorber layer, for example, absorbs IR radiation. The absorber layer may be a TiN or NiCr layer. The absorber layer, for example, may be formed by sputtering. Other types of absorber layers may also be useful. In one embodiment, the absorber is configured to absorb most of the IR radiation. For example, the absorber may be configured to absorb greater than 85% of IR radiation having a wavelength of 8-14 μm. Absorbing other wavelengths may also be useful. As shown, the absorber layer is disposed over the contact. The absorber serves as a hot junction of the thermopile. The first end 451 of the first line structure and the second end 452 of the second line structure serve as cold junctions of the thermopile. The leg portions of the line structure uncovered by the absorber provide thermal isolation between the hot and cold junctions.

A protective layer 459 may be provided. The protective layer, for example, covers the MEMS structure. The protective layer protects the MEMS structure from subsequent processes. The protective layer, for example, is a silicon oxide layer formed by CVD. Other types of protective layers may also be useful. The protective layer may be a dielectric layer above the metal contact below the first metal level M1. Other configurations of metal layers and the protective layer may also be useful.

In one embodiment, the protective layer forms an upper portion of the first contact level of the ILD layer disposed below the BEOL dielectric layer. The protective layer, line dielectric layer and membrane forming the top of the cavity are patterned to form openings 455, separating the legs from the central portion of the line structure. The openings provide access to the cavity. This enables removal of the sacrificial fill in the cavity, releasing the line structure. In one embodiment, one of the metal layers in the BEOL dielectric may be patterned to serve as a line structure release etch mask for patterning the various layers to form openings 455 to release the line structure. For example, the metal layer may be M1 or M2. Other metal layers may also be used to serve as an etch mask for the release etch process.

Figure 4C:
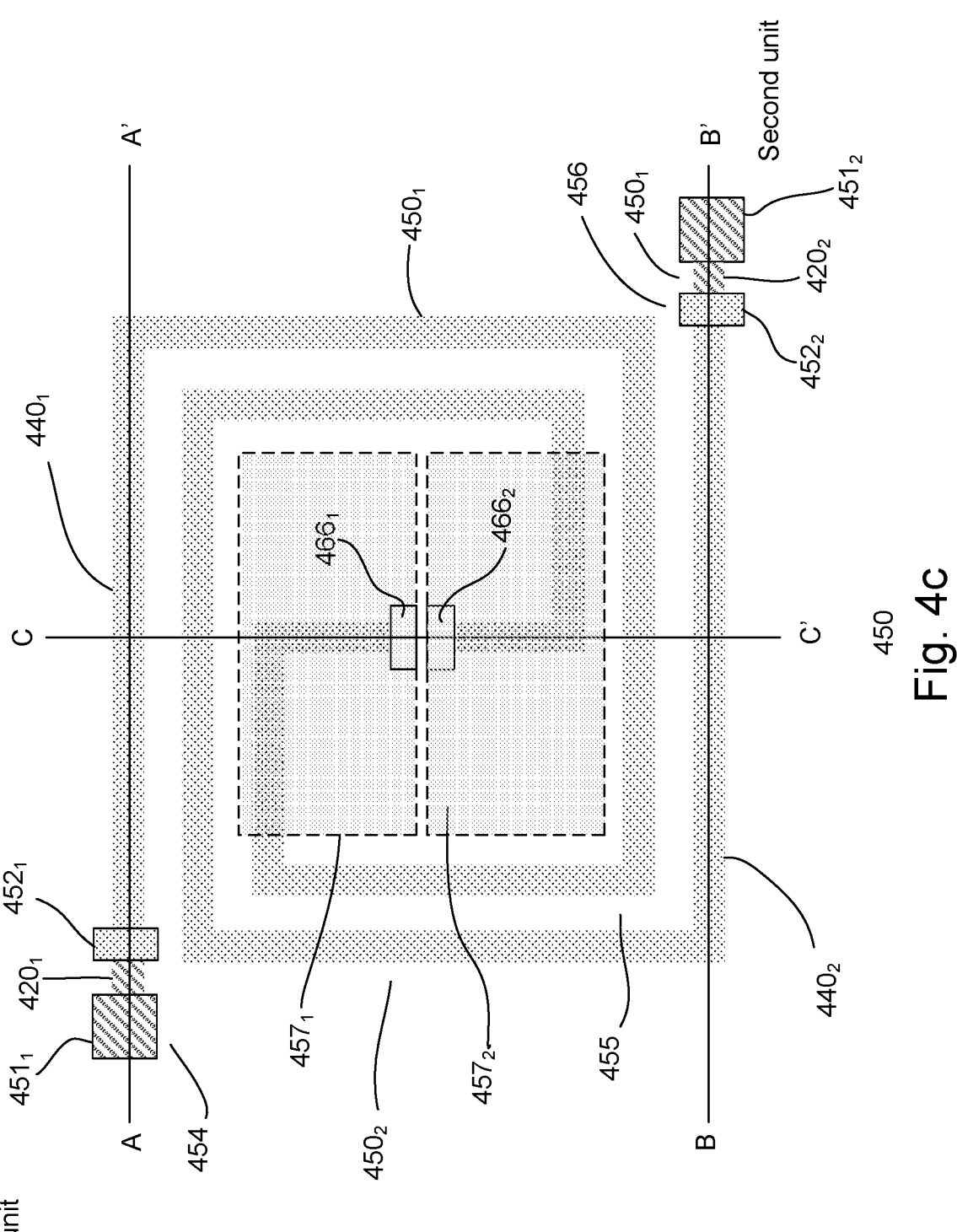
Figure 4D:
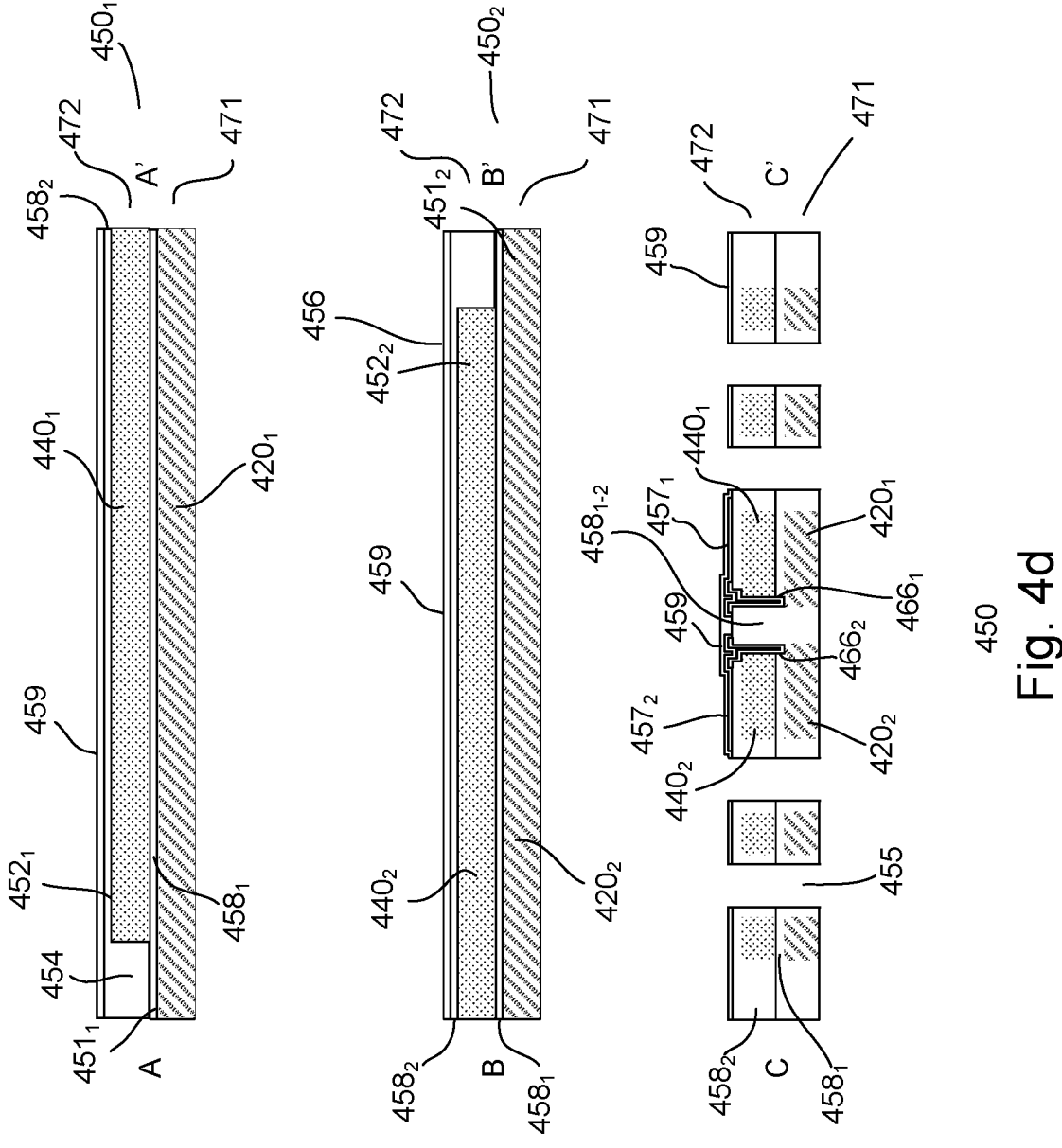

FIG. 4c shows a top view of another embodiment a MEMS structure 450 and FIG. 4d shows cross-sectional views of the MEMS structure based on the top view of the MEMS structure of FIG. 4c. The cross-sectional views are along A-A', B-B' and C-C'. The MEMS structure is a line structure forming a thermopile which serves as a thermo-electric IR sensor. The top view excludes the protective layer protecting the line structure. The line structure is similar to that described in FIGS. 4a-4b. Common elements may not be described or described in detail. The line structure is disposed on the membrane which structures the cavity.

The line structure has more meanderings or turns to increase the length of the segments which occupy the surface of the membrane as compared to FIGS. 4a-4b. This increases the resistance of the line structure. Other designs for the line segments to increase the length or to tailor the lengths of the segments to achieve the desired resistance may also be useful.

In one embodiment, the MEMS structure is a multi-line unit line structure with N number of line units that are coupled in series to form a thermoelectric IR sensor. As shown, the MEMS structure includes first and second line units $450_1$ and $450_2$ (e.g., N=2). Providing other numbers of line units for the multi-line unit line structure may also be useful. For example, a multi-line unit line structure may have 2-4 (N=2-4) line units. In one embodiment, a multi-line unit line structure includes an even number of line units, such as N=2M, where M is a whole number. Preferably, M is equal to 1-2 (N=2 and 4). Providing odd number of line units for a multi-line unit line structure may also be useful. Other numbers of line units may also be useful.

As discussed, the line structure shown includes first and second line units. In one embodiment, a line unit of the multi-line unit line structure is a stacked line unit. The first and second stacked line units may be disposed adjacent to each other on the dielectric layer within the sensor region. As shown, a center of the sensor region serves as contact regions for the first and second contacts $466_1$ and $466_2$ of the first and second line units $450_1$ and $450_2$. The line units at the contact region are separated by dielectric layers $458_{1-2}$.

A stacked line unit includes a first segment ($420_1$ or $420_2$) disposed in a first line level 471 and a second line segment ($440_1$ or $440_2$) disposed in a second line level 472. The first and second line levels may be separated by a first dielectric layer $458_1$. For example, the second line segment of a line unit in the second line level is overlaid over the first line segment of the line unit in the first line level. The first and second line segments of a line unit are separated by the first interline level dielectric layer $458_1$. The gaps of the line segments are filled by the first and second interline level dielectric layers $458_{1-2}$.

A contact ($466_1$ or $466_2$) connects the first line segment in the first line level to the second line segment in the second line level. The first and second contacts are formed in the first and second interline level dielectric layers. For example, the contacts are disposed in contact vias. A contact via for a line unit, for example, may overlap the first and second line segments, exposing them. A contact, such as Ti or Al, lines the contact via, connecting the exposed first and second line segments.

In one embodiment, the first line segments of the line units are doped with first polarity type dopants and the second line segments of the line units are doped with second polarity type dopants. For example, the first segments of the line units in the first level are doped with first polarity type dopants and the second segments of the line units in the second level are doped with second polarity type dopants. The first polarity type may be n-type and the second polarity type may be p-type. Other configurations of doped line segments may also be useful.

As shown, the first line unit has first and second ends $451_1$ and $452_1$ which are located at a diagonally opposite corner of the sensor region than the first and second ends $451_2$ and $452_2$ of the second line unit. The line units each meander throughout the sensor region from opposite diagonal corners towards the contact region. Other configurations of or meandering patterns for the line units may also be useful. For example, the first stacked line unit may occupy about one-half of the sensor region and the second stacked line unit may occupy about the other half of the sensor region.

First and second absorber layers $457_1$ and $457_2$ are disposed on the substrate over the second line dielectric layer $458_2$. As shown, the layers cover a central portion of the sensor region, including the contact regions of the first and second contacts. For example, the first absorber covers the central portion of the sensor region and first contact region of the first line unit and the second absorber covers the central portion of the sensor region and the second contact region. The first and second absorber layers, since they are conductive, are distinct absorber layers.

The absorber layers, for example, absorb IR radiation. The absorber layers may be TiN or NiCr layers. Other types of absorber layers may also be useful. In one embodiment, the absorber is configured to absorb most of the IR radiation. For example, the absorber may be configured to absorb greater than 85% of IR radiation having a wavelength of 8-14 µm. Absorbing other wavelengths may also be useful. As shown, the absorber layer is disposed over the contact. The absorber serves as a hot junction of the thermopile. The first ends $451_{1-2}$ of the first line segments of the line units and the second ends $452_{1-2}$ of the second line segments of the line units serve as cold junctions of the thermopile. The leg portions of the line segments uncovered by the absorber provide thermal isolation between the hot and cold junctions.

The process for forming the stacked line structure may include, for example, forming a first line segment layer on the substrate, including in the sensor region over the sensor membrane dielectric layer and over the cavity. In one embodiment, a polysilicon layer is formed on the substrate by CVD. The first line segment layer is patterned to form distinct first line segments $420_1$ and $420_2$ of the first and second line units. Patterning may be achieved using mask and etch techniques, such as a resist mask and RIE. The first segments may be doped with first polarity type dopants, such as n-type dopants. Doping the segments may be achieved by selectively implanting first polarity type dopants using an implant mask. A first interlevel line dielectric layer $758_1$ may be formed on the substrate. The first interlevel dielectric layer lines the line segments and surface of the sensor membrane layer. The first interlevel dielectric layer, for example, lines the line segments without filling the gaps therebetween. The first interlevel dielectric layer may be a silicon oxide layer formed by CVD. Providing a SOG dielectric layer may also be useful.

A second line segment layer, such as polysilicon is formed on the first interlevel line dielectric layer by CVD and patterned to form distinct second line segments $440_1$ and $440_2$ of the first and second line units using mask and etch techniques. The second line segments, for example, overlay the first line segments and are separated by the first interlevel line dielectric layer. The second line segments are doped with second polarity type dopants, such as p-type dopants. The second line segments may be doped by implanting second polarity type dopants using an implant mask.

A second interlevel line dielectric liner $458_2$ is formed on the substrate. In one embodiment, the second interlevel line dielectric layer may be a SOG layer, filling the gaps and forming a planar top surface over the second line segments. First and second contact vias are formed in the interlevel line dielectric layers in the contact region. The first contact via exposes first and second segments of the first line unit and the second contact via exposes the first and second segments of the second line unit. The contact vias may be formed by mask and etch techniques. A contact layer, such as Ti or Al is deposited on the substrate. Other types of metal contact layers may also be useful. The contact layer, for example, may be deposited by sputtering and lines the second interlevel line dielectric layer and contact vias. In one embodiment, the contact layer lines the contact vias without filling them. The contact layer is patterned by mask and etch techniques to form first and second contacts $466_1$ and $466_2$ of the first and second line units. In other embodiment, a metal contact may be formed, filling the via openings. A polishing process, such as CMP, may be performed to remove excess metal material, leaving contacts in the contact vias.

An absorber layer is formed on the substrate, covering the second interlevel line dielectric layer and contacts. The absorber layer, for example, is a conductive layer formed by sputtering. The absorber layer is patterned to form distinct first and second absorber layers $457_1$ and $457_2$ in the central portion of the sensor region using mask and etch techniques. In the case the contacts line the vias without filling them, the absorber layer may serve to fill the contact vias over the contacts.

A protective layer 459 may be provided. The protective layer, for example, covers the MEMS structure. The protective layer protects the MEMS structure from subsequent processes. The protective layer, for example, is a silicon oxide layer formed by CVD. Other types of protective layers may also be useful.

The protective layer, line dielectric layer and membrane forming the top of the cavity are patterned to form openings 455, separating the legs from the central portion of the line structure. For example, a patterning process is performed to release the line units of the line structure. The openings provide access to the cavity. This enables removal of the sacrificial fill in the cavity, releasing the line structure. The mask of the patterning process, in one embodiment, may be served by a metal layer of the BEOL dielectric. For example, the mask may be served by M1 or M2 of the BEOL dielectric. In other embodiments, the mask may be a patterned resist mask.

As discussed, the first and second line units $450_1$ and $450_2$ are coupled in series. In one embodiment, the second end $452_1$ of the first line unit is coupled to the first end $451_2$ of the second line unit. The series connection in the line unit may be facilitated by via contacts in the interlevel line dielectric layers which are coupled to the second end of the first line unit and the first end of the second line unit. A metal line may be provided in the BEOL dielectric layer, such as in M1, to connect the via contacts. Other configurations of providing the series connection of the line units may also be useful.

As described, the line segments of the line units are disposed in the same line level and are doped with the same dopant type. This allows the line segments of the line units to be doped using a single implant process (e.g., same implant process using a single implant mask). In alternative embodiments, the line segments of the line units in the same line level may be doped with opposite polarity type dopants. In such cases, the line segments are doped by separate implant processes (e.g., different implant processes using different implant masks). As such, providing line segments of the line units which have the same doping type in the same line level reduces the need to use additional implant masks. Other configurations of line segments for the line units may also be useful.

As described, the MEMS structure includes 2 line units which are stacked and coupled in series. Stacking other numbers of line units which are coupled in series may also be useful. Preferably, the line structures of the stack line units have similar designs. However, it is understood that this is not necessary. In addition, the line units or structures may have layouts other than that described in FIGS. 4a-4d.

Figure 4E:
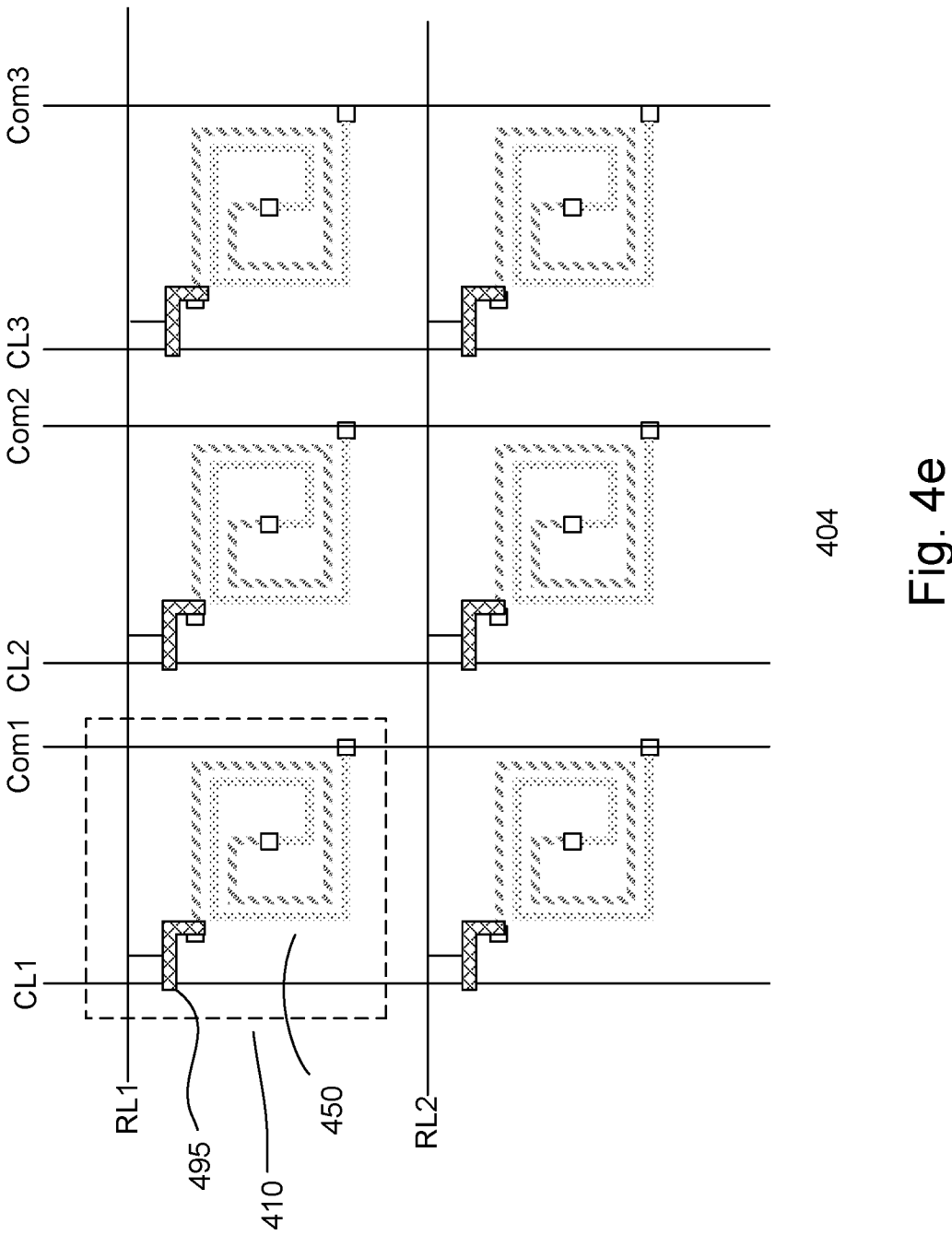
FIG. 4e shows an exemplary layout of a 2×3 sensor arrays.

FIG. 4e shows a sensor array 404. The sensor array includes a plurality of sensor cells 410. A sensor cell includes a switch coupled to a MEMS structure, such as a line structure or structures as described in FIGS. 4a-4d. Common elements may not be described or described in detail.

The sensor cells are configured to form an array having Y rows and Z columns. A sensor cell corresponds to a pixel of the sensor array. The sensor cells are coupled in a row direction by row lines ($RL_m$) and in the column direction by column lines ($CL_n$). A sensor cell may correspond to a pixel. Additionally, common lines (Coms) are also used to couple the sensor cells in each column. For example, each column of sensors is coupled to a respective Com (e.g., $Com_1$, $Com_2$ or $Com_3$). As shown, the array includes a 2×3 array (M=2 and N=3). For example, the sensor cells are arranged in 2 rows ($RL_1$ and $RL_2$) and 3 columns ($CL_1$, $CL_2$ and $CL_3$). Other sized arrays may also be useful. For example, the sensor array may be a 32×32 or a 80×62 array.

The pixels of the sensor array may include a plurality of sensors arranged in a matrix on the substrate. For example, each pixel may include a sensor region and a CMOS switching or connection region. The sensor regions are disposed in, for example, a sensor array region of the substrate. For example, the sensor array region includes a plurality of sensor regions corresponding to sensor pixels.

In one embodiment, a first terminal of the MEMS structure of a sensor cell is coupled to the switch 495 while a second terminal is coupled to a common line (Com). As shown, each column of sensor cells is coupled to a respective Com (e.g., $Com_1$, $Com_2$, and $Com_3$). A switch may be a transistor having first and second S/D terminals and a gate or control terminal. For example, a first S/D terminal of the switch is coupled to the first terminal of the MEMS structure and the second S/D terminal is coupled to a CL. The RL is coupled to a gate or control terminal of the switch. In one embodiment, the n-type terminal of the sensor cell is coupled to Com and the p-type terminal of the sensor cell is coupled to CL. Other configurations of coupling the sensor cell to CL and Com may also be useful. An RL can be selected to select a row of sensor cells. A CL is activated to select a column of sensor cells. The selected cell is the intersection of the selected RL and selected CL. The interconnections between the CMOS components and sensor pixels may be achieved through the ILD and IMD levels of the BEOL dielectric.

In one embodiment, the sensor array is configured to read out a row of sensor cells or pixels. For example, the pixels of the array are read out one row at a time. In one embodiment, an RL of the array is selected. This selects a row of pixels. CLs are then selected, causing the pixels of the selected RL to be readout. In one embodiment, the array is configured to read out one row of pixels at a time, starting from the first row to the last. The information readout is stored in memory. An image or one frame of the imager will be produced once all pixels are read out or once all rows have been scanned through. For example, information stored in memory read out from the pixels may be reconstructed to form an image.

In the case of the 2×3 array in FIG. 4e, scanning the pixels to form an image may include selecting $RL_1$ (the first row) to select the pixels coupled to $RL_1$. After $RL_1$ is selected, $CL_1$, $CL_2$ and $CL_3$ are selected, causing the pixels coupled to $RL_1$ to be readout. The information of the pixels coupled to $RL_1$ is stored in memory. The next or second row $RL_2$ is selected to select the pixels of $RL_2$. After $RL_2$ is selected, $CL_1$, $CL_2$ and $CL_3$ are selected, causing the pixels coupled to $RL_2$ to be readout. The information of the pixels coupled to $RL_2$ is stored in memory. Since $RL_2$ is the final row of the array, the information of the pixels is reconstructed to form an image or a frame of the imager. Numerous frames may be collected by repeating the sensing, readout and reconstruction process. For example, an image or a frame is time-dependent.

Select logic and output logic components may be employed to select the cell for outputting information contained. The logic components may be CMOS transistors or components in the CMOS region of the device. Other logic components, including memory and reconstruction logic components, may be included to store and reconstruct information to form an image or images. In one embodiment, the memory and reconstruction logic components may be off-chip logic. Providing these logic components as on-chip logic components or a combination of on-chip or off-chip components may also be useful.

Figure 5:
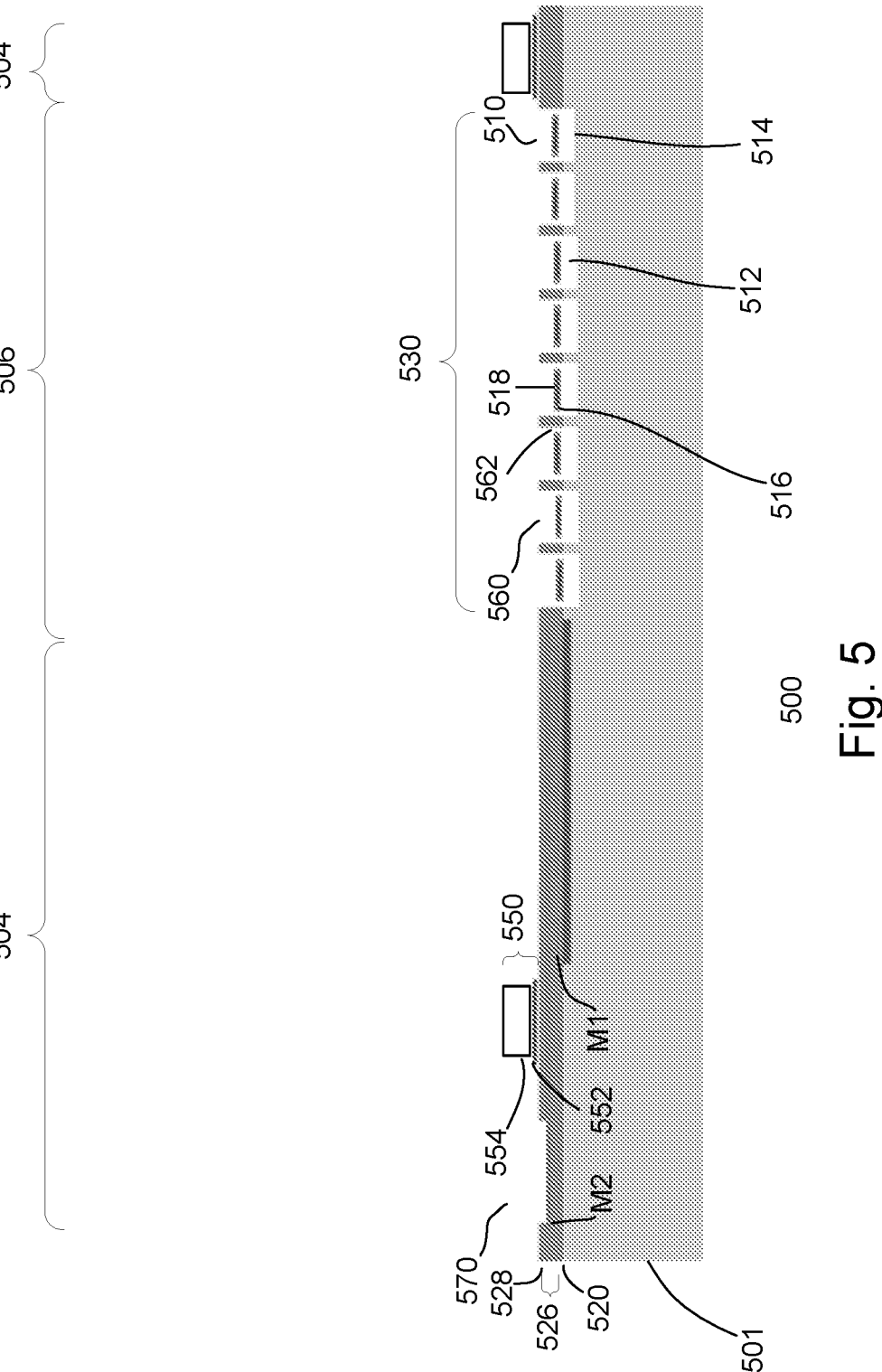
FIG. 5 shows an exemplary embodiment of a device before encapsulation.

FIG. 5 show a simplified cross-sectional view of an embodiment of a device 500 before encapsulation with a cap wafer. The device, for example, is similar to device 200 described in FIGS. 2a-f. Common elements may not be described or described in detail.

A substrate 501 is provided. The substrate, for example, may be a semiconductor substrate, such as a silicon substrate. Other types of substrates or wafers may also be useful. For example, the substrate may be a silicon germanium, germanium, a gallium arsenide, or a crystal-on-insulator (COI) such as silicon-on-insulator (SOI) substrate. The substrate may be a doped substrate. For example, the substrate can be lightly doped with p-type dopants. Providing a substrate with other types of dopants or dopant concentrations, as well as an undoped substrate, may also be useful.

The substrate, as shown, is prepared with first and second device regions 504 and 506. The first region is a CMOS region while the second region is a MEMS region. The CMOS region is configured to include CMOS components and the MEMS region is configured to include one or more MEMS components. The CMOS region, as shown, includes CMOS device regions. The CMOS device regions may include CMOS device regions for MOS transistors with different polarity types, for example, first and second polarity type transistors. Providing other numbers of CMOS device regions or other types of transistors may also be useful. In one embodiment, the CMOS region surrounds the MEMS region. A bond region of the CMOS region on which a cap is bonded surrounds one or more sides of the MEMS region.

As for the MEMS region, as shown, it includes a plurality of MEMS device regions 530. A MEMS device region is processed to include a MEMS structure or sensor 510. In one embodiment the MEMS structure is an IR sensor, as already described. Other types of IR sensors or MEMS structures may also be useful. Providing the MEMS region with other numbers of MEMS device regions may also be useful. For example, the MEMS region may include a sensor array with M rows and N columns of MEMS sensors. Typical array size may be, for example, a 32×32 array or a 80×64 array. Other array sizes may also be useful. The size of the array may depend on, for example, the desired image resolution. In some cases, the array may be a line of sensors, such as a M×1 or 1×N array. Providing the MEMS region with a single MEMS sensor may also be useful. A sensor may correspond to a pixel of an array of pixels of an image. In addition, the sensor array may also include one or more blind sensors corresponding to one or more blind pixels. Blind pixels, for example, are used for calibration purposes.

The substrate is processed to form lower device cavities for the MEMS device region. For example, a lower device cavity 512 is formed in the substrate for each MEMS device region. The device cavities may be formed by etching the substrate using a mask and etch process. A mask and etch process may employ etching the substrate using a patterned mask with openings corresponding to the lower device cavities. The mask may be a hard mask, such as silicon oxide mask or a soft mask, such as a photoresist mask. The etch, for example, is an anisotropic etch, such as a reactive ion etch (RIE), which etches the substrate to form the lower device cavities.

As shown, an IR reflector 514 is formed at the bottom of a lower device cavity. For example, IR reflectors are formed on the bottom of the lower device cavities. The reflector can be a conductive reflector, for example, a metal silicide reflector, or a doped reflector layer. The metal silicide reflector may be a titanium silicide ($TiSi_x$), a tungsten silicide ($WSi_x$) or an aluminum silicide ($AlSi_x$) reflector. Any n-type or p-type dopants can be implanted to produce the doped reflector. Alternatively, a non-conductive reflector, such as a photonic crystal reflector, may be provided at the bottom of the cavity. A non-conductive reflector may include a grating pattern configured to reflect incident IR radiation and can be formed via an etching process. Forming other types of reflectors using other techniques may also be useful.

After forming the reflector, a reflector protective liner (not shown) is formed on the substrate by, for example, chemical vapor deposition (CVD). The protective liner lines the substrate as well as the sides and bottom of the first and second lower device cavities, covering the first and second reflectors. For example, the protective liner serves to protect the reflector from etchants, such as $XeF_2$, used in a release process to form the lower device cavities. The protective liner, in one embodiment, is a silicon oxide liner. Other types of protective liners may also be used.

A sacrificial layer covers the substrate and fills the lower device cavities. The sacrificial layer can be removed selectively without damaging the protective liner. In one embodiment, the sacrificial layer is an amorphous silicon layer. Other types of sacrificial materials may also be useful to serve as the sacrificial layer. The sacrificial layer may be formed by CVD and excess sacrificial material is removed by a planarizing process such as a chemical mechanical polish (CMP). The CMP also forms a planar top surface on the substrate and sacrificial layer in the cavity. Other types of planarizing processes may also be useful. For example, etch back processes using mask or masks may also be useful.

A dielectric layer 516 is formed on the substrate. The dielectric may be a silicon oxide layer. Other types of dielectric layer may also be formed. The dielectric layer is patterned, leaving it remaining over the MEMS region. For example, the dielectric layer covers the lower device cavities, protecting the MEMS region while the CMOS region is processed. The dielectric layer also defines a top of the lower device cavities and serves as membranes or at least a part of the membranes for MEMS sensors. The dielectric layer may be formed by CVD and patterned using mask and etch processes.

As for the CMOS region, front-end-of-line (FEOL) processing is performed on the substrate. For example, different polarity types of transistors are formed. A transistor may be formed to include a device well, a gate, and also source/drain (S/D) regions. Other types of components may also be useful to form the transistor. Techniques such as ion implantation and patterning by mask, for example, a photoresist implant mask, are employed to form the transistors. The CMOS region may also include metal silicide contacts formed on the S/D regions, gates and well contacts. A metal layer, such as Ti, W or Al, may be deposited on the substrate and annealed to cause a reaction between the metal and silicon to form metal silicide contacts. Unreacted metal is removed by, for example, a wet etch, leaving the metal silicide contacts.

Isolation regions may be formed on the substrate to isolate the different regions of the substrate and/or provide for well contact regions. The isolation regions, for example, are field oxide (FOX) isolation regions. The FOX regions may be formed by selective thermal oxidation of the substrate using a nitride mask. Other types of isolation regions may also be useful. For example, the isolation regions may be shallow trench isolation (STI) regions which include trenches filled with dielectric material, such as silicon oxide.

In one embodiment, MEM structures are formed simultaneously with the processing of the CMOS regions. For example, a gate electrode layer is patterned to form gates in the transistor regions as well as the MEMS structures in the MEMS device regions. The MEMS structures may be configured to form a plurality of IR sensors in a sensor array. The MEMS structures may be thermopile structures which serve as thermoelectric sensors, as described in FIGS. 4a-e. Other types of MEMS structures may also be useful.

In the process of forming the MEMS structures, one or more dielectric layers may be formed over the MEMS region and patterned to serve as the membrane 518. The additional layer or layers may be part of the process or intentionally added. As shown, the dielectric layers may be patterned to form individual membranes for each MEMS device region. Other configurations of the membrane may also be useful. For example, the membrane is a continuous membrane for the MEMS device region.

In one embodiment, the implants to form the S/D regions are also employed to form the doped segments of the line structure of the MEMS structure. For example, the p-type implant to form p-type S/D regions also forms the p-type segment of the line structure and the n-type implant to form n-type S/D regions also forms the n-type segment of the line structure. Forming the doped segments of the line structure using separate implants from those used to form S/D regions may also be useful.

In alternative embodiments, the MEMS structures are formed with a separate process. For example, the MEMS structures may be formed before or after forming the gates. A hard mask layer, such as a dielectric layer, is used to protect the CMOS region while the MEMS region is processed. In such a case, a MEMS structure layer is formed on the substrate and patterned to form the line structures. The MEMS structure layer may be polysilicon. Other types of MEMS structure layers may also be useful. For example, the MEMS structure layer may be silicon germanium (SiGe), gallium nitride (GaN) or a 2D material, such as graphene, black phosphorus or molysulfide.

In other embodiments, stacked line units may be formed in the MEMS region, as previously discussed. Forming the stacked line units may be separated from the processes to form CMOS components (CMOS processes). Partially or fully incorporating the CMOS processes for forming the stacked line units may also be useful. This, for example, may depend on the CMOS process employed. Other configuration of forming the CMOS components and MEMS structure may also be useful.

As shown, an ILD level 520 is formed over the substrate and covers the CMOS and MEMS regions. In one embodiment, the ILD level may include first and second dielectric layers. The layers may be formed by CVD followed by a polishing process to produce a planar surface. The first dielectric layer serves as part of the first via or contact level of the ILD level, and may include contact plugs. For example, conductive contact plugs, such as tungsten plugs, are coupled to various terminals in the CMOS and MEMS regions such as the S/D regions, gates and well contacts. Providing thermocouple contact plugs for coupling the first and second segments of a line structure may also be useful. Metals such as titanium (Ti) or aluminum (Al) may be used to form the contact layer. Other types of contact plugs may also be useful. The contact plugs, for example, are formed by a single damascene technique. Forming contact plugs using other techniques may also be useful.

An absorber is deposited between the first and second dielectric layers. For example, the absorber layer covers the dielectric layer and the thermo-couplers. In one embodiment, the absorber layer is a TiN or NiCr absorber layer. Other types of absorber layers may also be useful. The absorber layer may be formed by, for example, sputtering. The absorber layer may be formed using other techniques. In one embodiment, for example, the thickness of the absorber is adjusted to form a layer having a sheet resistance of about 377 Ohm/sq. Providing any other thicknesses and sheet resistance for the absorber may also be useful. The absorber layer is patterned to form absorbers over the thermopile structures in the MEMS regions. Patterning the absorber may be achieved by mask and etch techniques.

In one embodiment, the BEOL dielectric 526 with IMD levels is formed over the ILD level. An IMD level includes a via dielectric level and a metal dielectric level. A first IMD level, as well as additional IMD levels, are subsequently formed above a first metal level. Any numbers of IMD levels may be provided for the BEOL dielectric. As shown, the BEOL dielectric includes metal levels M1 and M2. The metal level M1 is the bottom metal layer and the metal level M2 is the top metal layer. As discussed, a via dielectric level includes via contacts and a metal dielectric level includes metal lines. The metal lines and vias form interconnections of the device.

In one embodiment, the BEOL dielectric is patterned to form BE cavities 560 in the MEMS device regions to expose the sensor array. For example, the ILD, BEOL dielectric and passivation layer (collectively may be referred to as BE dielectric or BE dielectric layers) over the MEMS region are removed. The opening in the BE dielectric, for example, forms a BE cavity. In one embodiment, the BE dielectric over the MEMS region is patterned to be disposed over the cavity walls, forming individual BE cavities over the substrate cavities. A BE cavity may be a rectangular-shaped cavity. As shown, a BE cavity includes a vertical sidewall. Providing a BE cavity with non-vertical sidewalls may also be useful. The BE cavities form lower portions of an upper sensor cavity. Other configurations of BE cavities may also be useful.

The uppermost metal level includes bond pads and serves as a pad level. A passivation layer 528 is formed over the uppermost metal or pad level. The passivation layer may be a single layer or a passivation stack having multiple passivation layers. For example, the passivation stack may include silicon oxide and silicon nitride layers. Other types of passivation layers may also be useful. The passivation layer may be formed by CVD. Bond openings 570 are provided in the periphery of a cap to expose the bond pads below. The bond pads, for example, are part of the pad lines. An etch process may be performed on the passivation layer to expose the bond pads. The bond pads provide external access to the internal components of the device. For example, input, output and power signals may be provided via the bond pads. Bond pads are provided in the periphery of the device, for example outside of the periphery of the cap. As shown, bond pads are provided on one side of the device which is the opposite side of the sensor region. Bond pads may also be provided on one or more of the other sides of the device.

A bottom or device sealing ring 550 is formed over the substrate and provided at the device's periphery or device bonding region. The device bonding region with the device sealing ring 550 surrounds the CMOS and MEMS region. As shown, the bonding region is a rectangular shaped region which surrounds the CMOS and MEMS regions. For example, the device sealing ring is formed surrounding the device.

The device sealing ring facilitates bonding of the device wafer to another sealing ring, for example, a cap sealing ring, on the cap wafer so that the device wafer is hermetically sealed by the cap. In one embodiment, the MEMS region is completely covered by the cap. The CMOS region is also covered by the cap, except for a peripheral portion which is uncovered for bond openings. The bond openings expose bond pads for providing external connections to the device. The cap, for example, leaves a peripheral portion of one side of the device exposed. Leaving peripheral portions of more than once side of the device exposed may also be useful. In one embodiment, the device sealing ring is a stacked device sealing ring including more than one device sealing level. As shown, 2 device sealing levels are provided. Other numbers of device sealing levels may also be useful.

A first device sealing level 552 is deposited over the substrate, covering the passivation layer. For example, a first device sealing layer of the device sealing ring is disposed over the passivation level to form a bottom-most layer of the device sealing ring. The first device sealing layer may be formed by, for example, sputtering and patterning using mask and etch processes. Other techniques may also be useful. Repeated rounds of deposition and patterning by, for example, a lift-off process may be employed for forming subsequent layers to generate the first level of the sealing ring. The first device sealing level may include one or more device sealing layers using same or different materials. A device sealing layer can be a metal, a metal alloy, a ceramics, or a dielectric layer. For example, metals or metal alloys such as aluminum, gold, copper, silver, titanium, germanium or tin may be used to form the first metal or metal alloy layer. Providing silicon dioxide, silicon nitride, titanium nitride, platinum or tungsten to form a first dielectric layer of the stacked sealing ring may also be useful.

As shown, the first device sealing level forms a planar top surface The first device sealing level is patterned to remain surrounding the device bond region of the device wafer while exposing a portion of the passivation level. The device bonding region facilitates bonding the cap to the device wafer. For example, the device bonding region is aligned and mated with a corresponding cap bonding region of the cap wafer for bonding the cap to the device. The bonding region surrounds the MEMS region completely. The CMOS region is also surrounded by the bonding region except for a periphery portion which is uncovered for bond openings.

A second device sealing level 554 of the device sealing ring is formed over the first device sealing level. For example, the second device sealing level forms the upper-most level of the device sealing ring. The second device sealing level is in direct contact with another sealing ring (cap sealing ring) on the cap wafer during the bonding process. For example, during bonding, the second device sealing level (uppermost level) of the device sealing ring mates with a second cap sealing level (bottom-most level) of the cap sealing ring. A first device sealing layer of the second device sealing level is deposited over the last layer of the first device sealing level, covering both the first device sealing level as well as the substrate. A lift-off process may be employed to form the first device sealing layer of the second device sealing level. Providing other techniques may also be useful. In one embodiment, a device sealing layer of the second device sealing level can be a metal, a metal alloy or a dielectric layer. For example, metals or metal alloys such as aluminum, gold, copper, silver, titanium, germanium or tin may be used to form the first metal or metal alloy layer. Providing silicon dioxide, silicon nitride, titanium nitride, platinum or tungsten to form a dielectric layer of the second level may also be useful.

In one embodiment, the second device sealing level may include one or more layers. Subsequent layers of the second device sealing level can be formed using similar methods as the first sealing device level. Patterning of the second device sealing level leaves a portion of the sealing level surrounding the device bond region. For example, the first and second levels of the device sealing ring form the stacked sealing ring around the device bonding region which bonds the device wafer to the cap.

In one embodiment, support columns (not shown) with device column portions are disposed on the dielectric layer in the CMOS region. In one embodiment, the device column portions are disposed outside of the MEMS region. For example, the device column portions of support columns are located in the CMOS region. The support columns serve to prevent or reduce the cap from bending during the bonding process, which may lead to the cap contacting the BEOL dielectric, causing damage to the interconnects therein. The device column portions of support columns (not shown) may also be formed during the same process as forming the device sealing rings. In such cases, the device column portions are identical to the device sealing rings on the device wafers. For example, the portions of the support columns form bonds, similar to the sealing rings during WLVP. Unlike the sealing rings, in some embodiments, the device portions of the support columns need not necessary form bonds. As such, they can be formed of different types of materials which do not form a bond during WLVP. In other embodiments, a device wafer with no device column portions may also be provided.

FIGS. 6a-h show simplified cross-sectional views of an embodiment of a process for forming a cap wafer 600. The cap wafer, for example, is similar to the cap described in FIGS. 2a-f and 3a-h. Common elements may not be described or described in detail.

Figure 6A:
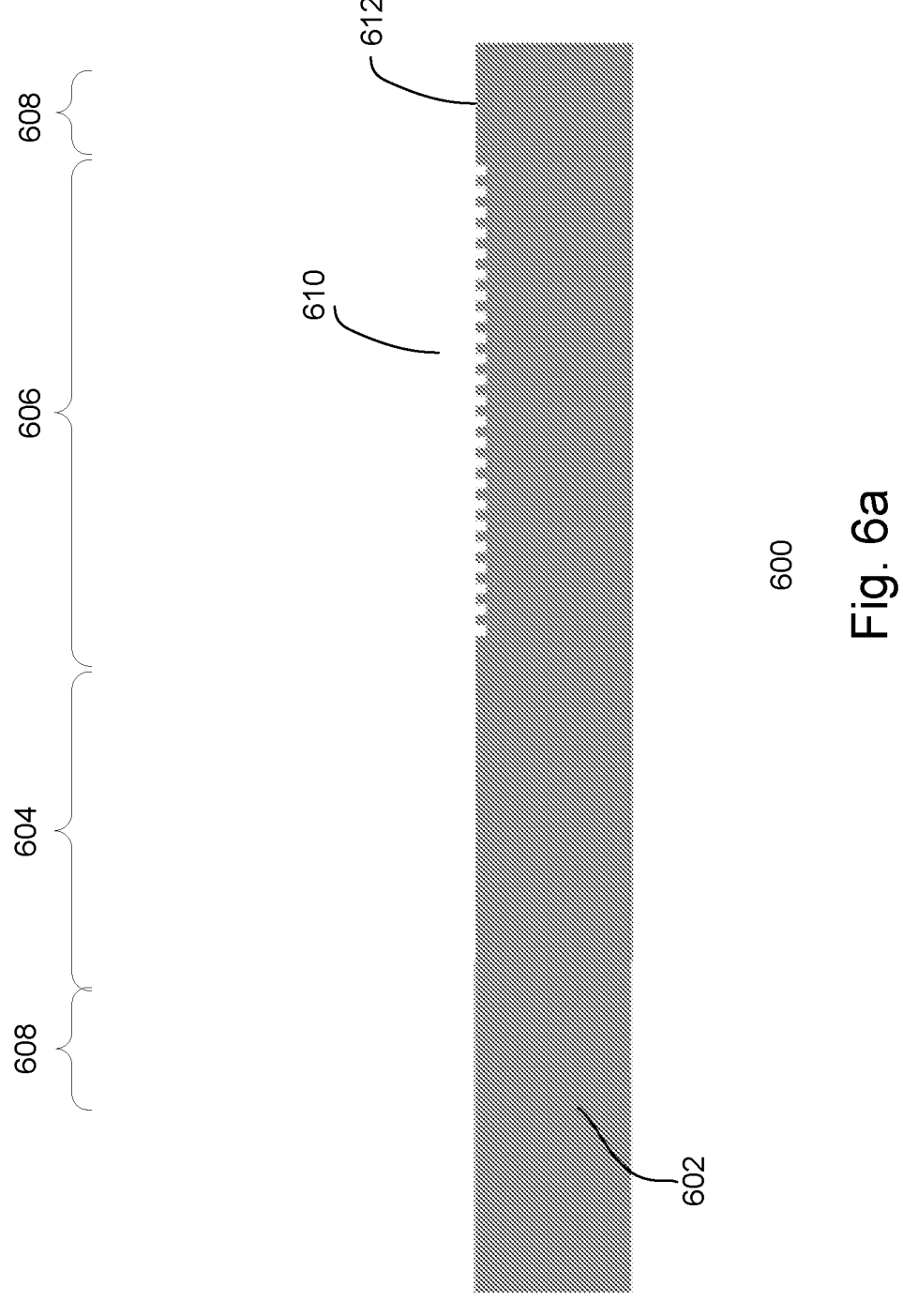
FIGS. 6a-h show simplified cross-sectional views of an exemplary process for forming a cap wafer.

Referring to FIG. 6a, a substrate 602 is provided. The substrate, for example, may be a part of a wafer on which caps corresponding to individual devices on another wafer are formed. A cap wafer with processed caps is bonded to another wafer with the devices, encapsulating the devices at the wafer level in parallel and singulated into individual dies.

The substrate, may be a substrate which is transparent to infrared radiation. For example, the cap is formed of a substrate capable of transmitting infrared radiation to the sensor. A lightly doped substrate or wafer with high resistance may be used to form the cap. Such substrates may include float zone (FZ), magnetic czochralski (M-Cz) or advanced magnetic czochralski (AM-Cz) substrates or wafers. Other types of wafers with low impurity concentration and high resistance may also be useful. In one embodiment, the cap is a double-sided polished wafer. For example, the cap is polished on both front and back sides of the wafer. This provides a thinner wafer with a more planar surface for better infrared radiation transmission.

The cap 600, as shown, is prepared with a getter region 604, an anti-reflective region 606, and a cap bonding region 608. The cap bonding region surrounds the CMOS and MEMS region of the device wafer after cap encapsulation. The anti-reflective region 606 facilitates transmission of infrared radiation through the cap. As shown, a top surface pattern 610 is provided on an outer (top) surface 612 of the cap at the anti-reflective region. In one embodiment, the top surface pattern on the cap wafer is disposed to be aligned with the corresponding MEMS regions on the device wafer.

A mask and etch process can be employed to form the top surface pattern. A mask and etch process may include etching the substrate using a patterned mask with openings corresponding to a designated pattern. The mask may be a hard mask, such as silicon oxide mask or a soft mask, such as a photoresist mask. The etch, for example, is an anisotropic etch, such as a reactive ion etch (RIE), which etches the substrate at the top surface of the cap wafer to form the surface patterns. Other techniques for forming the surface pattern may also be useful The shape, dimension and depth of the top surface pattern can be tailored based on a target IR wavelength and purpose. For example, by changing the design of the surface pattern, transmission of light having the target IR wavelength can be increased. Alternatively, IR light can be focused onto a target position or positions like a lens, or light having specific wavelengths can be filtered out. As such, the top of the cap may be customized to provide a specific function. Alternatively, a cap wafer without a top surface pattern may also be provided for subsequent downstream processing.

Figure 6B:
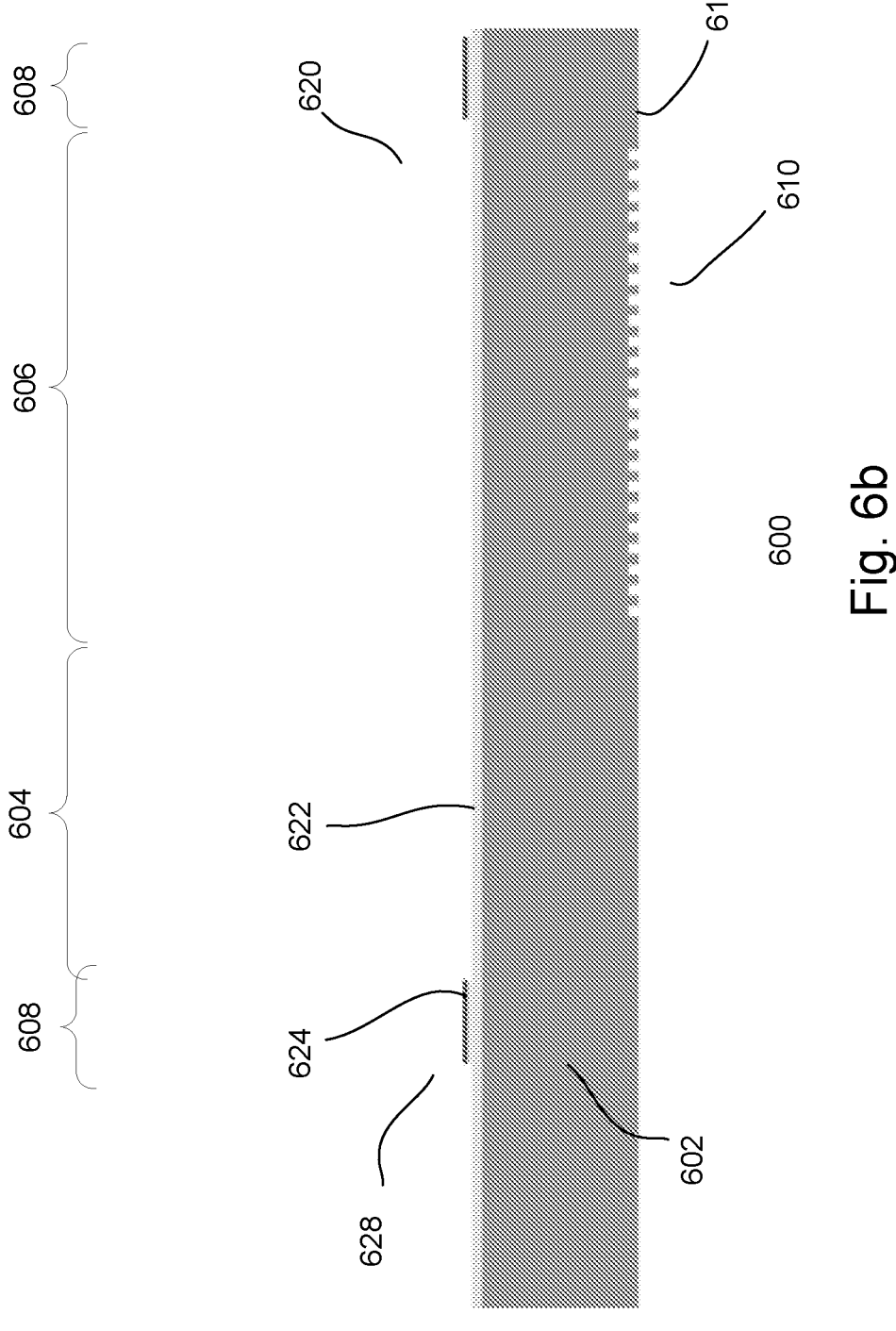

In FIG. 6b, a mask 622 is deposited over an inner (bottom) surface 620 of the cap substrate. The mask is formed surrounding the substrate and covering the anti-reflective region. The mask may be a hard mask, such as a silicon oxide mask or a soft mask, such as a photoresist mask. The hard mask prevents substrate reaction and protects the substrate during etching process.

A first cap sealing level 624 of a cap sealing ring 628 is disposed and patterned over the hard mask at the inner (bottom) surface of the cap substrate. In one embodiment, the cap sealing ring is a stacked cap sealing ring and the first cap sealing level is formed as an uppermost level of the stacked cap sealing ring. The first cap sealing level may include one or more layers using same or different materials. A cap sealing layer of the first cap sealing level can be a metal, a metal alloy or a dielectric layer. For example, metals or metal alloys such as aluminum, gold, copper, silver, titanium, germanium or tin may be used to form the first metal or metal alloy layer. Providing silicon dioxide or silicon nitride to form a first dielectric layer of the stacked sealing ring may also be useful. The first cap sealing layer may be formed by, for example, sputtering and patterning using mask and etch processes. Alternatively, repeated rounds of deposition and patterning by, for example, a lift-off process, may be employed for forming subsequent layers to generate the first cap sealing level. As shown, the first cap sealing level forms a planar bottom surface on the substrate.

In one embodiment, as shown, the first cap sealing level is patterned to remain surrounding the cap wafer. For example, the patterning exposes the hard mask covering the anti-reflective region 606 and the getter region 604. The remaining first cap sealing level defines the cap bonding region of the cap wafer which facilitates bonding the cap to the device wafer. For example, the cap bonding region of the cap is aligned and mated with a corresponding device bonding region of the device 600 for bonding the cap to the device.

Figure 6C:
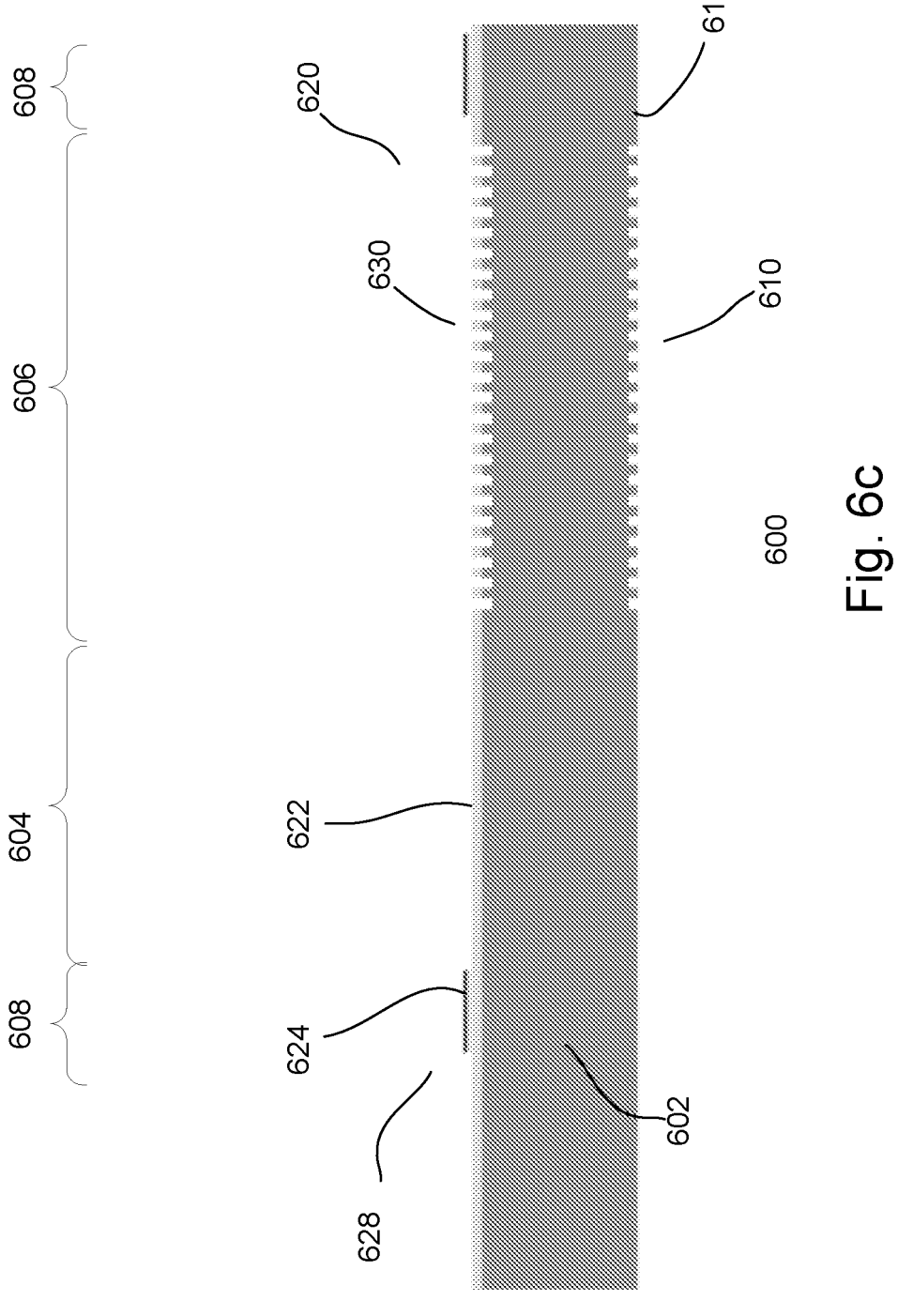

Referring to FIG. 6c, a bottom surface pattern 630 is formed on the inner surface 620 of the cap. In one embodiment, the bottom surface pattern on the cap wafer is disposed to be aligned with the corresponding MEMS regions on the device wafer. As shown, the mask covering the anti-reflective region, as well as the substrate, is etched away to form a surface pattern. Providing other techniques to form the surface pattern may also be useful.

In one embodiment, the bottom surface pattern 630 is the same as the top surface pattern 610. As such, the patterns on the top and bottom surfaces may serve the same purpose. Providing other bottom surface patterns which are different from the pattern of the top surface pattern may also be useful. For example, the top surface pattern can be tailored for focusing light while the bottom surface pattern can be tailored for filtering out light having specific or desired wavelengths.

For example, in the case of IR sensors, light having wavelengths other than 4.62 um may be filtered out. In this case, the cap can be customized so that a single cap may serve more than one function. In another embodiment, only either the top or bottom surface of the cap is processed to form the surface patterns. For example, a cap wafer having only a top surface pattern may be provided for subsequent downstream processing. Alternatively, a cap wafer processed to include only a bottom surface pattern is used for further processing.

In another embodiment, the anti-reflective region includes an anti-reflection coating disposed on the top 612 and bottom 620 surfaces of the cap. For example, the anti-reflective region may include anti-reflection coating instead of surface patterns. Providing the coating on either the top or bottom surface of the cap may also be useful. The anti-reflection coatings on the different surfaces of the anti-reflective region may be configured with different reflective indexes. Materials for the anti-reflection coating may be zinc sulfide (ZnS) or germanium (Ge). Providing any other materials for the anti-reflective coating may also be useful. The anti-reflection coating may be deposited on the surface or surfaces of the cap and patterned to remain in the anti-reflective region.

Figure 6D:
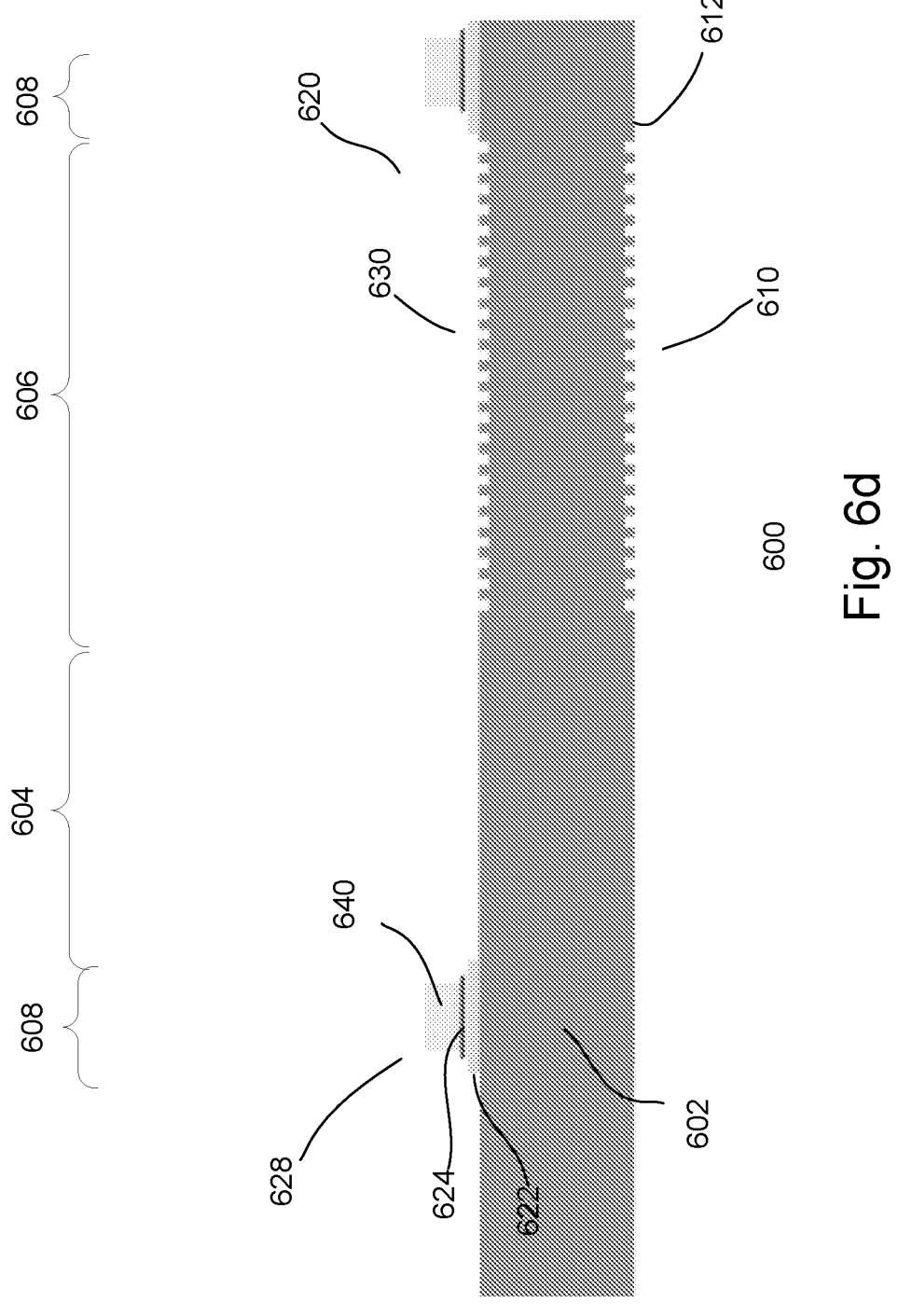

After forming the bottom grating, processing of the cap bottom surface continues in FIG. 6d to remove the hard mask 622 covering the anti-reflective and getter regions. For example, the remaining hard mask beneath the first cap sealing layer is not removed. Removing the hard mask may be achieved using a first wet etch.

A second cap sealing level 640 of the cap sealing ring 628 is formed over the first cap sealing level. For example, the second cap sealing level forms a bottom-most level of the cap sealing ring. The second cap sealing level is in direct contact with another sealing ring (device sealing ring) on the device wafer during the bonding process. For example, during bonding, the second device sealing level (uppermost level) of the device sealing ring mates with the second cap sealing level (bottom-most level) of the cap sealing ring.

A first cap sealing layer of the second cap sealing level is deposited over a last layer of the first cap sealing level, covering both the first cap sealing level as well as the substrate. CVD and lift-off processes may be employed to form the first cap sealing layer of the second cap sealing level. Providing other techniques may also be useful. In one embodiment, a layer of the second cap sealing level of the cap sealing ring can be a metal, a metal alloy or a dielectric layer. For example, metals or metal alloys such as aluminum, gold, copper, silver, titanium, germanium or tin may be used to form the first metal or metal alloy layer. Providing silicon dioxide, silicon nitride, titanium nitride, platinum or tungsten to form a dielectric layer of the second level may also be useful.

In one embodiment, the second cap sealing level may include one or more layers. Subsequent layers of the second cap sealing level can be formed using similar methods as the first cap sealing level. Patterning of the second cap sealing level leaves a portion of the sealing level surrounding the cap wafer. For example, the first and second cap sealing levels of the cap sealing ring form the stacked cap sealing ring at the cap bonding region which bonds the cap to the device wafer.

In one embodiment, the inner surface of the cap wafer is also processed to form support columns or posts (not shown) outside of the anti-reflective region. For example, the support columns are located above or in the CMOS region after bonding by WVLP. The support columns serve to prevent or reduce the cap from bending during the bonding process, of which may lead to the cap contacting the BEOL dielectric, causing damage to the interconnects therein. In one embodiment, the support columns are configured to act as spacers to provide mechanical support during wafer-level vacuum packaging (WLVP).

In one embodiment, the support columns are rectangular-shaped columns. Providing columns having other shapes may also be useful. The dimensions of the support columns can be about 10 um×10 um, 20 um×20 um, 50 um×50 um or 100 um×100 um. Support columns having other dimensions may also be provided. The support columns may include various types of materials. For example, the support columns may include dielectrics, metals, ceramics or a combination thereof. Other materials may also be employed to form the support columns.

In some embodiment, support columns may be formed on either the device wafer or on the cap wafer. Although this may result in a gap, it may still be sufficient to prevent the cap wafer from contacting the device wafer during WLVP. For example, the cap portions of the support column should have sufficient height to prevent the cap wafer from contacting the device wafer during WLVP. In this case, the cap portions of the support columns are formed during the same process as forming the sealing rings on the cap wafer. In such cases, the cap portions of the support columns are identical to the cap sealing rings on the cap wafers. For example, the cap portions of the support columns form bonds, similar to the sealing rings, during WLVP. In other embodiments, unlike the sealing rings, the cap portions of the support columns need not form bonds. As such, they can be formed of different types of materials which do not form a bond during WLVP.

In one embodiment, the cap sealing ring and cap column portions may include a base. (not shown). The base is similar to that described in FIGS. 3a-h. The base, for example, is a dielectric base, such as silicon oxide. Other types of bases may also be provided on which the cap sealing ring and cap column portions are formed.

Figure 6E:
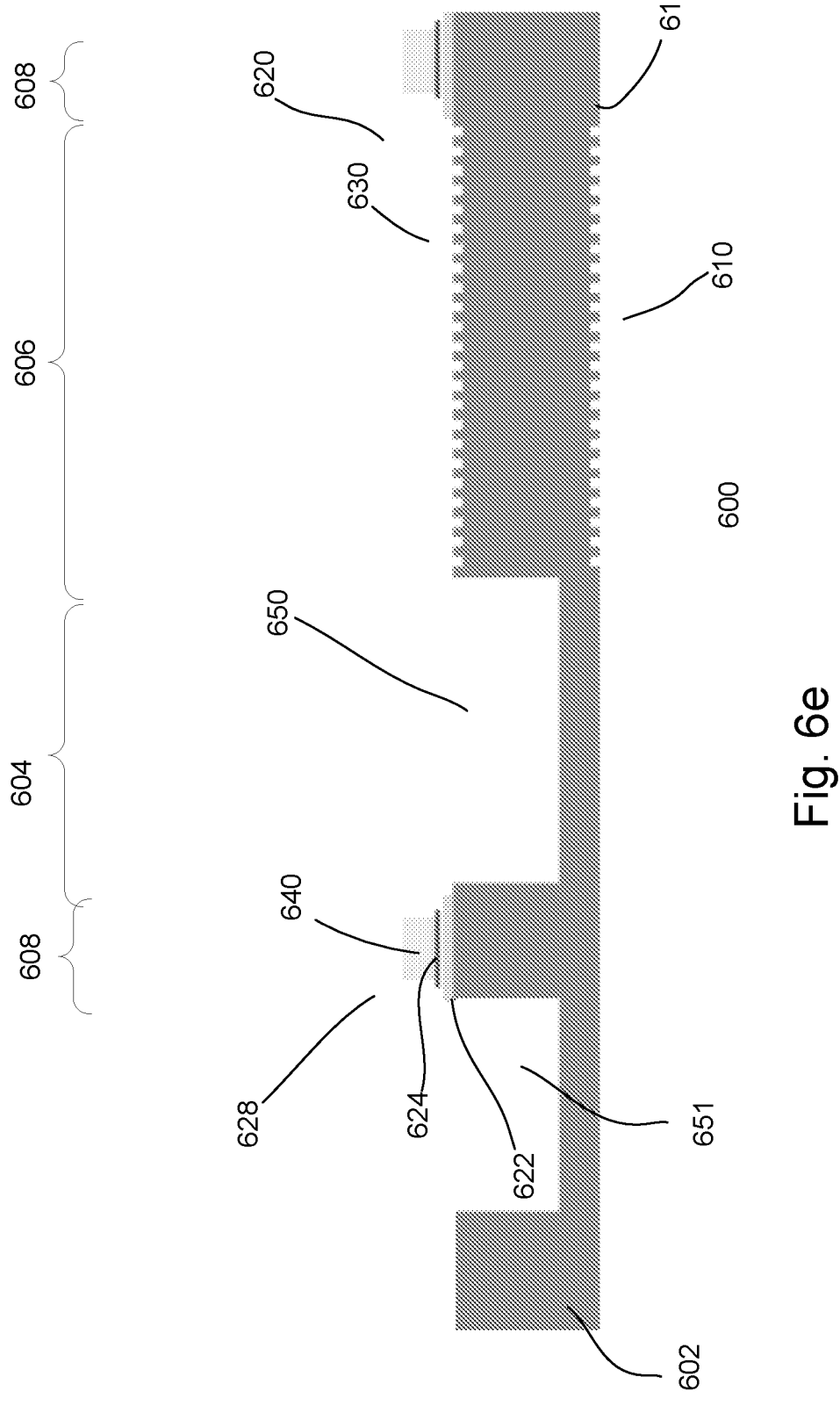

The inner surface 620 of the substrate is then processed to form cap recesses. In one embodiment, as shown in FIG. 6e, the cap recesses include primary and secondary cap recesses. The primary cap recess 650 is formed outside of the anti-reflective region 606 within the cap bonding region while the secondary cap recess 651 is outside of the cap bonding region. The primary cap recess is configured to align above the corresponding CMOS regions on the device wafer.

Depending on a thickness of the cap wafer, the cap recess may have a depth ranging from 10, 20, 30, 100 to 500 um. Having a cap recess which is deeper than 500 um may also be useful. In one embodiment, the cap recess improves an overall vacuum level within the cap cavity. For example, the cap recess increases the overall volume of the cap cavity between the cap and the sensors in the MEMS region. The larger volume improves the overall vacuum level after bonding of the cap wafer to the device substrate. As such, better imaging qualities can be captured from the device.

A mask and etch process may be employed. For example, the substrate is etched at the inner surface of the wafer using a patterned mask with an opening corresponding to the cap recess. The mask may be a hard mask, such as silicon oxide mask or a soft mask, such as a photoresist mask. The etch, for example, is a dry etch. Alternatively, etching may be achieved using a first wet etch utilizing etchants such as KOH.

Figure 6F:
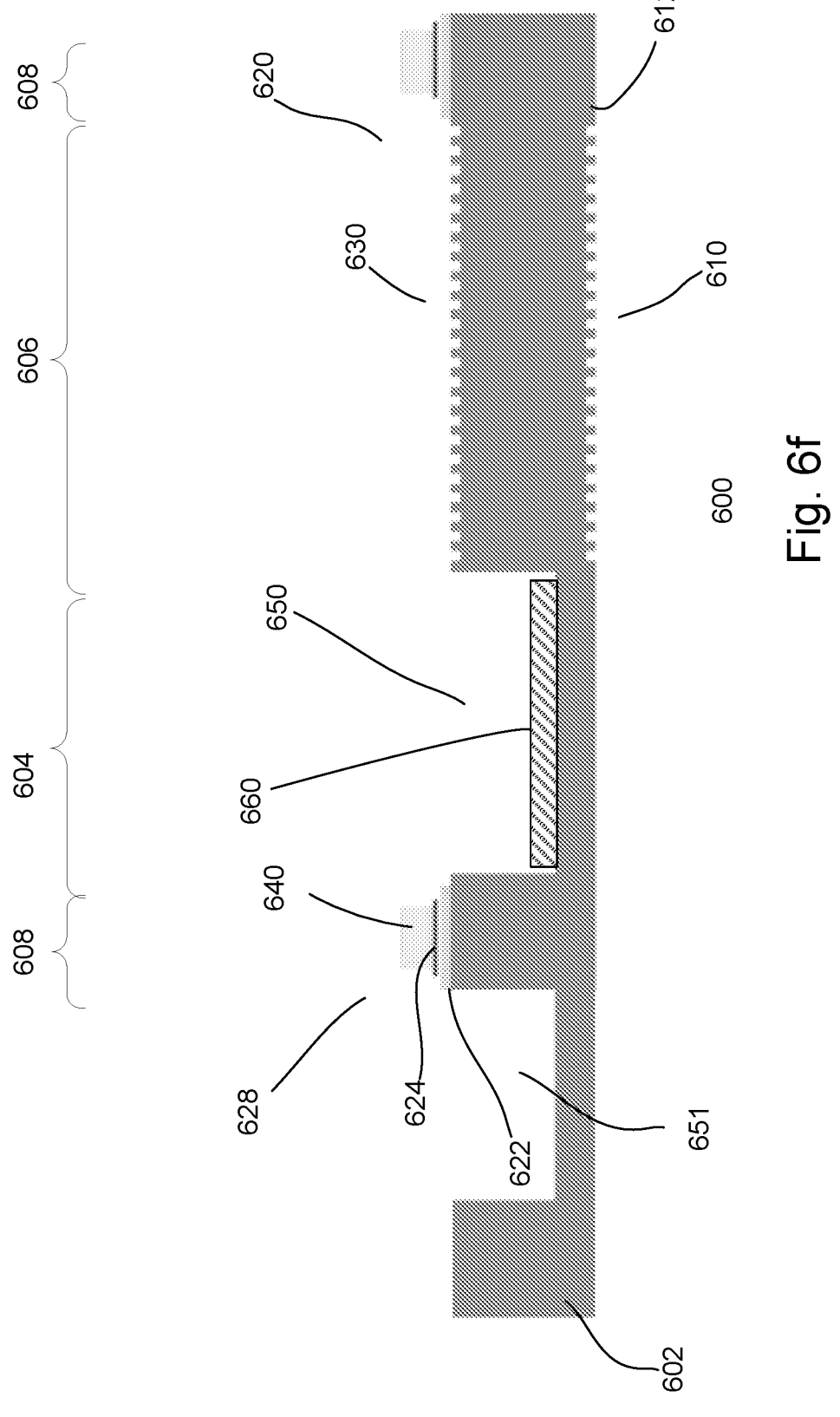

In FIG. 6f, a getter 660 is deposited on the substrate and patterned to line the inner surface of the cap recess. The getter, for example, may be zirconium (Zr) alloys, titanium (Ti), nickel (Ni), aluminum (Al), barium (Ba) or magnesium (Mg). The getter absorbs moisture and outgassing within the encapsulated device and thereby facilitates the maintenance of the integrity of the vacuum in the overall cap cavity, improving reliability. As shown, the getter layer may be patterned to only cover the inner bottom surface of the primary cap recess 650 at the getter region 604. Other various patterns for the getter, are also useful. Lift-off process can be employed to form the getter.

Figure 6G:
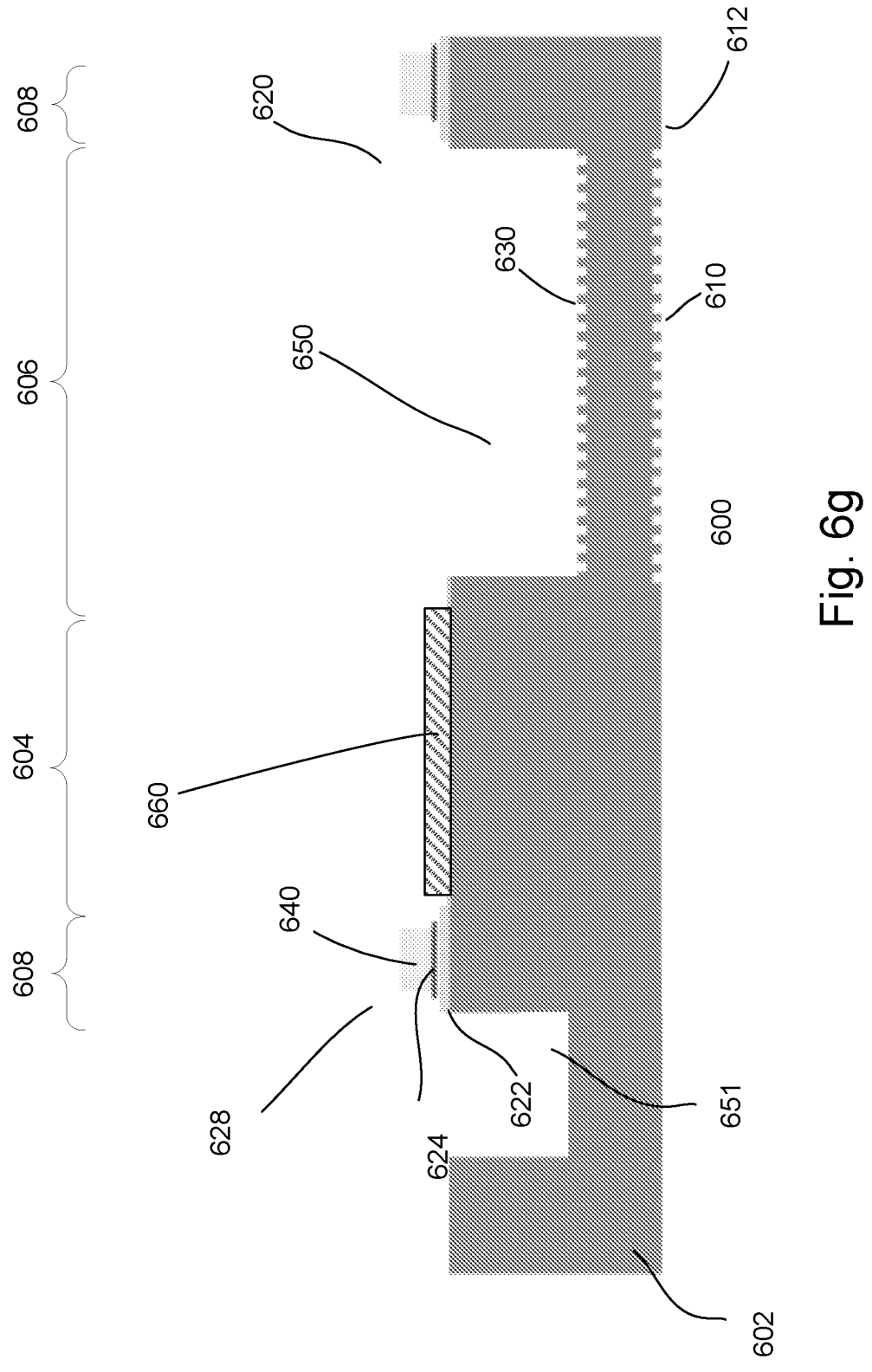
Figure 6H:
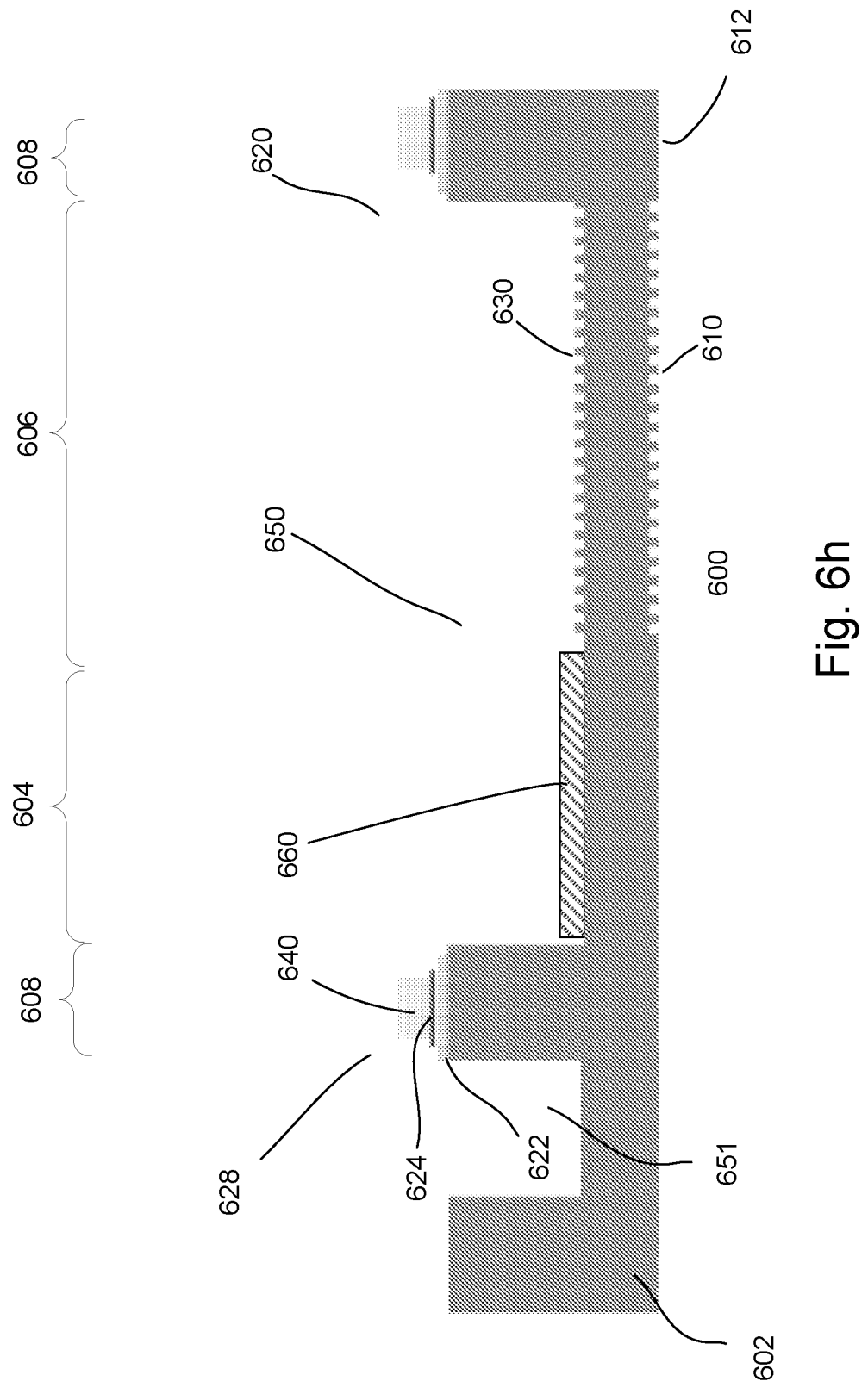

In one embodiment, in FIG. 6g, instead of forming the primary cap recess outside of the anti-reflective region 606, the primary cap recess 650 is formed in the anti-reflective region 606. In one embodiment, an inner (bottom) surface of the primary cap recess in the anti-reflective region is processed to include a bottom surface pattern 630. The bottom surface pattern may be similar to what is described in FIGS. 2a-f, 6a and 6c. Providing a primary cap recess in the anti-reflective region without the bottom surface pattern may also be useful. The getter 660 is then disposed and patterned to line the inner surface of the cap at the getter region 604 which is outside of the anti-reflective region 606. Alternatively, the primary cap recess 650 is formed within the cap bonding region as seen in FIG. 6h. The inner (bottom) surface of the primary cap recess at the anti-reflective region may or may not be processed to include a bottom surface pattern 630. The getter 660 is then disposed and patterned to line the inner surface of the cap recess at the getter region 604 outside of the anti-reflective region 606.

Figure 7A:
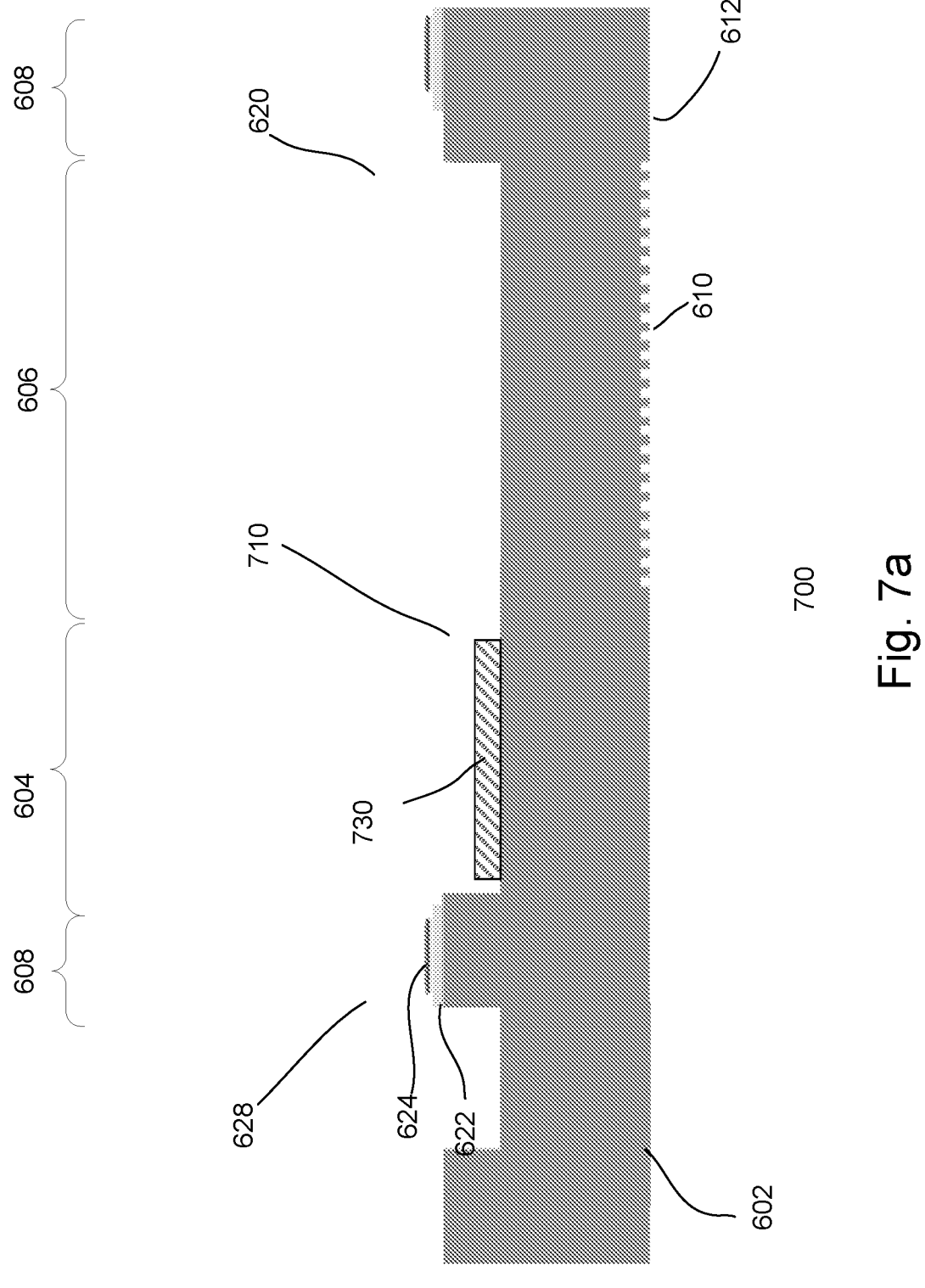
FIGS. 7a-c show simplified cross-sectional views of another exemplary process for forming a cap wafer.
Figure 7B:
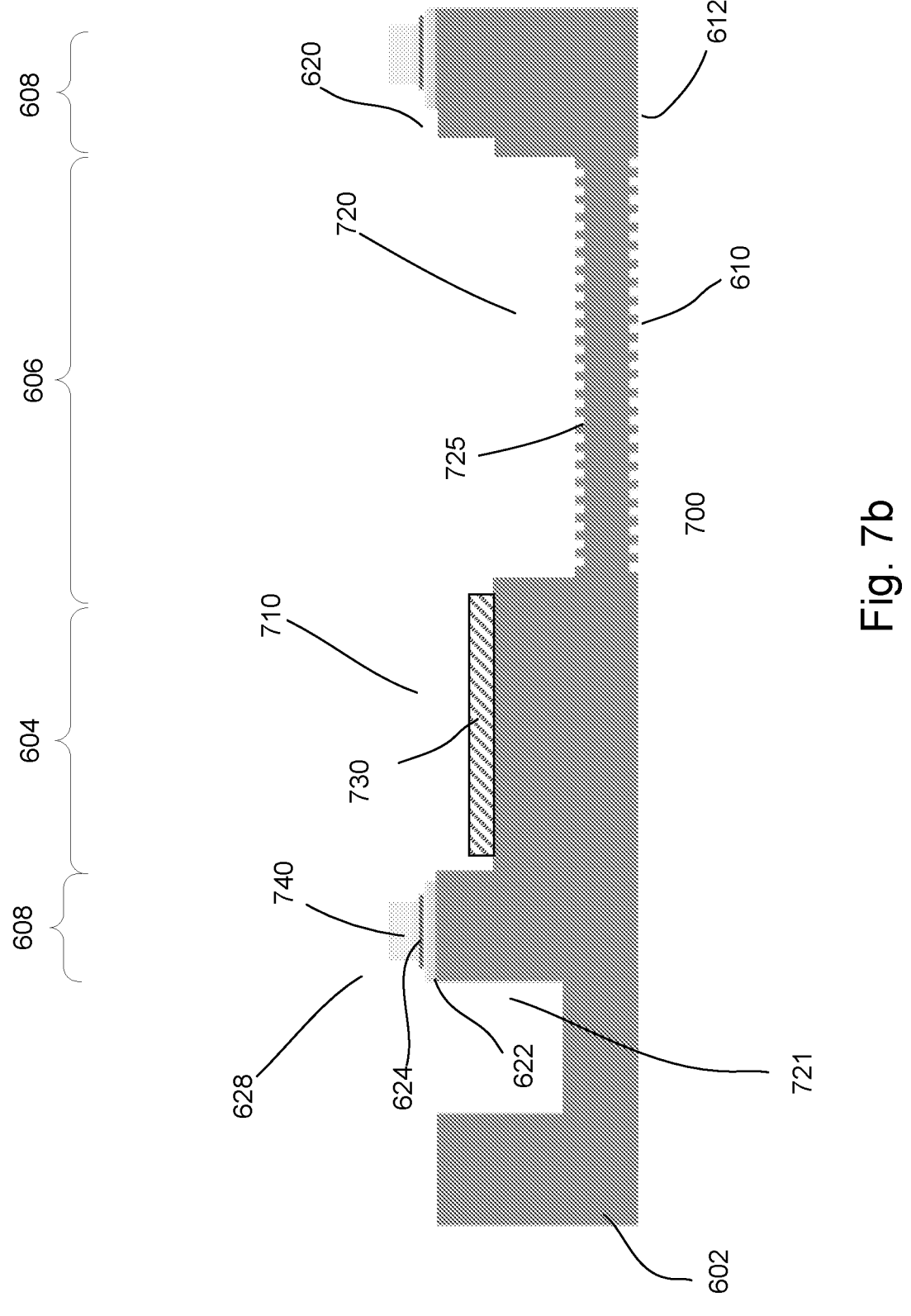

FIGS. 7a-b show simplified cross-sectional views of an alternative embodiment of a process for forming a cap wafer 600. The cap wafer, for example, is similar to the cap described in FIGS. 2a-f, 3a-b, and 6a-h. Common elements may not be described or described in detail.

Referring to FIG. 7a, the cap wafer 700 is prepared with, a getter region 604, an anti-reflective region 606, and a cap bonding region 608. As shown, the cap includes a cap sealing ring 628 disposed to surround a periphery of the cap wafer at the cap bonding region. A top surface pattern 610 is provided on an outer (top) surface 612 of the cap at the anti-reflective region. In one embodiment, the top surface pattern on the cap wafer is disposed to be aligned with the corresponding MEMS regions on the device wafer. The processes used to form the top surface pattern and the cap sealing ring may be similar to those employed and described in FIGS. 6a-c. In one embodiment, a cap wafer without a top surface pattern may be provided for further processing. For example, the forming of a cap sealing ring commences on a cap wafer without a top surface pattern.

After deposition and patterning of the first cap sealing level of the cap sealing ring, the inner (bottom) surface of the cap wafer is processed to form a shallow cap recess 710. For example, a mask is employed to protect the cap sealing level at the cap bonding region. A first etch process may be performed on the inner surface of the cap wafer to form a shallow cap recess 710 both within and outside the cap bonding region not protected by the mask. A getter layer 730 is deposited and patterned, by a lift-off process, on an inner surface of the shallow cap recess 710 at the getter region 604.

In FIG. 7b, a second cap sealing level 740 is formed over the first cap sealing level. The processes used to form the first and second cap levels are similar to what is described in FIGS. 6b and d. For example, lift-off process may be employed to form the cap sealing levels. A second etching is then performed on the inner surface of the shallow recess to form primary and secondary deep cap recesses. For example, the primary deep cap recess 720 is disposed in the anti-reflective region 606 within the cap bonding region while the secondary deep cap recess 721 is disposed outside of the cap bonding region. For example, a mask is used to protect the getter region 604 as well as the cap bonding region. An inner surface of the shallow cap recess not covered by the mask is then etched away to form deep cap recesses 720 and 721. In this case, the shallow cap recess 710 remains in the getter region 604. Mask and etch processes, such as dry or wet etch, may be used for the first and second etchings. As shown, a bottom surface pattern 725 is provided at an inner surface of the primary deep cap recess 720. Providing a primary deep cap recess at the anti-reflection region 606 without the bottom surface pattern may also be employed.

Figure 7C:
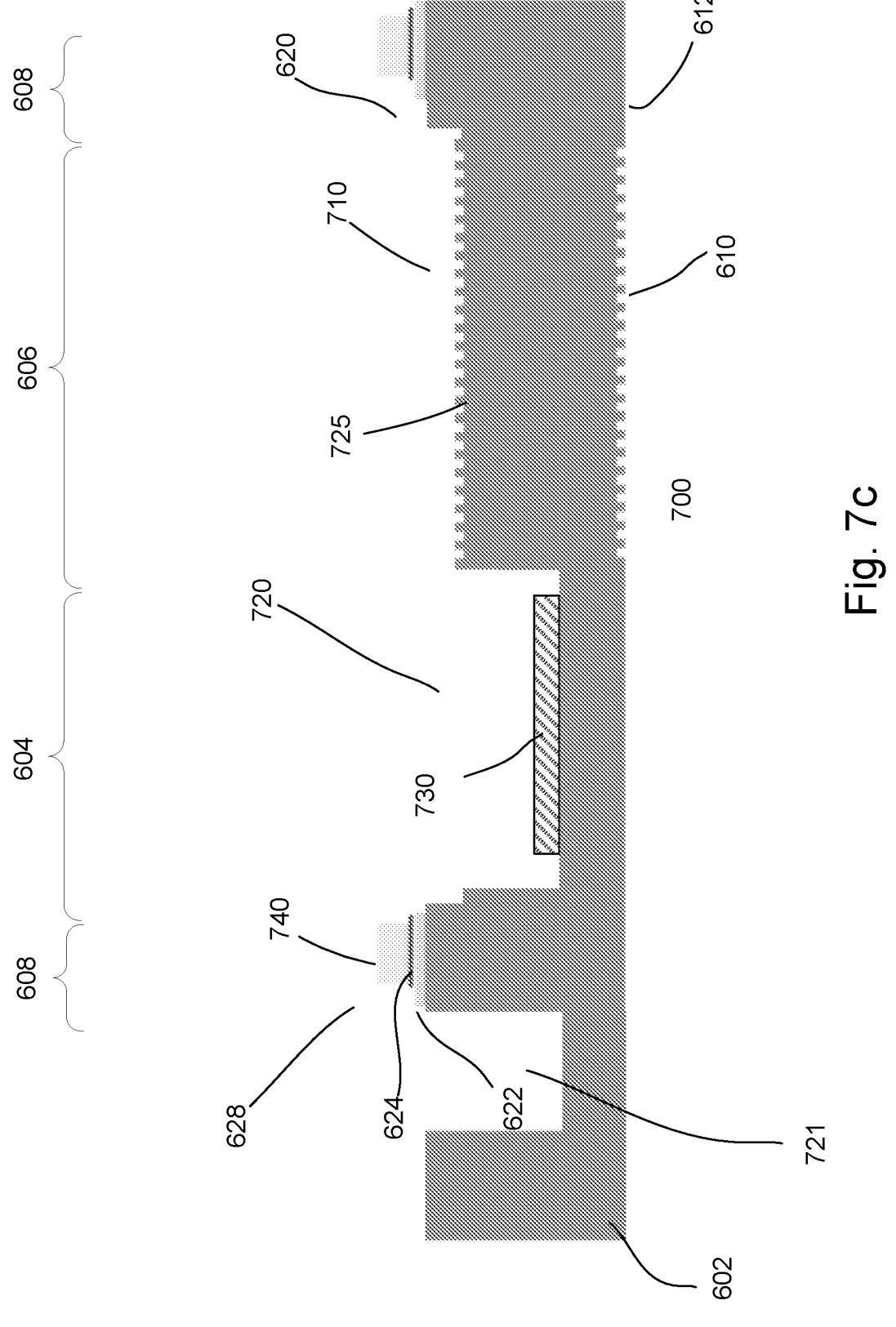

In another embodiment, in FIG. 7c, an inner surface of the shallow cap recess in the anti-reflective region is protected from the etchant used during the second etching. For example, a mask is used to protect the anti-reflective region 606. An inner surface of the shallow cap recess not covered by the mask is then etched away to form a primary deep cap recess 720 outside of the anti-reflective region within the cap bonding region and a secondary deep cap recess 721 outside of the cap bonding region. In this case, the shallow cap recess 710 remains in the anti-reflective region 506. A bottom surface pattern 725 is provided at an inner surface of the shallow cap recess 710. Providing a shallow cap recess at the anti-reflection region without the bottom surface pattern may also be employed.

Figure 8A:
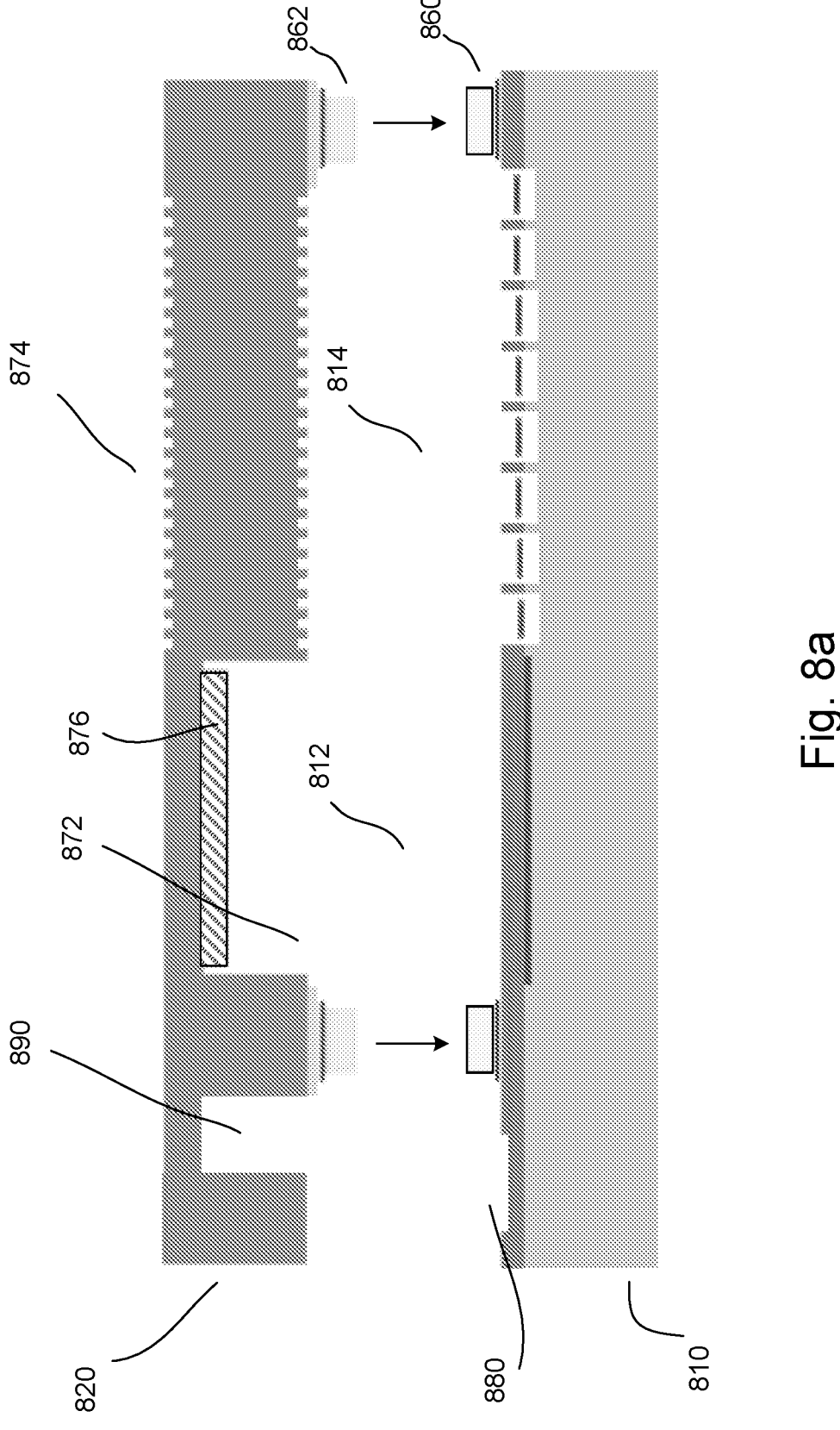
FIGS. 8a-c show simplified cross-sectional views of an exemplary process for encapsulating a device.
Figure 8B:
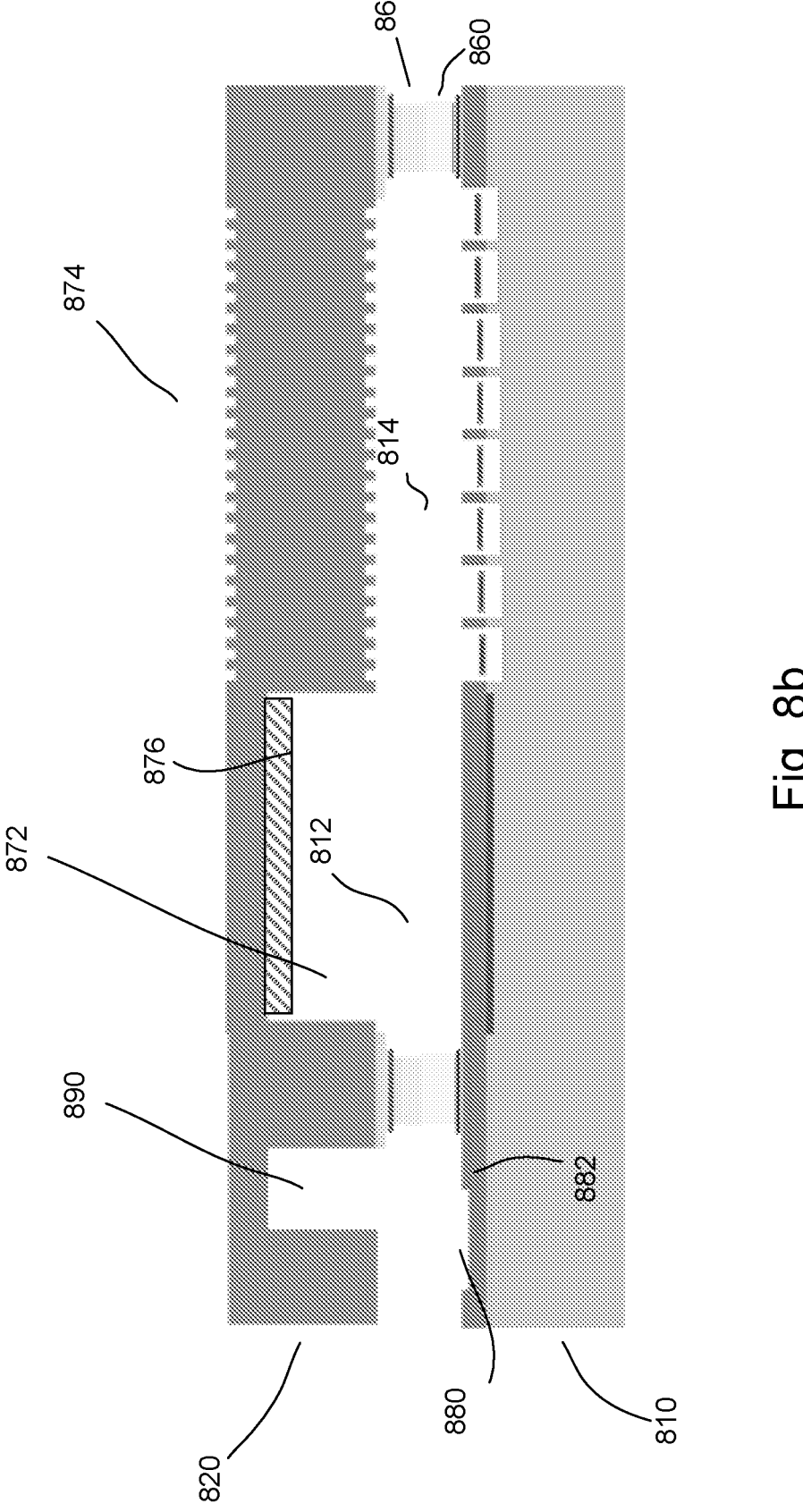
Figure 8C:
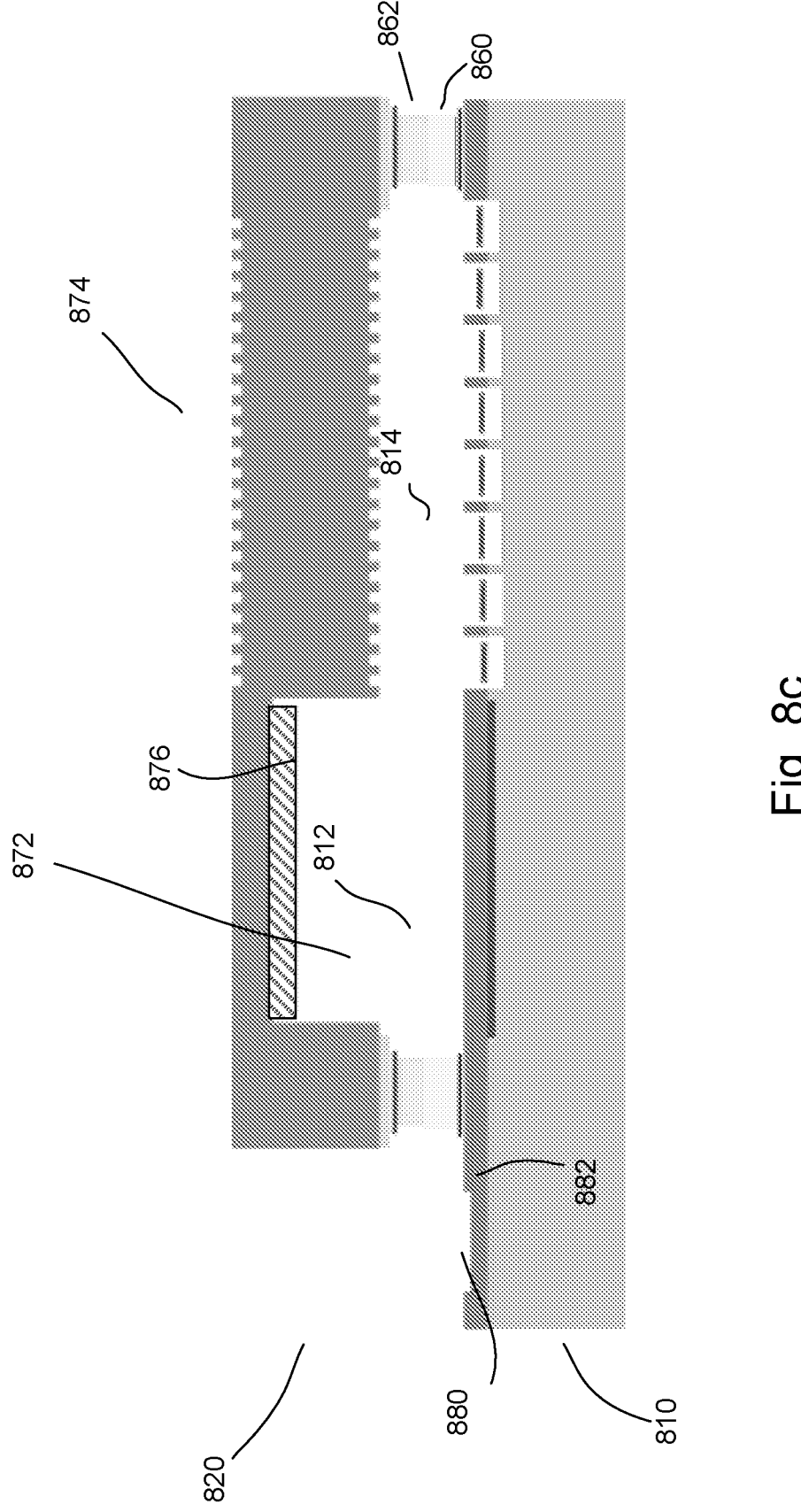

FIGS. 8a-c show simplified cross-sectional views of an embodiment of a process for bonding a cap wafer 820 to a device wafer 810. The cap wafer and device wafer, for example, are similar to that described in FIGS. 2a-f, 3a-b, 5 and 6a-h and 7a-c. Common elements may not be described or described in detail.

Referring to FIG. 8a, the cap wafer 820 is configured to form a cap over the device wafer 810. For example, the MEMS region 814 of the device wafer is encapsulated within the cap. The cap also covers the CMOS region 812. For example, during the bonding process, a cap cover region 890 of the cap wafer keeps the bond openings 880 in the device wafer protected. After bonding is completed, a partial dicing is performed to expose a periphery region of the CMOS region which is uncovered for bond pads.

The sealing rings 860 and 862 at the bonding regions of the cap and device wafers are configured to align and mate during a bonding process so that the CMOS and MEMS regions are hermetically sealed within the cap. As shown, the anti-reflective region 874 of the cap is disposed directly above the MEMS region 814. Infrared radiation is transmitted through the anti-reflective region and captured by the sensor array below. In one embodiment, the surface patterns at the anti-reflective region may also facilitate providing of light-focusing functions. This allows the sensor array to produce high quality and sharper images.

As shown, a cap recess 872 of the cap wafer is disposed directly above the CMOS region 812 of the device wafer. In one embodiment, the cap recess increases the cavity volume of the cap cavity, which improves an overall vacuum level within the cap cavity. For example, a larger cap volume with increased length, width and depth improves the overall vacuum level after bonding of the cap wafer to the device substrate. In other embodiments, providing a cap wafer having different cap configurations as described in FIGS. 2a-h and 3a-b may also be useful. For example, a cap recess may be disposed directly above the MEMS region, or shared between both the CMOS and MEMS regions. Alternatively, distinct cap recesses with varying depths may be disposed respectively over the CMOS region and the MEMS region. In yet other embodiments, providing cap wafers with support columns to maintain a distance between the bonded wafers stack may also be useful. Having sealing rings with support columns may also be utilized.

A getter 876 is disposed within the inner surface of the cap recess. The getter absorbs moisture and outgassing within the encapsulated device and thereby facilitates the maintenance of the integrity of the vacuum in the cavity, improving reliability. As such, better imaging qualities can be captured from the device.

Bonding between the sealing rings completes the hermetic sealing of the cap to the device wafer in FIG. 8b. For example, the cap sealing ring 862 on the cap 820 is bonded to the device sealing ring 860 on the device wafer 810. The cap may be bonded at the wafer level (wafer level packaging). For example, the cap is bonded prior to dicing the wafer to expose the bonding pads and to separate the devices. In one embodiment, thermal compression bonding may be used to bond the cap to the device wafer. Other techniques for bonding the cap to the device wafer, such as forming thermal compression bonds or eutectic bonds, may also be useful. In one embodiment, high temperature bonding may be utilized. For example, bonding process can be carried out at a temperature as high as 450° C. This creates a stronger and more reliable bonding interface between the cap and the device.

In FIG. 8c, a partial dicing of the cap wafer at the pad cover region 890 is performed to expose a periphery region of the CMOS region which is uncovered for bond pads. The pads provide external access to the internal components of the device. For example, input, output and power signals may be provided via the pads. The pads are coupled to the internal components of the device via pad lines or feedthrough lines 882. In one embodiment, the feedthrough lines are part of the poly-silicon lines, metal layers or silicon substrate which form interconnects of the device. The uncovered pads serve to provide for testing and wire bonding purposes.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

What is claimed is:

1. A device comprising:
    a substrate, wherein the substrate is configured with
        a complementary metal oxide semiconductor (CMOS) region with CMOS components, and
        a microelectromechanical system (MEMS) region with an array of MEMS sensors, wherein the MEMS region includes
            an array of substrate cavities below a top surface of the substrate, and
            wherein the array of MEMS sensors is suspended over the array of substrate cavities, with a substrate cavity of the array of substrate cavities disposed under a MEMS sensor of the array of MEMS sensors;
    a backend (BE) dielectric with interconnects for interconnecting the CMOS components disposed on the substrate over the CMOS and MEMS regions, wherein the BE dielectric is patterned to expose the array of MEMS sensors in the MEMS region with the array of substrate cavities below the array of MEMS sensors;
    a substrate sealing ring on a substrate bonding region on the BE dielectric, the substrate bonding region surrounds the MEMS region and the CMOS region;
    a cap, wherein the cap comprises a cap bonding region surrounding at a periphery of the cap, the cap bonding region includes a cap sealing ring;
    wherein the cap sealing ring and the substrate sealing ring forms a cap bond to bond the cap onto the substrate, the cap encapsulates the MEMS region and the CMOS region, wherein the cap creates a cap cavity over the MEMS region, the cap cavity is a vacuum cavity; and cap support posts, wherein the cap support posts are disposed in the CMOS region within the cap cavity between a surface of the BE dielectric and the cap, and the cap support posts are configured to provide mechanical support to prevent the cap from contacting the MEMS region during bonding.

2. The device of claim 1 wherein the array of MEMS sensors comprises an array of thermoelectric infrared (IR) sensors.

3. The device of claim 2 comprises bond openings in the BE dielectric which exposes bond pads in a peripheral portion of the BE dielectric outside of the substrate sealing ring.

4. The device of claim 2, wherein the cap comprises an anti-reflective region disposed over the MEMS region, the anti-reflective region facilitates transmission of IR light.

5. The device of claim 4 wherein the anti-reflective region is configured to focus IR light, reduce reflectance and/or filtering out light having undesired wavelengths.

6. The device of claim 2 wherein one of a top cap surface or a bottom cap surface comprises an anti-reflective region; and other of the top cap surface or bottom cap surface comprises a surface pattern.

7. The device of claim 1 wherein the cap support posts are configured to allow gas flow between the CMOS region and the MEMS region.

8. The device of claim 1 wherein the cap comprises an anti-reflective region disposed over the MEMS region, the anti-reflective region facilitates transmission of IR light through the cap.

9. The device of claim 8 wherein the anti-reflective region comprises at least a pattern on at least a top cap surface or a bottom cap surface of the cap.

10. A device comprising:

a substrate, wherein the substrate is configured with a complementary metal oxide semiconductor (CMOS) region with CMOS components, and a microelectromechanical system (MEMS) region with a MEMS component, the MEMS component includes thermoelectric infrared (IR) sensors to form a sensor array, wherein a sensor of the sensor array comprises a substrate cavity, the substrate cavity includes cavity sidewalls and a cavity bottom defined by the substrate, an infrared MEMS sensor disposed over a dielectric layer which defines the top of the substrate cavity, substrate cavity walls separating adjacent substrate cavities to form an array of substrate cavities for the sensor array, and a reflector disposed at the bottom of the substrate cavity, the reflector is configured to reflect IR radiation;

a backend (BE) dielectric with interconnects for interconnecting the CMOS components disposed on the substrate over the CMOS and the MEMS regions, the BE dielectric includes an interlayer dielectric (ILD) level, a back-end-of-line (BEOL) dielectric and passivation layers, the BE dielectric is removed to create an opening exposing the sensor array, wherein the opening forms a backend (BE) cavity, wherein the BE dielectric over the MEMS region is patterned to be disposed over the substrate cavity walls forming individual BE cavities over the substrate cavities;

a substrate sealing ring on a substrate bonding region on the BE dielectric, the substrate bonding region surrounds the MEMS region and the CMOS region;

a cap, wherein the cap comprises a cap bonding region surrounding a periphery of the cap, the cap bonding region includes a cap sealing ring;

wherein the cap sealing ring and the substrate sealing ring form a sealing ring having a height and being arranged to bond the cap onto the substrate, defining the height of the sealing ring, the cap encapsulates the MEMS region and the CMOS region, wherein the cap creates a cap cavity over the MEMS region, the cap cavity is a vacuum cavity; and an anti-reflective region comprising a surface pattern disposed on the cap over the MEMS region, the anti-reflective region is disposed on a top cap surface or a bottom cap surface of the cap, the anti-reflective region is configured to increase transmission of IR light having a target wavelength.

11. The device of claim 10, wherein one of the cap surfaces selected from the top cap surface and the bottom cap surface comprises a surface pattern and the other cap surface comprises an anti-reflective coating.

12. The device of claim 11 wherein top and bottom cap surfaces are planar surfaces.

13. The device of claim 11 wherein the bottom cap surface comprises a cap recess, wherein:

the cap recess is disposed over the CMOS region and a non-recessed region is disposed over the MEMS region which includes the anti-reflective region; or the cap recess is disposed over the MEMS region which includes the anti-reflective region and a non-recessed region is disposed over the CMOS region.

14. The device of claim 11 wherein the bottom cap surface comprises a cap recess disposed over the MEMS region, the cap recess has a cap recess depth, wherein the cap recess depth defines a distance between the anti-reflective region and the sensors of the MEMS component.

15. The device of claim 10 comprises bond openings in the BE dielectric which exposes bond pads in a peripheral portion of the BE dielectric outside of the substrate sealing ring.

16. The device of claim 10 wherein the anti-reflective region is configured to focus IR light, reduce reflectance and/or filtering out light having undesired wavelengths.

17. The device of claim 10 comprises support columns disposed over the CMOS region to provide mechanical support to prevent the cap from contacting the substrate during bonding and allow gas molecules to flow freely between the MEMS and the CMOS regions.

18. The device of claim 10, wherein the height of the sealing ring defines a distance between the anti-reflective region and the MEMS component and a volume of the cap cavity.

* * * * *